US011398487B2

(12) United States Patent
Matsubayashi et al.

(10) Patent No.: US 11,398,487 B2
(45) Date of Patent: Jul. 26, 2022

(54) STORAGE DEVICE

(71) Applicant: Kioxia Corporation, Tokyo (JP)

(72) Inventors: Daisuke Matsubayashi, Sagamihara Kanagawa (JP); Masumi Saitoh, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/198,688

(22) Filed: Mar. 11, 2021

(65) Prior Publication Data

US 2022/0013529 A1 Jan. 13, 2022

(30) Foreign Application Priority Data

Jul. 9, 2020 (JP) ............................ JP2020-118377

(51) Int. Cl.
*G11C 16/10* (2006.01)
*H01L 27/115* (2017.01)
*G11C 16/24* (2006.01)
*G11C 16/26* (2006.01)

(52) U.S. Cl.
CPC ............ *H01L 27/115* (2013.01); *G11C 16/10* (2013.01); *G11C 16/24* (2013.01); *G11C 16/26* (2013.01)

(58) Field of Classification Search
CPC .............................. G11C 16/10; H01L 27/115
USPC ..................................................... 365/185.18
See application file for complete search history.

(56) References Cited

U.S. PATENT DOCUMENTS 6,834,005 B1 12/2004 Parkin
7,143,785 B2 12/2006 Maerkl
7,626,844 B1 12/2009 Moriya
8,820,357 B2 9/2014 Prakash
10,290,804 B2 * 5/2019 Ruiz .................... H01L 27/249
10,968,481 B2 * 4/2021 van Rooyen ........ C12Q 1/6869
2009/0283751 A1 11/2009 Yang
(Continued)

FOREIGN PATENT DOCUMENTS

JP 2006-501056 A 1/2006
WO WO-2008/039579 A1 4/2008

OTHER PUBLICATIONS

Coulter,Coulter counter,Wake nB Tech Co.,Ltd.,Feb. 21, 2019,with English translation,3 pages.*

(Continued)

*Primary Examiner* — Muna A Techane
(74) *Attorney, Agent, or Firm* — Foley & Lardner LLP

(57) ABSTRACT

A storage device of an embodiment includes a first conductive layer; a second conductive layer; a fluid layer between the first conductive layer and the second conductive layer; particles in the fluid layer; a first control electrode between the first conductive layer and the second conductive layer; a first insulating layer between the first conductive layer and the first control electrode surrounding the fluid layer; and a second insulating layer between the first control electrode and the second conductive layer surrounding the fluid layer. In this storage device, a first cross-sectional area of the fluid layer in a first cross-section perpendicular to a first direction is smaller than a second cross-sectional area of the fluid layer in a second cross-section perpendicular to the first direction. The first cross-section includes the first control electrode, and the second cross-section includes the second insulating layer.

21 Claims, 59 Drawing Sheets

(56) References Cited

U.S. PATENT DOCUMENTS

| | | | | |
|---|---|---|---|---|
| 2013/0056353 | A1* | 3/2013 | Nemirovsky | G01N 27/4146 257/253 |
| 2016/0072132 | A1* | 3/2016 | Liao | H01M 4/485 429/231.95 |
| 2019/0101524 | A1 | 4/2019 | Han | |
| 2019/0204249 | A1 | 7/2019 | Van Grinsven | |
| 2021/0249595 | A1* | 8/2021 | Itoh | H01L 45/1666 |

OTHER PUBLICATIONS

Brunelle,"Preparation of Catalysts by Metallic Complex Adsorption on Mineral Oxides",Pure&Appl.Chem.,vol. 50,pp. 1211-1229,1978,19 pages.*

Karnlk al.,"Electrostatic Control of Ions and Molecules in Nanofluidic Transistors",NanoLetters vol. 5,No. 5,2005,pp. 943-948,6pages.*

Nishikawa, et al.,"Au Nanoparticles Prepared in Ionic Liquid by Sputter-DepositionTechnique: What Determines th eParticle Size?", Surface Chemistry vol. 34,No. 4,pp. 185-191,2013,with English translation, 18 pages.*

Karnik, et al., "Electrostatic Control of Ions and Molecules in Nanofluidic Transistors", Nano Letters vol. 5, No. 5, 2005, pp. 943-948, 6 pages.

Liu, et al., "Slowing DNA Translocation in a Naonofluidic Field-Effect Transistor", ACS Nano 2016, 10, pp. 3985-3994.

Magierowski, et al., "Nanopore-CMOS Interfaces for DNA Sequencing", Biosensors 2016, 6, 42, 28 pages.

Chen, et al., "Dispersion of Nanoparticles in Lubricating Oil: A Critical Review", Lubricants 2019, 7, 7, 21 pages.

* cited by examiner

E-E' CROSS-SECTION

F-F' CROSS-SECTION

G-G' CROSS-SECTION

H-H' CROSS-SECTION

STORAGE DEVICE

CROSS-REFERENCE TO RELATED APPLICATION

This application is based upon and claims the benefit of priority from Japanese Patent Application No. 2020-118377, filed on Jul. 9, 2020, the entire contents of which are incorporated herein by reference.

FIELD

Embodiments described herein relate generally to storage devices.

BACKGROUND

A three-dimensional NAND flash memory that is a non-volatile memory includes three-dimensionally disposed memory cells. As the memory cells are three-dimensionally disposed, the number of memory cells can be increased, and thus, the data storage capacity of the nonvolatile memory can be increased.

For example, it is possible to increase the data storage capacity of a nonvolatile memory by increasing the number of bits in the data stored in one memory cell. A nonvolatile memory capable of making the data stored in one memory cell multi-valued data is desired.

DETAILED DESCRIPTION

Figure 1:
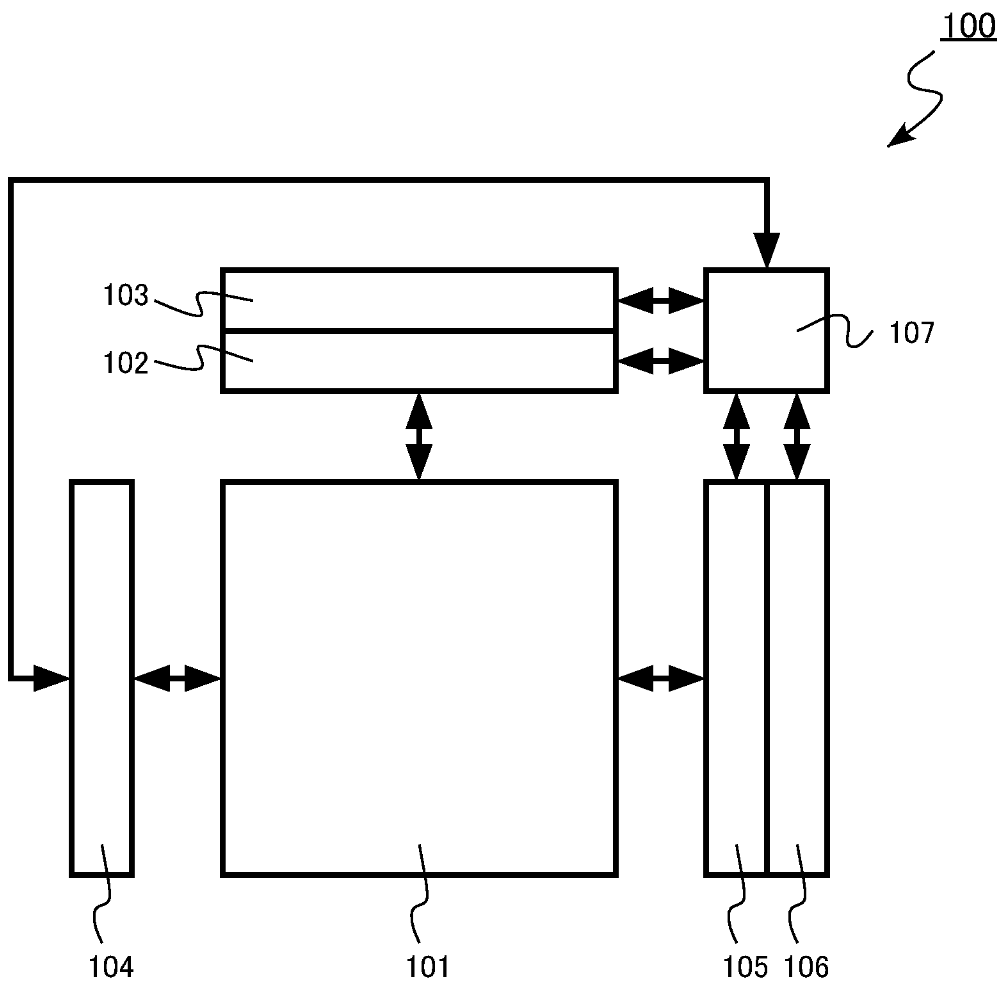
FIG. 1 is a block diagram of a storage device of a first embodiment.

A storage device of an embodiment includes: a first conductive layer; a second conductive layer; a fluid layer provided between the first conductive layer and the second conductive layer; particles in the fluid layer; a first control electrode provided between the first conductive layer and the second conductive layer; a first insulating layer provided between the first conductive layer and the first control electrode, the first insulating layer surrounding the fluid layer; and a second insulating layer provided between the first control electrode and the second conductive layer, the second insulating layer surrounding the fluid layer. A first cross-sectional area of the fluid layer in a first cross-section perpendicular to a first direction from the first conductive layer toward the second conductive layer is smaller than a second cross-sectional area of the fluid layer in a second cross-section perpendicular to the first direction, the first cross-section includes the first control electrode, and the second cross-section includes the second insulating layer.

The following is a description of embodiments, with reference to the accompanying drawings. In the description below, like or similar components are denoted by like reference numerals, and explanation of components described once will not be repeated.

For identification of the members constituting the storage device, it is possible to use secondary ion mass spectroscopy (SIMS), energy dispersive X-ray spectroscopy (EDX), X-ray diffraction (XRD) analysis, electron beam diffraction (EBD) analysis, X-ray photoelectron spectroscopy (XPS), synchrotron radiation X-ray absorption fine structure (XAFS) analysis, liquid chromatography, gas spectroscopy, and ion chromatography, for example.

The qualitative analysis and the quantitative analysis of the chemical compositions of the members constituting a storage device in the present specification can be conducted by secondary ion mass spectroscopy (SIMS) and energy dispersive X-ray spectroscopy (EDX), for example. Further, the thicknesses of the members constituting a storage device, the distances between the members, and the like can be measured with a transmission electron microscope (TEM), for example.

First Embodiment

A storage device of a first embodiment includes a first conductive layer; a second conductive layer; a fluid layer provided between the first conductive layer and the second conductive layer; particles in the fluid layer; a first control electrode provided between the first conductive layer and the second conductive layer; a first insulating layer provided between the first conductive layer and the first control electrode, the first insulating layer surrounding the fluid layer; and a second insulating layer provided between the first control electrode and the second conductive layer, the second insulating layer surrounding the fluid layer. A first cross-sectional area of the fluid layer in a first cross-section perpendicular to a first direction from the first conductive layer toward the second conductive layer is smaller than a second cross-sectional area of the fluid layer in a second cross-section perpendicular to the first direction, the first cross-section includes the first control electrode, and the second cross-section includes the second insulating layer.

The storage device of the first embodiment is a nonvolatile memory 100 in which memory cells are three-dimensionally disposed. In the nonvolatile memory 100, the memory cells store data, using charged particles in a fluid layer.

Figure 2:
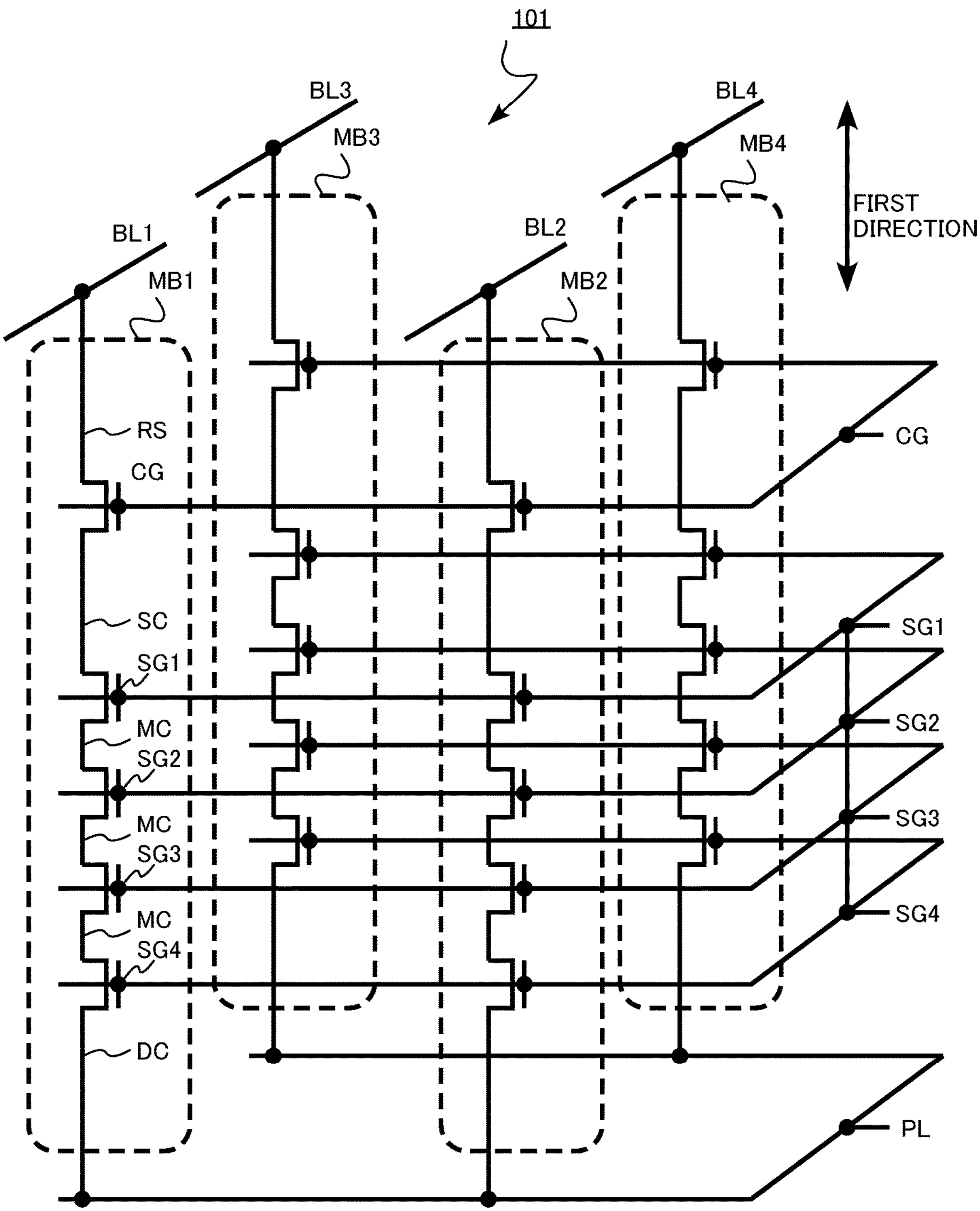
FIG. 2 is an equivalent circuit diagram of the memory cell array of the storage device of the first embodiment.

FIG. 1 is a block diagram of the storage device of the first embodiment. FIG. 2 is an equivalent circuit diagram of the memory cell array of the storage device of the first embodiment.

As shown in FIG. 1, the nonvolatile memory 100 includes a memory cell array 101, a storage gate control circuit 102, a cock gate control circuit 103, a plate control circuit 104, a bit line control circuit 105, a sense amplifier circuit 106, and a central control circuit 107. The central control circuit 107 is an example of the control circuit.

As shown in FIG. 2, the memory cell array 101 includes a first bit line BL1, a second bit line BL2, a third bit line BL3, a fourth bit line BL4, a plate electrode PL, a cock gate electrode CG, a first storage gate electrode SG1, a second storage gate electrode SG2, a third storage gate electrode SG3, a fourth storage gate electrode SG4, a first memory bottle MB1, a second memory bottle MB2, a third memory bottle MB3, and a fourth memory bottle MB4.

Hereinafter, the first bit line BL1, the second bit line BL2, the third bit line BL3, and the fourth bit line BL4 may be mentioned individually of one another, or may be collectively referred to as the bit lines BL. Also, the first storage gate electrode SG1, the second storage gate electrode SG2, the third storage gate electrode SG3, and the fourth storage gate electrode SG4 may be mentioned individually of one another, or may be collectively referred to as the storage gate electrodes SG. Further, the first memory bottle MB1, the second memory bottle MB2, the third memory bottle MB3, and the fourth memory bottle MB4 may be mentioned individually of one another, or may be collectively referred to as the memory bottles MB.

A plurality of storage gate electrodes SG is provided between the bit lines BL and the plate electrode PL. The plurality of storage gate electrodes SG is disposed in a first direction. The storage gate electrodes SG are electrically connected to one another.

The first direction is the direction from the bit lines BL toward the plate electrode PL. The direction from the plate electrode PL toward the bit lines BL is also referred to as the first direction.

The cock gate electrode CG is provided between the bit lines BL and the plurality of storage gate electrodes SG. The cock gate electrode CG and the plurality of storage gate electrodes SG are electrically separated from each other.

The memory bottles MB are provided between the bit lines BL and the plate electrode PL. The memory bottles MB extend in the first direction.

One bit line BL is connected to one memory bottle MB. The plate electrode PL is shared among the memory bottles MB.

Each memory bottle MB includes a reservoir RS, a standby cell SC, a plurality of memory cells MC, and a dummy cell DC that are connected in series between the bit line BL and the plate electrode PL. One memory cell MC is interposed between two transistors. Each transistor includes a storage gate electrode SG as its gate electrode. The standby cell SC is interposed between a transistor including the cock gate electrode CG and a transistor including a storage gate electrode SG as its gate electrode.

Hereinafter, a transistor including a storage gate electrode SG as its gate electrode will be referred to as a storage transistor, and a transistor including the cock gate electrode CG as its gate electrode will be referred to as a cock transistor.

An example case where the number of memory bottles MB in the memory cell array 101 is four has been described with reference to FIG. 2, but the number of memory bottles MB is not necessarily four. Also, an example case where one memory bottle MB includes three memory cells MC has been described with reference to FIG. 2, but the number of memory cells MC is not necessarily three. Further, an example case where the number of storage gate electrodes SG in the memory cell array 101 is four has been described with reference to FIG. 2, but the number of storage gate electrodes SG is not necessarily four. The number of storage gate electrodes SG varies with the number of memory cells MC in one memory bottle MB.

The plurality of storage gate electrodes SG is connected to the storage gate control circuit 102. The storage gate control circuit 102 has a function to apply a storage gate voltage VSG to the storage gate electrodes SG at a predetermined timing.

The cock gate electrode CG is connected to the cock gate control circuit 103. The cock gate control circuit 103 has a function to apply a cock gate voltage VCG to the cock gate electrode CG at a predetermined timing.

The plate electrode PL is connected to the plate control circuit 104. The plate control circuit 104 has a function to apply a plate voltage VPL to the plate electrode PL at a predetermined timing.

The plurality of bit lines BL is connected to the bit line control circuit 105. The bit line control circuit 105 has a function to apply a bit line voltage VBL to the bit lines BL at a predetermined timing.

The sense amplifier circuit 106 is connected to the bit lines BL. The sense amplifier circuit 106 has a function to amplify and detect the data stored in the memory cells MC on the basis of the current flowing in the bit lines BL. For example, after moving the data stored in the memory cells MC to the standby cell SC, the sense amplifier circuit 106 amplifies and detects the data stored in the memory cells MC on the basis of the current flowing in the bit lines BL.

The central control circuit 107 controls read operations and write operations of the nonvolatile memory 100. The central control circuit 107 controls the storage gate control circuit 102, the cock gate control circuit 103, the plate control circuit 104, the bit line control circuit 105, and the sense amplifier circuit 106.

Figure 3:
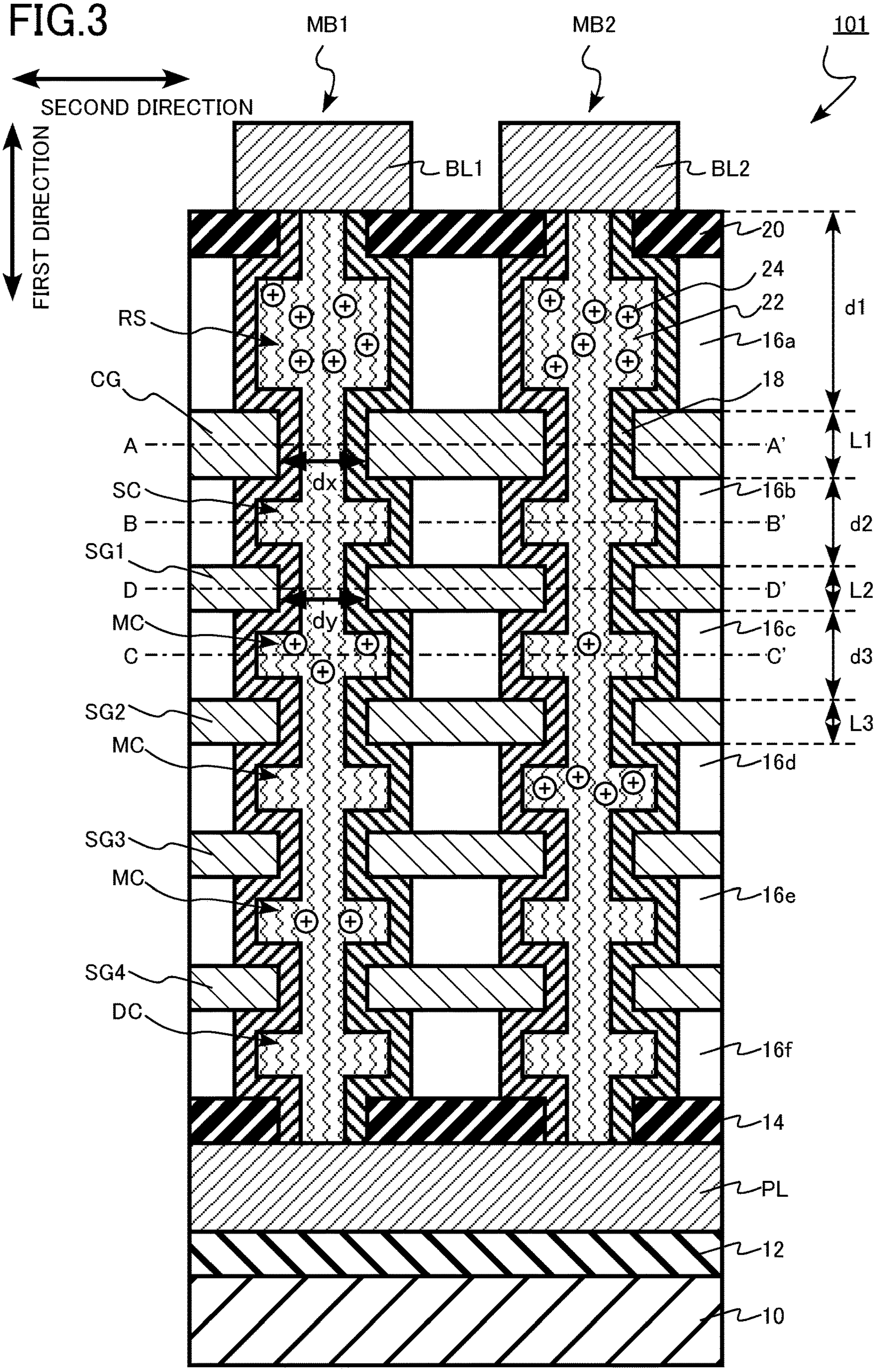
FIG. 3 is a schematic cross-sectional view of the storage device of the first embodiment.

FIG. 3 is a schematic cross-sectional view of the storage device of the first embodiment. FIG. 3 is a schematic cross-sectional view of the memory cell array 101. FIG. 3 is a schematic cross-sectional view including the first memory bottle MB1 and the second memory bottle MB2.

Figure 4A:
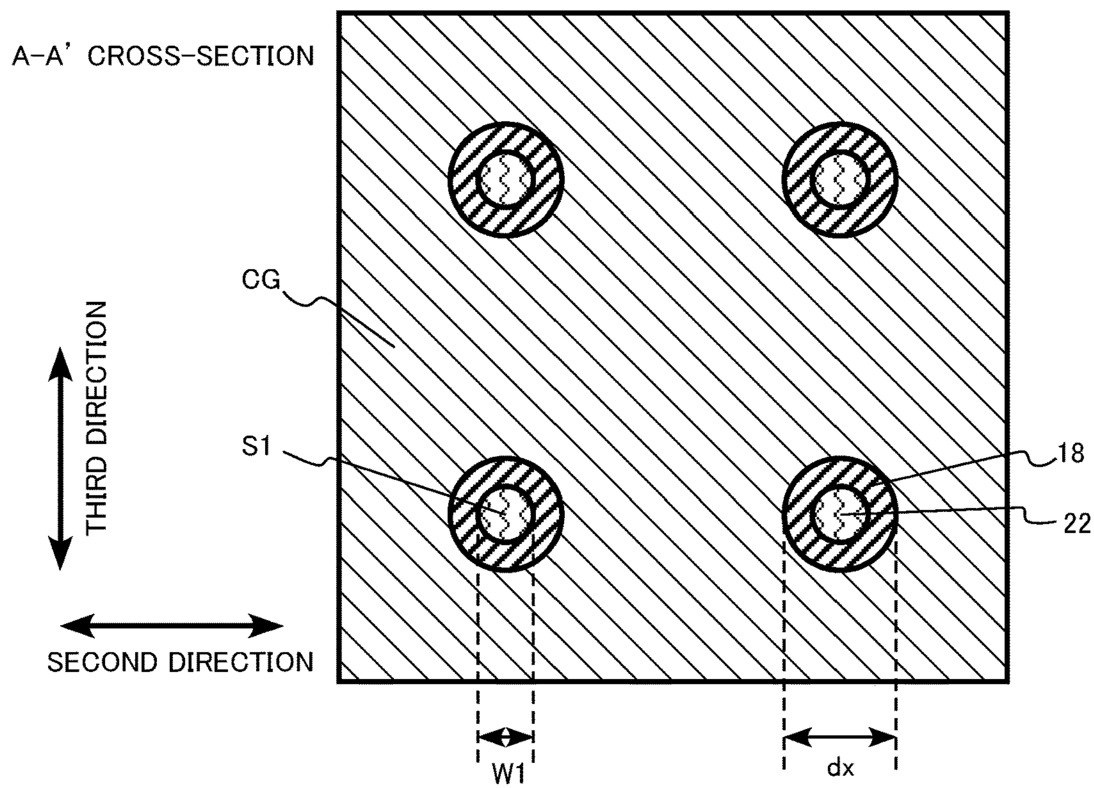
FIGS. 4A and 4B are schematic cross-sectional views of the storage device of the first embodiment.
Figure 4B:
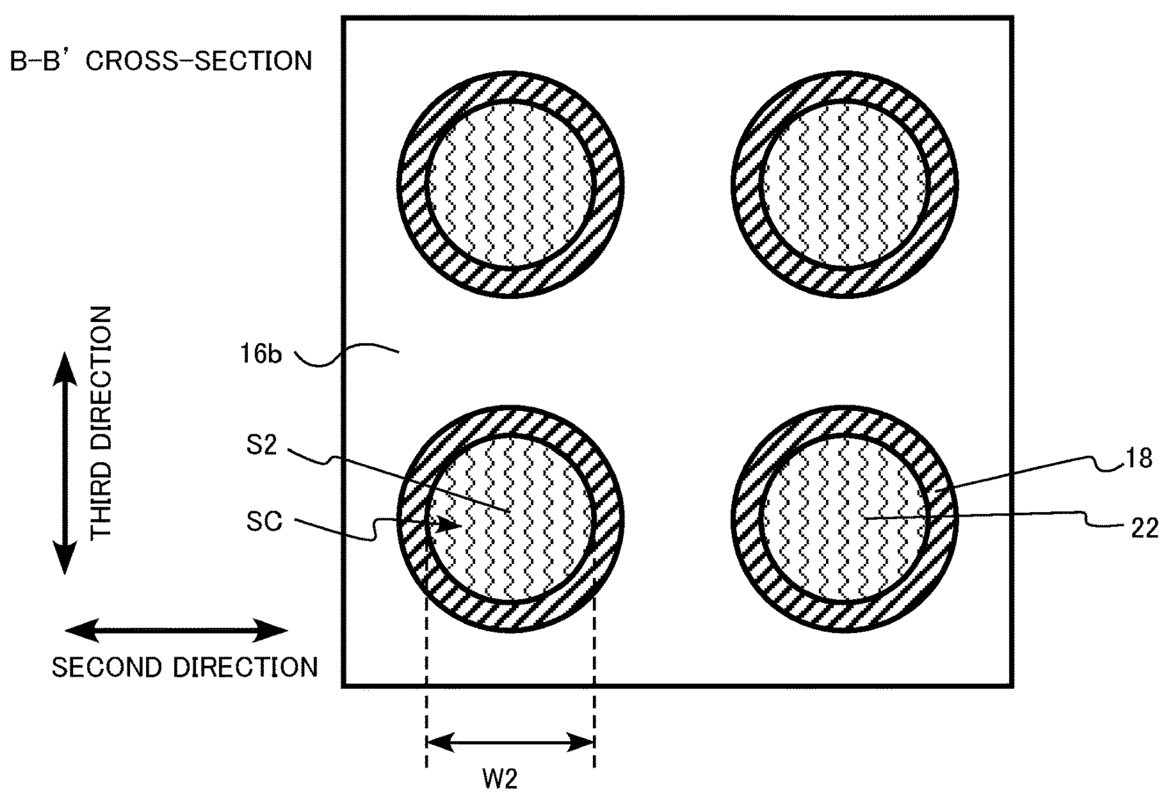

FIGS. 4A and 4B are schematic cross-sectional views of the storage device of the first embodiment. FIGS. 4A and 4B are schematic cross-sectional views of the memory cell array 101. FIGS. 4A and 4B are cross-sections of the memory cell array 101 perpendicular to the first direction. FIG. 4A is a cross-section taken along the A-A' line defined in FIG. 3, and FIG. 4B is a cross-section taken along the B-B' line defined in FIG. 3.

Figure 5A:
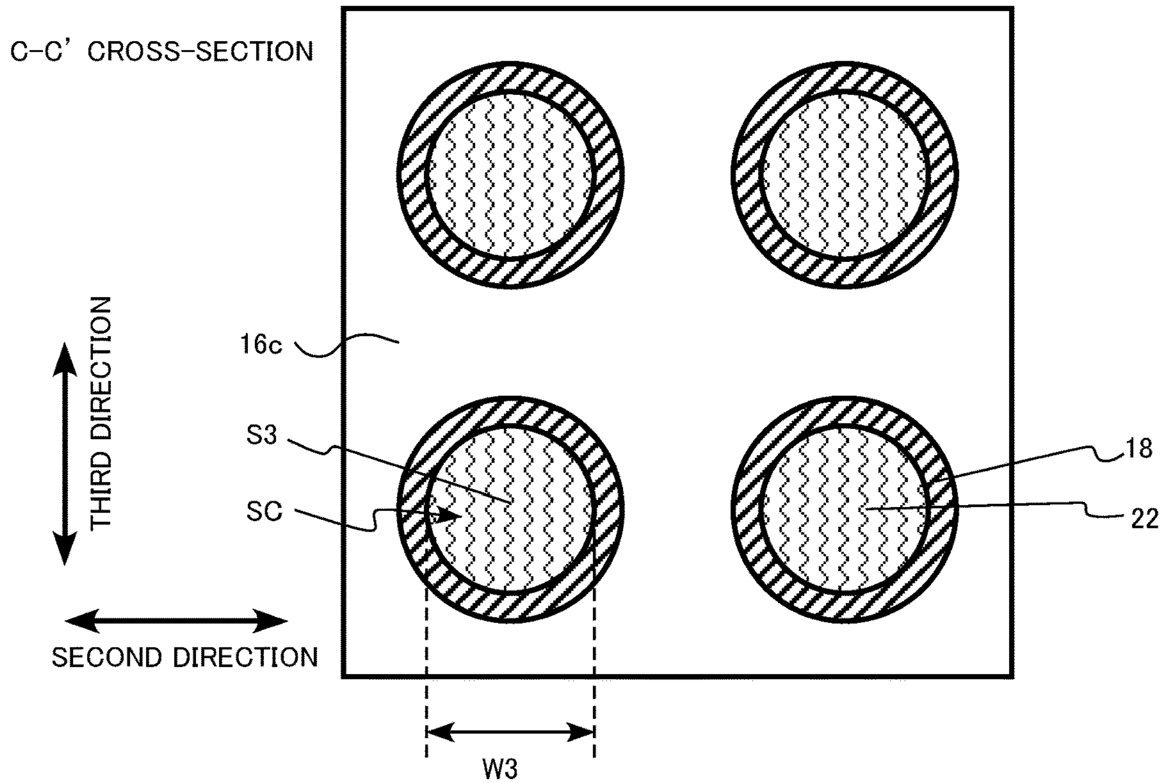
FIGS. 5A and 5B are schematic cross-sectional views of the storage device of the first embodiment.
Figure 5B:
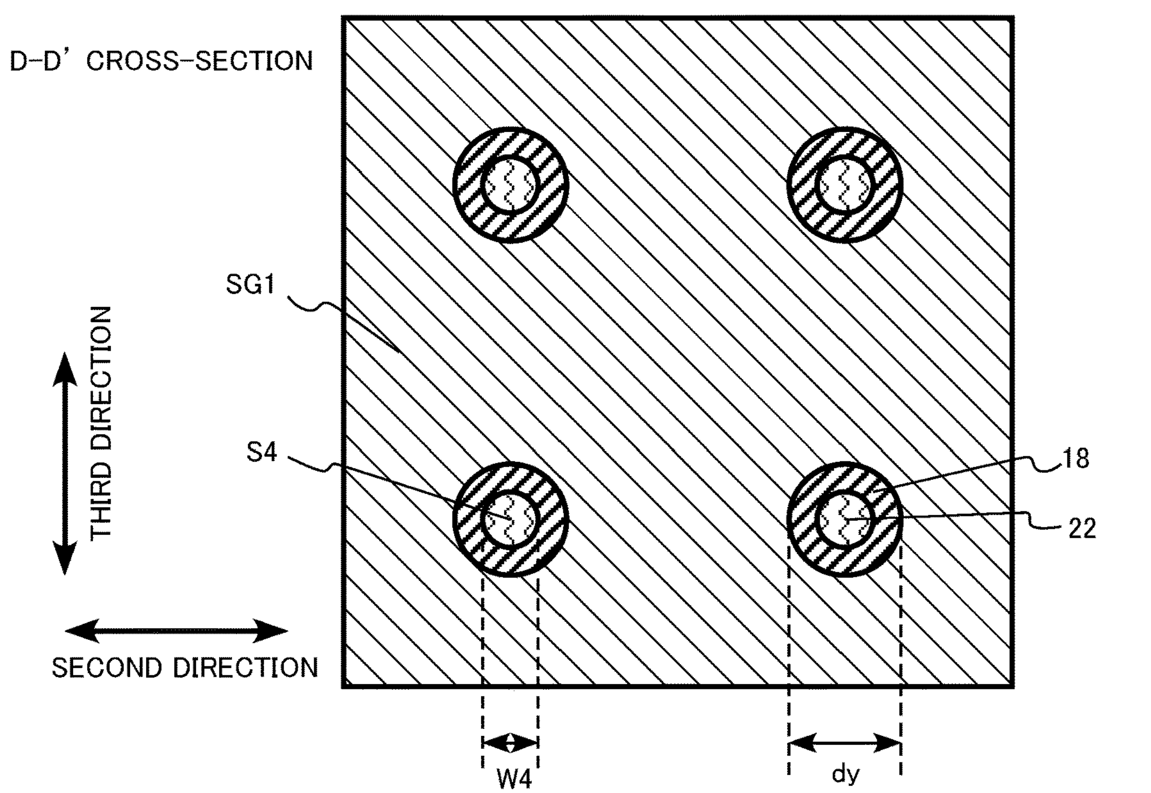

FIGS. 5A and 5B are schematic cross-sectional views of the storage device of the first embodiment. FIGS. 5A and 5B are cross-sections of the memory cell array 101 perpendicular to the first direction. FIG. 5A is a cross-section taken along the C-C' line defined in FIG. 3, and FIG. 5B is a cross-section taken along the D-D' line defined in FIG. 3.

The memory cell array 101 includes a semiconductor substrate 10, a substrate insulating layer 12, a lower insulating layer 14, a first interlayer insulating layer 16*a*, a second interlayer insulating layer 16*b*, a third interlayer insulating layer 16*c*, a fourth interlayer insulating layer 16*d*, a fifth interlayer insulating layer 16*e*, a sixth interlayer insulating layer 16*f*, a gate insulating film 18, an upper insulating layer 20, a fluid layer 22, and a plurality of charged particles 24. The memory cell array 101 also includes the first bit line BL1, the second bit line BL2, the plate electrode PL, the cock gate electrode CG, the first storage gate electrode SG1, the second storage gate electrode SG2, the third storage gate electrode SG3, and the fourth storage gate electrode SG4. The memory cell array 101 further includes the reservoir RS, the standby cell SC, a plurality of memory cells MC, and the dummy cell DC.

The first bit line BL1 is an example of the first conductive layer. The plate electrode PL is an example of the second conductive layer. The cock gate electrode CG is an example of the first control electrode. The first storage gate electrode SG1 is an example of the second control electrode. The second storage gate electrode SG2 is an example of the third control electrode. The third storage gate electrode SG3 is an example of the fourth control electrode.

The first interlayer insulating layer 16*a* is an example of the first insulating layer. The second interlayer insulating layer 16*b* is an example of the second insulating layer. The third interlayer insulating layer 16*c* is an example of the third insulating layer. The fourth interlayer insulating layer 16*d* is an example of the fourth insulating layer. The fifth interlayer insulating layer 16*e* is an example of the fifth insulating layer. Hereinafter, the first interlayer insulating layer 16*a*, the second interlayer insulating layer 16*b*, the third interlayer insulating layer 16*c*, the fourth interlayer insulating layer 16*d*, the fifth interlayer insulating layer 16*e*, and the sixth interlayer insulating layer 16*f* will be mentioned individually of one another, or will be collectively referred to as the interlayer insulating layers 16.

The gate insulating film 18 is an example of the insulating film. The charged particles 24 are an example of the particles.

The first memory bottle MB1 and the second memory bottle MB2 are adjacent to each other. The second memory bottle MB2 is located in a second direction perpendicular to the first direction, with respect to the first memory bottle MB1.

The semiconductor substrate 10 is a single-crystal substrate, for example. The semiconductor substrate 10 contains conductive impurities, for example. The semiconductor substrate 10 is a single-crystal, n-type silicon substrate, for example. It is also possible to omit the semiconductor substrate 10.

The bit lines BL are provided above the semiconductor substrate 10. The bit lines BL are linear conductors, for example. The bit lines BL contain a metal, a metal nitride, a metal carbide, or a semiconductor, for example. The bit lines BL contain tungsten (W), for example.

The plate electrode PL is provided above the semiconductor substrate 10. The plate electrode PL is provided between the bit lines BL and the semiconductor substrate 10. The plate electrode PL is a plate-like conductor, for example. The plate electrode PL contains a metal, a metal nitride, a metal carbide, or a semiconductor, for example. The plate electrode PL contains tungsten (W), for example.

The substrate insulating layer 12 is provided on the semiconductor substrate 10. The substrate insulating layer 12 is provided between the plate electrode PL and the semiconductor substrate 10. The substrate insulating layer 12 is a silicon oxide layer, for example.

The lower insulating layer 14 is provided between the bit lines BL and the plate electrode PL. The lower insulating layer 14 is a silicon nitride layer, for example.

The upper insulating layer 20 is provided between the bit lines BL and the lower insulating layer 14. The upper insulating layer 20 is a silicon nitride layer, for example.

The first interlayer insulating layer 16*a* is provided between the bit lines BL and the cock gate electrode CG. The first interlayer insulating layer 16*a* is provided between the upper insulating layer 20 and the cock gate electrode CG. The first interlayer insulating layer 16*a* surrounds the fluid layer 22.

The first interlayer insulating layer 16*a* electrically separates the bit lines BL from the cock gate electrode CG. The first interlayer insulating layer 16*a* is an example of the first insulating layer.

The first interlayer insulating layer 16*a* may be an oxide layer, an oxynitride layer, or a nitride layer, for example. The first interlayer insulating layer 16*a* is a silicon oxide layer, for example.

The cock gate electrode CG is provided between the bit lines BL and the plate electrode PL. The cock gate electrode CG is provided between the first interlayer insulating layer 16*a* and the second interlayer insulating layer 16*b*. The cock gate electrode CG is a plate-like conductor, for example. The cock gate electrode CG surrounds the fluid layer 22, for example.

The cock gate electrode CG functions as the gate electrode of the cock transistor. The cock transistor is formed with the cock gate electrode CG, the gate insulating film 18, and the fluid layer 22. The fluid layer 22 serves as the channel region of the cock transistor. The cock gate electrode CG is an example of the first control electrode.

The cock gate electrode CG contains a metal, a metal nitride, a metal carbide, or a semiconductor, for example. The cock gate electrode CG contains tungsten (W), for example.

The cock gate electrode CG has a first length (L1 in FIG. 3) in the first direction. The distance in the first direction between the bit lines BL and the cock gate electrode CG is a first distance (d1 in FIG. 3).

The first length L1 is not smaller than 10 nm and not greater than 50 nm, for example. The first distance d1 is not smaller than 20 nm and not greater than 500 nm, for example.

The second interlayer insulating layer 16*b* is provided between the cock gate electrode CG and the plate electrode PL. The second interlayer insulating layer 16*b* is provided between the cock gate electrode CG and the first storage gate electrode SG1. The second interlayer insulating layer 16*b* surrounds the fluid layer 22.

The second interlayer insulating layer 16*b* electrically separates the cock gate electrode CG and the first storage gate electrode SG1 from each other. The second interlayer insulating layer 16*b* is an example of the second insulating layer.

The second interlayer insulating layer 16*b* may be an oxide layer, an oxynitride layer, or a nitride layer, for example. The second interlayer insulating layer 16*b* is a silicon oxide layer, for example.

The first storage gate electrode SG1 is provided between the second interlayer insulating layer 16*b* and the plate electrode PL. The first storage gate electrode SG1 is provided between the second interlayer insulating layer 16*b* and the third interlayer insulating layer 16*c*. The first storage gate electrode SG1 is a plate-like conductor, for example. The first storage gate electrode SG1 surrounds the fluid layer 22, for example.

The first storage gate electrode SG1 functions as the gate electrode of a storage transistor. The storage transistor is formed with the first storage gate electrode SG1, the gate insulating film 18, and the fluid layer 22. The fluid layer 22 serves as the channel region of the storage transistor. The first storage gate electrode SG1 is an example of the second control electrode.

The first storage gate electrode SG1 contains a metal, a metal nitride, a metal carbide, or a semiconductor, for example. The first storage gate electrode SG1 contains tungsten (W), for example.

The first storage gate electrode SG1 has a second length (L2 in FIG. 3) in the first direction. The distance in the first direction between the cock gate electrode CG and the first storage gate electrode SG1 is a second distance (d2 in FIG. 3).

The second length L2 is not smaller than 5 nm and not greater than 30 nm, for example. The second distance d2 is not smaller than 5 nm and not greater than 30 nm, for example.

The first length L1 of the cock gate electrode CG is greater than the second length L2 of the first storage gate electrode SG1, for example. The first length L1 is at least 1.5 times greater than the second length L2, for example.

The first distance d1 between the bit lines BL and the cock gate electrode CG is greater than the second distance d2 between the cock gate electrode CG and the first storage gate electrode SG1. The first distance d1 is at least twice the second distance d2, for example.

In a cross-section parallel to the first direction, the distance (dx in FIGS. 3 and 4A) between the two ends of the cock gate electrode CG facing each other with the fluid layer 22 interposed in between is smaller than the distance (dy in FIGS. 3 and 5B) between the two ends of the first storage gate electrode SG1 facing each other with the fluid layer 22 interposed in between, for example.

The third interlayer insulating layer 16*c* is provided between the first storage gate electrode SG1 and the plate electrode PL. The third interlayer insulating layer 16*c* is provided between the first storage gate electrode SG1 and the second storage gate electrode SG2. The third interlayer insulating layer 16*c* surrounds the fluid layer 22.

The third interlayer insulating layer 16*c* separates the first storage gate electrode SG1 and the second storage gate electrode SG2 from each other. The third interlayer insulating layer 16*c* is an example of the third insulating layer.

The third interlayer insulating layer 16*c* may be an oxide layer, an oxynitride layer, or a nitride layer, for example. The third interlayer insulating layer 16*c* is a silicon oxide layer, for example.

The second storage gate electrode SG2 is provided between the third interlayer insulating layer 16*c* and the plate electrode PL. The second storage gate electrode SG2 is provided between the third interlayer insulating layer 16*c* and the fourth interlayer insulating layer 16*d*. The second storage gate electrode SG2 is a plate-like conductor, for example. The second storage gate electrode SG2 surrounds the fluid layer 22, for example.

The second storage gate electrode SG2 functions as the gate electrode of a storage transistor. The storage transistor is formed with the second storage gate electrode SG2, the gate insulating film 18, and the fluid layer 22. The fluid layer 22 serves as the channel region of the storage transistor. The second storage gate electrode SG2 is an example of the third control electrode.

The second storage gate electrode SG2 contains a metal, a metal nitride, a metal carbide, or a semiconductor, for example. The second storage gate electrode SG2 contains tungsten (W), for example.

The second storage gate electrode SG2 has a third length (L3 in FIG. 3) in the first direction. The distance in the first direction between the first storage gate electrode SG1 and the second storage gate electrode SG2 is a third distance (d3 in FIG. 3).

The third length L3 is not smaller than 5 nm and not greater than 30 nm, for example. The third distance d3 is not smaller than 5 nm and not greater than 30 nm, for example.

The first length L1 of the cock gate electrode CG is greater than the third length L3 of the second storage gate electrode SG2, for example. The first length L1 is at least 1.5 times greater than the third length L3, for example.

The first distance d1 between the bit lines BL and the cock gate electrode CG is greater than the third distance d3 between the first storage gate electrode SG1 and the second storage gate electrode SG2. The first distance d1 is at least twice the third distance d3, for example.

The second length L2 of the first storage gate electrode SG1 is equal to the third length L3 of the second storage gate electrode SG2, for example. The second distance d2 between the cock gate electrode CG and the first storage gate electrode SG1 is equal to the third distance d3 between the first storage gate electrode SG1 and the second storage gate electrode SG2, for example.

The fourth interlayer insulating layer 16*d* is provided between the second storage gate electrode SG2 and the plate electrode PL. The fourth interlayer insulating layer 16*d* is provided between the second storage gate electrode SG2 and the third storage gate electrode SG3. The fourth interlayer insulating layer 16*d* surrounds the fluid layer 22.

The fourth interlayer insulating layer 16*d* separates the second storage gate electrode SG2 and the third storage gate electrode SG3 from each other. The fourth interlayer insulating layer 16*d* is an example of the fourth insulating layer.

The fourth interlayer insulating layer 16*d* may be an oxide layer, an oxynitride layer, or a nitride layer, for example. The fourth interlayer insulating layer 16*d* is a silicon oxide layer, for example.

The third storage gate electrode SG3 is provided between the fourth interlayer insulating layer 16*d* and the plate electrode PL. The third storage gate electrode SG3 is provided between the fourth interlayer insulating layer 16*d* and the fifth interlayer insulating layer 16*e*. The third storage gate electrode SG3 is a plate-like conductor, for example. The third storage gate electrode SG3 surrounds the fluid layer 22, for example.

The third storage gate electrode SG3 functions as the gate electrode of a storage transistor. The storage transistor is formed with the third storage gate electrode SG3, the gate insulating film 18, and the fluid layer 22.

The fluid layer 22 serves as the channel region of the storage transistor. The third storage gate electrode SG3 is an example of the fourth control electrode.

The third storage gate electrode SG3 contains a metal, a metal nitride, a metal carbide, or a semiconductor, for example. The third storage gate electrode SG3 contains tungsten (W), for example.

The fifth interlayer insulating layer 16*e* is provided between the third storage gate electrode SG3 and the plate electrode PL. The fifth interlayer insulating layer 16*e* is provided between the third storage gate electrode SG3 and the fourth storage gate electrode SG4. The fifth interlayer insulating layer 16*e* surrounds the fluid layer 22.

The fifth interlayer insulating layer 16*e* separates the third storage gate electrode SG3 and the fourth storage gate electrode SG4 from each other. The fifth interlayer insulating layer 16*e* is an example of the fifth insulating layer.

The fifth interlayer insulating layer 16*e* may be an oxide layer, an oxynitride layer, or a nitride layer, for example. The fifth interlayer insulating layer 16*e* is a silicon oxide layer, for example.

The fourth storage gate electrode SG4 is provided between the fifth interlayer insulating layer 16*e* and the plate electrode PL. The fourth storage gate electrode SG4 is provided between the fifth interlayer insulating layer 16*e* and the sixth interlayer insulating layer 16*f*. The fourth storage gate electrode SG4 is a plate-like conductor, for example. The fourth storage gate electrode SG4 surrounds the fluid layer 22, for example.

The fourth storage gate electrode SG4 functions as the gate electrode of a storage transistor. The storage transistor is formed with the fourth storage gate electrode SG4, the gate insulating film 18, and the fluid layer 22. The fluid layer 22 serves as the channel region of the storage transistor.

The fourth storage gate electrode SG4 contains a metal, a metal nitride, a metal carbide, or a semiconductor, for example. The fourth storage gate electrode SG4 contains tungsten (W), for example.

The sixth interlayer insulating layer 16*f* is provided between the fourth storage gate electrode SG4 and the plate electrode PL. The sixth interlayer insulating layer 16*f* is provided between the fourth storage gate electrode SG4 and the lower insulating layer 14. The sixth interlayer insulating layer 16*f* surrounds the fluid layer 22.

The sixth interlayer insulating layer 16*f* electrically separates the fourth storage gate electrode SG4 and the plate electrode PL from each other.

The sixth interlayer insulating layer 16*f* may be an oxide layer, an oxynitride layer, or a nitride layer, for example. The sixth interlayer insulating layer 16*f* is a silicon oxide layer, for example.

The fluid layer 22 is provided between the bit lines BL and the plate electrode PL. The fluid layer 22 extends in the first direction. The fluid layer 22 is in contact with the bit lines BL and the plate electrode PL, for example.

The fluid layer 22 is surrounded by the cock gate electrode CG, for example. The fluid layer 22 is surrounded by the storage gate electrodes SG, for example.

The fluid layer 22 is surrounded by the interlayer insulating layers 16, for example. The fluid layer 22 is surrounded by the gate insulating film 18, for example. The fluid layer 22 is in contact with the gate insulating film 18, for example.

The fluid layer 22 has a function to allow current to flow between the bit lines BL and the plate electrode PL.

The fluid layer 22 contains a liquid. The melting point of the liquid contained in the fluid layer 22 is not lower than −100° C. and not higher than 0° C., for example. The boiling point of the liquid contained in the fluid layer 22 is not lower than 400° C. and not higher than 2000° C., for example.

The fluid layer 22 contains electric charge, for example. The liquid contained in the fluid layer 22 is an ionic liquid or an electrolytic solution, for example. The liquid contained in the fluid layer 22 contains ions, for example.

As shown in FIG. 4A, the fluid layer 22 has a first cross-sectional area (S1 in FIG. 4A) in a first cross-section (the A-A' cross-section) perpendicular to the first direction, the first cross-section including the cock gate electrode CG. Further, as shown in FIG. 4B, the fluid layer 22 has a second cross-sectional area (S2 in FIG. 4B) in a second cross-section (the B-B' cross-section) perpendicular to the first direction, the second cross-section including the second interlayer insulating layer 16*b*.

The first cross-sectional area S1 of the fluid layer 22 is equal to the area of the region surrounded by the gate insulating film 18 in the first cross-section. Also, the second cross-sectional area S2 of the fluid layer 22 is equal to the area of the region surrounded by the gate insulating film 18 in the second cross-section.

The first cross-sectional area S1 is smaller than the second cross-sectional area S2, for example. The first cross-sectional area S1 is equal to or smaller than one-fourth of the second cross-sectional area S2, for example.

As shown in FIG. 4A, the fluid layer 22 has a first width (W1 in FIG. 4A) in the second direction in the first cross-section (the A-A' cross-section). Also, as shown in FIG. 4B, the fluid layer 22 has a second width (W2 in FIG. 4B) in the second direction in the second cross-section (the B-B' cross-section).

The first width W1 is smaller than the second width W2, for example. The first width W1 is equal to or smaller than one-half of the second width W2, for example.

The first width W1 is not smaller than 3 nm and not greater than 15 nm, for example. The second width W2 is not smaller than 10 nm and not greater than 30 nm, for example.

The first width W1 is at least 1.2 times greater than the particle size of the charged particles 24 but is not greater than twice the particle size, for example.

As shown in FIG. 5A, the fluid layer 22 has a third cross-sectional area (S3 in FIG. 5A) in a third cross-section (the C-C' cross-section) perpendicular to the first direction, the third cross-section including the third interlayer insulating layer 16*c*. Also, as shown in FIG. 5B, the fluid layer 22 has a fourth cross-sectional area (S4 in FIG. 5B) in a fourth cross-section (the D-D' cross-section) perpendicular to the first direction, the fourth cross-section including the first storage gate electrode SG1.

The third cross-sectional area S3 of the fluid layer 22 is equal to the area of the region surrounded by the gate insulating film 18 in the third cross-section. Also, the fourth cross-sectional area S4 of the fluid layer 22 is equal to the area of the region surrounded by the gate insulating film 18 in the fourth cross-section.

As shown in FIG. 5A, the fluid layer 22 has a third width (W3 in FIG. 5A) in the second direction in the third cross-section (the C-C' cross-section). Also, as shown in FIG. 5B, the fluid layer 22 has a fourth width (W4 in FIG. 5B) in the second direction in the fourth cross-section (the D-D' cross-section). The fourth width W4 is smaller than the third width W3, for example.

The third width W3 is not smaller than 10 nm and not greater than 30 nm, for example. The fourth width W4 is not smaller than 3 nm and not greater than 10 nm, for example. Further, the fourth cross-sectional area S4 is smaller than the third cross-sectional area S3, for example. The fourth cross-sectional area S4 is equal to or smaller than one-half of the third cross-sectional area S3, for example.

The fourth cross-sectional area S4 is smaller than the second cross-sectional area S2, for example. The fourth cross-sectional area S4 is equal to or smaller than one-half of the second cross-sectional area S2, for example.

The first cross-sectional area S1 is smaller than the third cross-sectional area S3, for example. The first cross-sectional area S1 is equal to or smaller than one-fourth of the third cross-sectional area S3, for example.

The first cross-sectional area S1 is smaller than the fourth cross-sectional area S4, for example. The first cross-sectional area S1 is equal to or smaller than one-half of the fourth cross-sectional area S4, for example.

The first width W1 is smaller than the fourth width W4, for example. The first width W1 is equal to or smaller than two-thirds of the fourth width W4, for example.

The cross-sectional area S0 of the fluid layer 22 in a cross-section perpendicular to the first direction, the cross-section including the first interlayer insulating layer 16*a* is larger than the first cross-sectional area S1.

The charged particles 24 are contained in the fluid layer 22. The charged particles 24 are electrically-charged particles. The charged particles 24 are an example of the particles. The memory cells MC store data, using the charged particles 24.

In the example case description below, the charged particles 24 are positively charged. However, the charged particles 24 may be negatively charged.

The charged particles 24 are spherical, for example. The particle size of the charged particles 24 is not smaller than 1 nm and not greater than 10 nm, for example.

The charged particles 24 are metal nanoparticles, dielectric nanoparticles, colloidal particles, or molecules, for example.

The gate insulating film 18 is provided between the cock gate electrode CG and the fluid layer 22. The gate insulating film 18 is provided between a storage gate electrode SG and the fluid layer 22. The gate insulating film 18 is provided between an interlayer insulating layer 16 and the fluid layer 22.

The gate insulating film 18 surrounds the fluid layer 22. The gate insulating film 18 is in contact with the fluid layer 22, for example.

The gate insulating film 18 functions as a gate insulating film for the cock transistor and the storage transistors.

The gate insulating film 18 may be divided between the cock gate electrode CG and the first storage gate electrode SG1, for example. The gate insulating film 18 may also be divided between two adjacent storage gate electrodes SG, for example.

The gate insulating film 18 is an oxide layer, a nitride layer, or an oxynitride layer, for example. The gate insulating film 18 is an aluminum oxide layer, a hafnium oxide layer, or a silicon oxide layer, for example.

The thickness of the gate insulating film 18 in the second direction is not smaller than 3 nm and not greater than 10 nm, for example.

The region of the fluid layer 22 surrounded by the first interlayer insulating layer 16*a* functions as the reservoir RS. The region of the fluid layer 22 surrounded by the second interlayer insulating layer 16*b* functions as the standby cell SC. The region of the fluid layer 22 surrounded by the third interlayer insulating layer 16*c*, the region of the fluid layer 22 surrounded by the fourth interlayer insulating layer 16*d*, and the region of the fluid layer 22 surrounded by the fifth interlayer insulating layer 16*e* each function as a memory cell MC. The region of the fluid layer 22 surrounded by the sixth interlayer insulating layer 16*f* functions as the dummy cell DC.

The storage gate control circuit 102, the cock gate control circuit 103, the plate control circuit 104, the bit line control circuit 105, the sense amplifier circuit 106, and the central control circuit 107 are formed with an electronic circuit using a semiconductor device formed on the semiconductor substrate 10, for example.

Next, operations of the nonvolatile memory 100 are described. Particularly, a read operation and a write operation of the nonvolatile memory 100 are described in detail.

During a read operation and a write operation, the nonvolatile memory 100 sequentially transfers the data stored in the memory cells MCs connected in series in a memory bottle MB to the adjacent memory cells MC. During a read operation and a write operation, the nonvolatile memory 100 performs an operation of so-called shift register type. A read operation of the nonvolatile memory 100 is destructive reading by which the data stored in the memory cells MC is not saved.

Figure 6A:
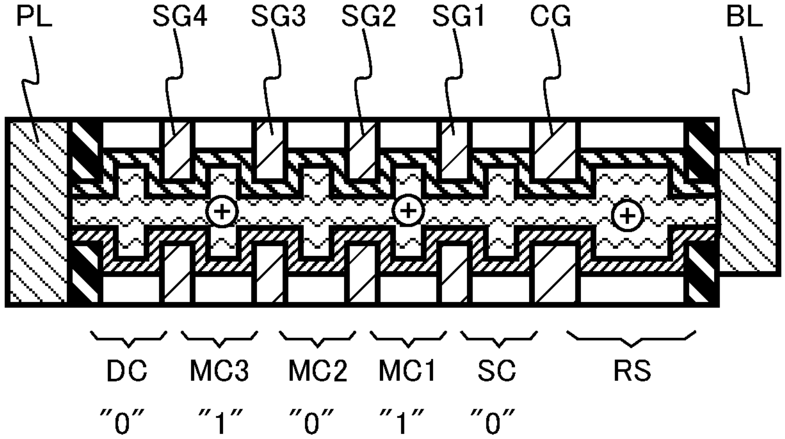
FIGS. 6A and 6B are diagrams for explaining an operation of the storage device of the first embodiment.
Figure 6B:
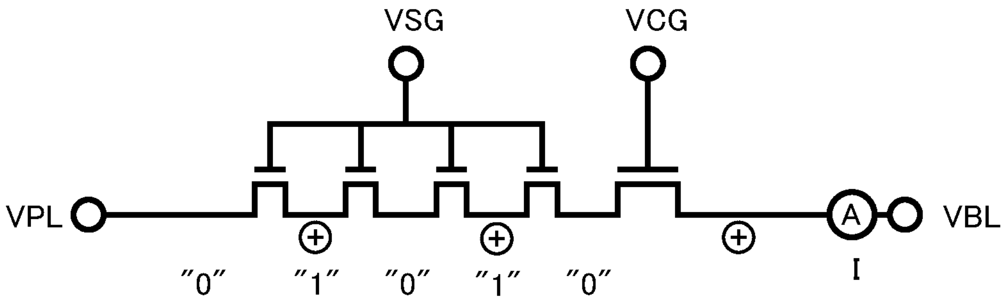

FIGS. 6A and 6B are diagrams for explaining an operation of the storage device of the first embodiment. FIG. 6A is a schematic diagram of one memory bottle MB. FIG. 6B is an equivalent circuit diagram of one memory bottle MB.

In the example case described below, the number of memory cells MC is three. The three memory cells MC are a first memory cell MC1, a second memory cell MC2, and a third memory cell MC3 in this order in the direction from the bit line BL toward the plate electrode PL. In the example case described below, the charged particles are positively charged.

A case where one charged particle exists in a memory cell MC is defined as data "1". Further, a case where any charged particle does not exist in a memory cell MC is defined as data "0". A memory cell MC can store 1-bit data of "0" or "1".

As shown in FIG. 6B, the bit line voltage VBL is applied to the bit line BL. The plate voltage VPL is applied to the plate electrode PL. The cock gate voltage VCG is applied to the cock gate electrode CG. The storage gate voltage VSG is applied to the first storage gate electrode SG1, the second storage gate electrode SG2, the third storage gate electrode SG3, and the fourth storage gate electrode SG4. The first storage gate electrode SG1, the second storage gate electrode SG2, the third storage gate electrode SG3, and the fourth storage gate electrode SG4 are electrically connected.

The nonvolatile memory 100 monitors the current I flowing in the bit line BL, as shown in FIG. 6B. On the basis of the current I flowing in the bit line BL, data is read from the memory cells MC, and data is written into the memory cells MC.

As shown in FIGS. 6A and 6B, a case where data "1" is stored in the first memory cell MC1, data "0" is stored in the second memory cell MC2, and data "1" is stored in the third memory cell MC3 in the initial state is described below as an example. Note that any charged particle does not exist in the standby cell SC and the dummy cell DC. The standby cell SC and the dummy cell DC are in the state corresponding to data "0".

Figure 7A:
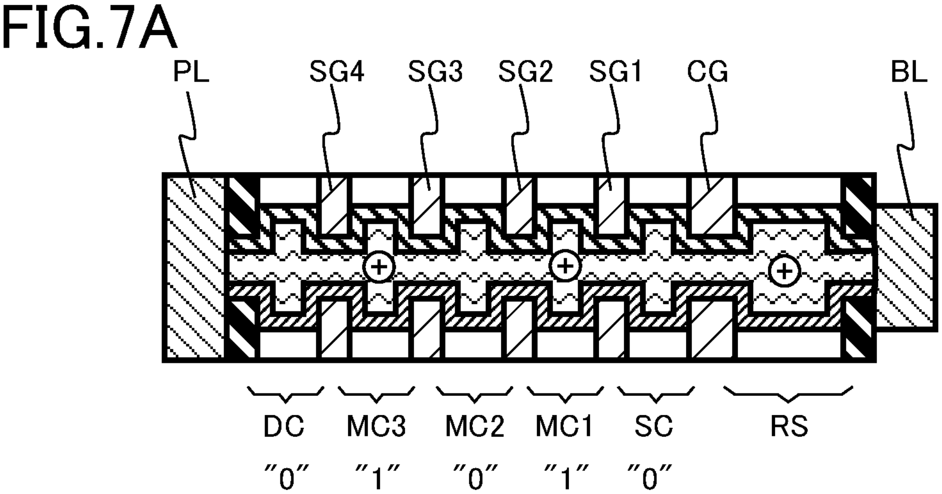
FIGS. 7A, 7B, and 7C are diagrams for explaining a data holding state of the storage device of the first embodiment.
Figure 7B:
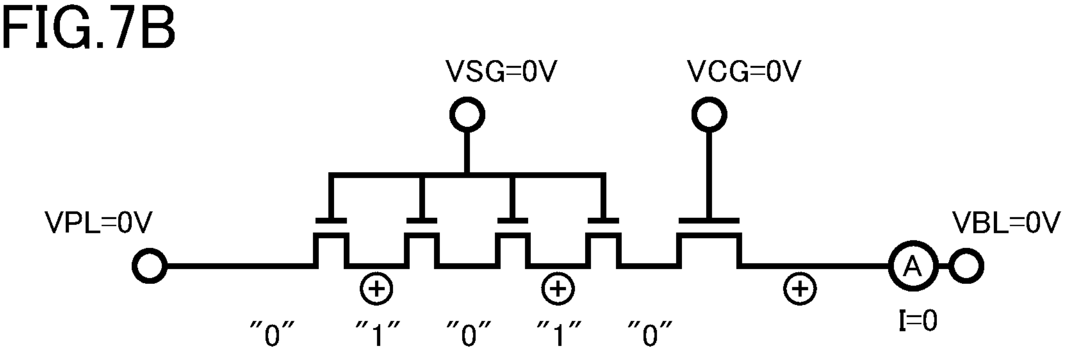
Figure 7C:

FIGS. 7A, 7B, and 7C are diagrams for explaining a data holding state of the storage device of the first embodiment. FIG. 7A is a schematic diagram of one memory bottle MB. FIG. 7B is an equivalent circuit diagram of the one memory bottle MB. FIG. 7C is a diagram showing the electrostatic potential distribution in the fluid layer in the memory bottle MB.

In the data holding state, the bit line voltage VBL is 0 V, the plate voltage VPL is 0 V, the cock gate voltage VCG is 0 V, and the storage gate voltage VSG is 0 V. No voltage is applied between the bit line BL and the plate electrode PL.

As shown in FIG. 7C, because of the work function of the cock gate electrode CG and the work function of the storage gate electrodes SG, for example, an energy barrier is formed between the reservoir RS and the standby cell SC, between the standby cell SC and the memory cells MC, between each two adjacent memory cells MC, and between the memory cells MC and the dummy cell DC. For example, as an energy barrier is formed between each two adjacent memory cells MC, movement of charged particles between the memory cells MCs is restricted. Thus, the memory cells MC can hold the data.

The height of the energy barriers can be adjusted with the material of the cock gate electrode CG, the material of the storage gate electrodes SG, the material of the interlayer insulating layers 16, the material of the gate insulating film 18, the pH of the fluid layer 22, or the like, for example. Also, the height of the energy barriers can be adjusted with the material of the charged particles 24, the particle size of the charged particles 24, the surface modification of the charged particles 24, or the like, for example.

Next, a read operation of the nonvolatile memory 100 is described.

FIGS. 8A, 8B, 8C, 9A, 9B, 9C, 10A, 10B, 10C, 11A, 11B, and 11C are diagrams for explaining a read operation of the storage device of the first embodiment. FIGS. 8A, 9A, 10A, and 11A are schematic views of one memory bottle MB. FIGS. 8B, 9B, 10B, and 11B are equivalent circuit diagrams of the one memory bottle MB. FIGS. 8C, 9C, 10C, and 11C are diagrams showing the electrostatic potential distribution in the fluid layer in the memory bottle MB.

In the nonvolatile memory 100, the charged particles are moved to the respective adjacent cells, so that the data stored in the first memory cell MC1, the second memory cell MC2, and the third memory cell MC3 is sequentially read out.

Reading of the data "1" stored in the first memory cell MC1 is first described.

Figure 8A:
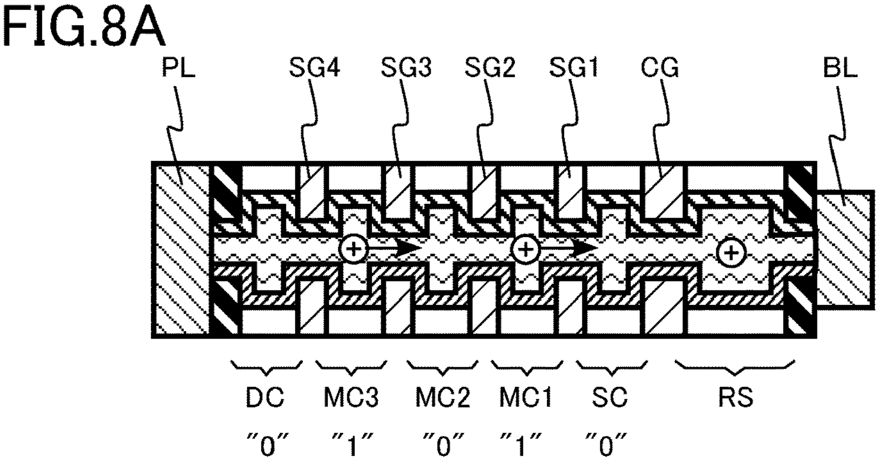
FIGS. 8A, 8B, and 8C are diagrams for explaining a read operation of the storage device of the first embodiment.
Figure 8B:
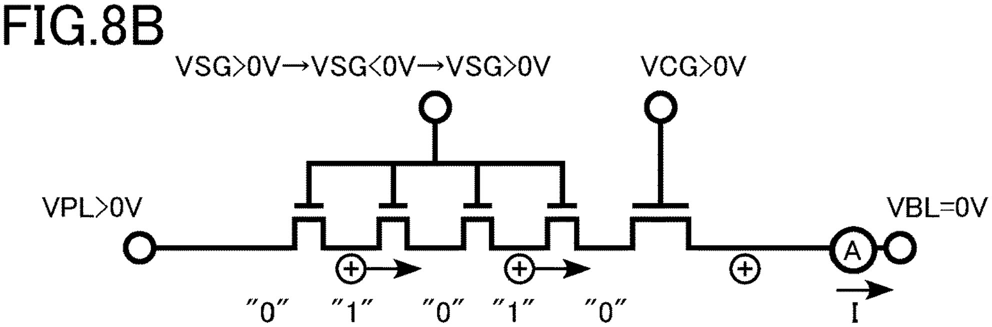

First, as shown in FIG. 8B, the bit line voltage VBL is set to 0 V, the plate voltage VPL is set to a positive voltage, and the cock gate voltage VCG is set to a positive voltage. The storage gate voltage VSG is changed from a positive voltage to a negative voltage, or from a negative voltage to a positive voltage.

The magnitudes and the timings of the bit line voltage VBL, the plate voltage VPL, the cock gate voltage VCG, and the storage gate voltage VSG are controlled by the central control circuit 107.

Figure 8C:
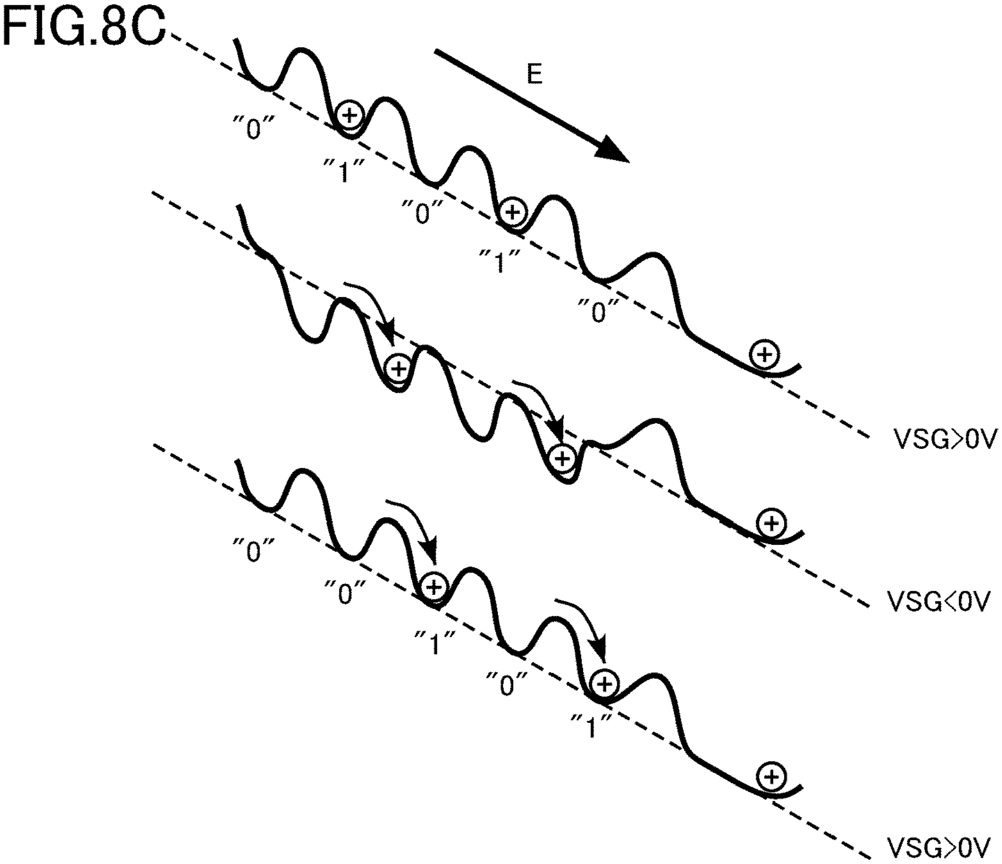

As shown in FIG. 8C, the bit line voltage VBL is set to 0 V, and the plate voltage VPL is set to a positive voltage, so that an electric field E is induced in the direction from the plate electrode PL toward the bit line BL. Because of this electric field E, an ionic current from the plate electrode PL toward the bit line BL flows in the fluid layer.

When the storage gate voltage VSG is a positive voltage, the energy barriers between the respective cells are high. Therefore, when the electric field E is applied, charged particle movement is restricted.

When the storage gate voltage VSG switches to a negative voltage, the electrostatic potential of the fluid layer facing the storage gate electrodes SG drops, and an electrostatic potential valley is formed. The charged particles move to the side of the bit line BL, and falls into the electrostatic potential valley.

When the storage gate voltage VSG switches to a positive voltage, the electrostatic potential of the fluid layer facing the storage gate electrodes SG rises. Therefore, the charged particles move to the side of the bit line BL, and move into the adjacent cells.

As described above, the charged particles move into the adjacent cells on the side of the bit line BL, and thus, the data is transferred. For example, the charged particle existing in the first memory cell MC1 moves into the standby cell SC. The standby cell SC enters a state corresponding to data "1".

Because of the data transfer, the first memory cell MC1 enters a data "0" state, the second memory cell MC2 enters a data "1" state, and the third memory cell MC3 enters a data "0" state.

Figure 9A:
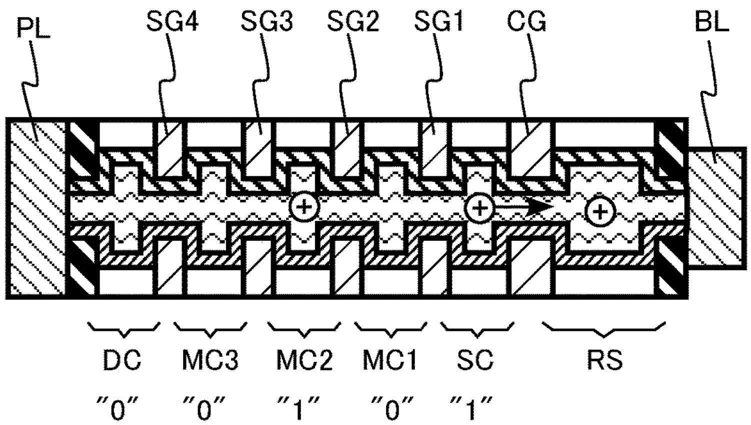
FIGS. 9A, 9B, and 9C are diagrams for explaining a read operation of the storage device of the first embodiment.
Figure 9B:
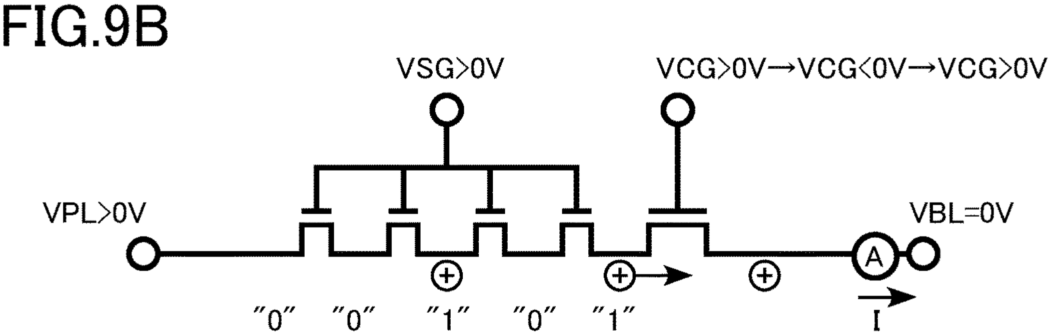

Next, as shown in FIG. 9B, the bit line voltage VBL is set to 0 V, the plate voltage VPL is set to a positive voltage, and the storage gate voltage VSG is set to a positive voltage. The cock gate voltage VCG is changed from a positive voltage to a negative voltage, or from a negative voltage to a positive voltage.

When the cock gate voltage VCG is a positive voltage, the energy barrier between the standby cell SC and the reservoir RS is high. Therefore, when the electric field E is applied, charged particle movement is restricted.

When the cock gate voltage VCG switches to a negative voltage, the electrostatic potential of the fluid layer facing the cock gate electrode CG drops. Therefore, the charged particle existing in the standby cell SC moves toward the bit line BL, and stays the reservoir RS.

When the cock gate voltage VCG switches to a positive voltage, the electrostatic potential of the fluid layer facing the cock gate electrode CG rises. Therefore, the charged particle is kept in the reservoir RS.

Figure 9C:
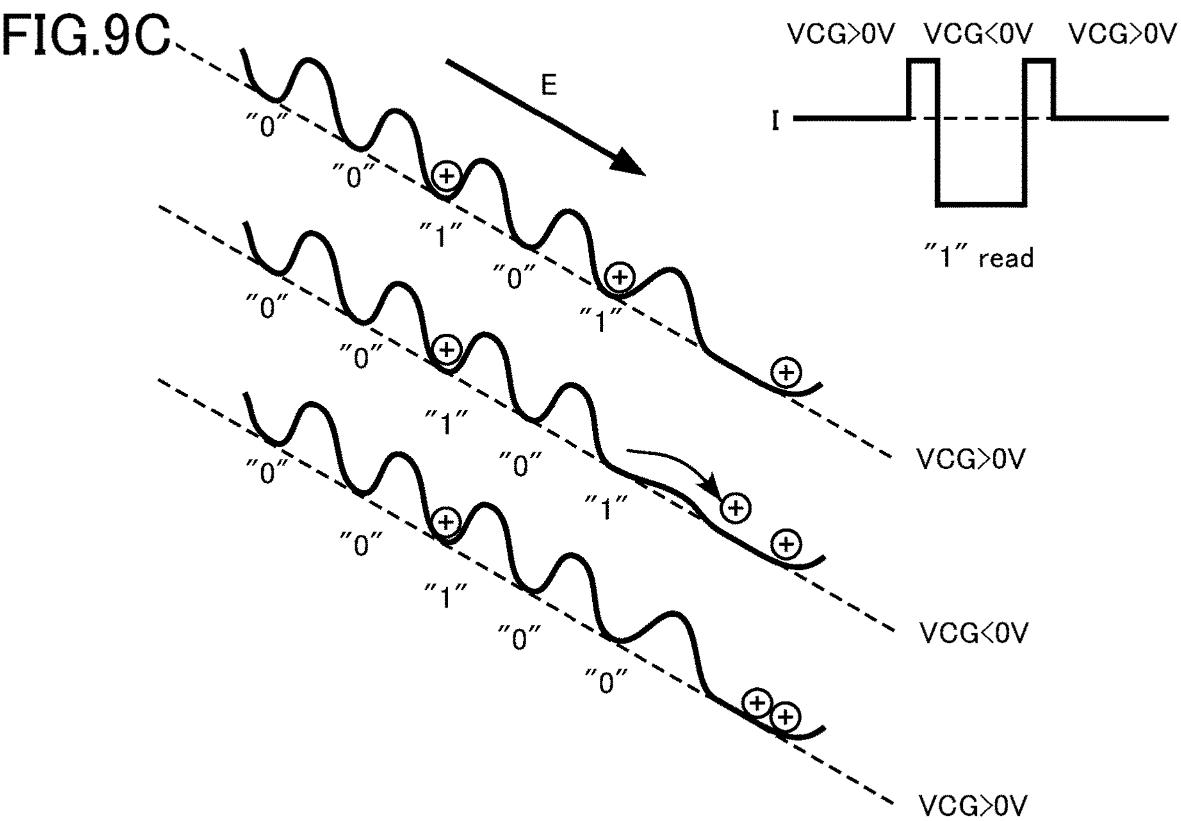

As indicated by the current waveforms in FIG. 9C, when the cock gate voltage VCG switches to a negative voltage, the current I flowing in the bit line BL rises temporarily, then falls, and then rises again.

The current I flowing in the bit line BL rises temporarily, supposedly because the channel resistance of the cock gate transistor drops with a decrease in the electrostatic potential of the fluid layer facing the cock gate electrode CG. That is, the current I flowing in the bit line BL rises temporarily, supposedly because the ionic current flowing in the cock gate transistor increases with a decrease in the channel resistance.

The current I flowing in the bit line BL decreases after that, supposedly because the charged particle passes through the channel of the cock gate transistor having a small cross-sectional area in the fluid layer. That is, the current I flowing in the bit line BL decreases, supposedly because the ionic current flowing in the cock gate transistor decreases, being hindered by the charged particle.

The current I flowing in the bit line BL is monitored, and the change in the current I is detected. Thus, the data "1" stored in the first memory cell MC1 can be read out.

After the data in the first memory cell MC1 is read out, the first memory cell MC1 is maintained in a data "0" state, the second memory cell MC2 is maintained in a data "1" state, and the third memory cell MC3 is maintained in a data "0" state.

Next, reading of the data "0" stored in the second memory cell MC2 in the initial state is described. After the data in the first memory cell MC1 is read out, the data "0" stored in the second memory cell MC2 is transferred to the first memory cell MC1.

Figure 10A:
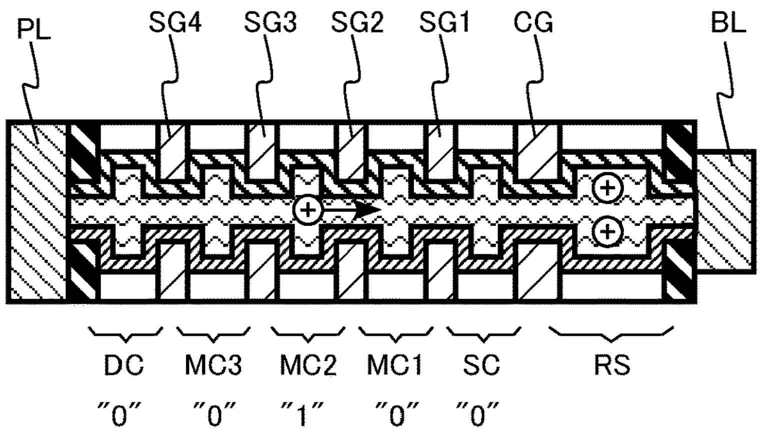
FIGS. 10A, 10B, and 10C are diagrams for explaining a read operation of the storage device of the first embodiment.
Figure 10B:
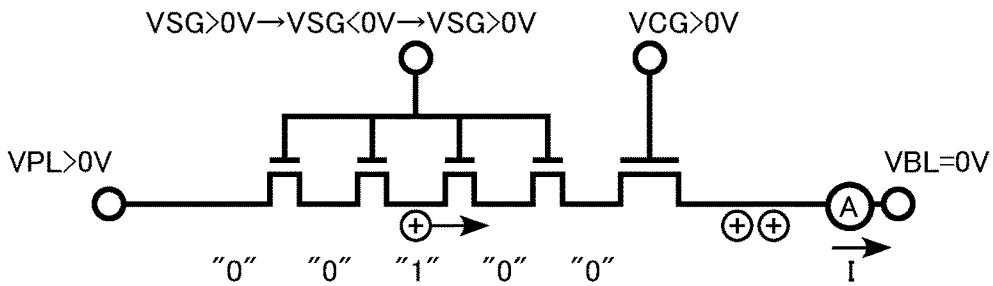
Figure 10C:
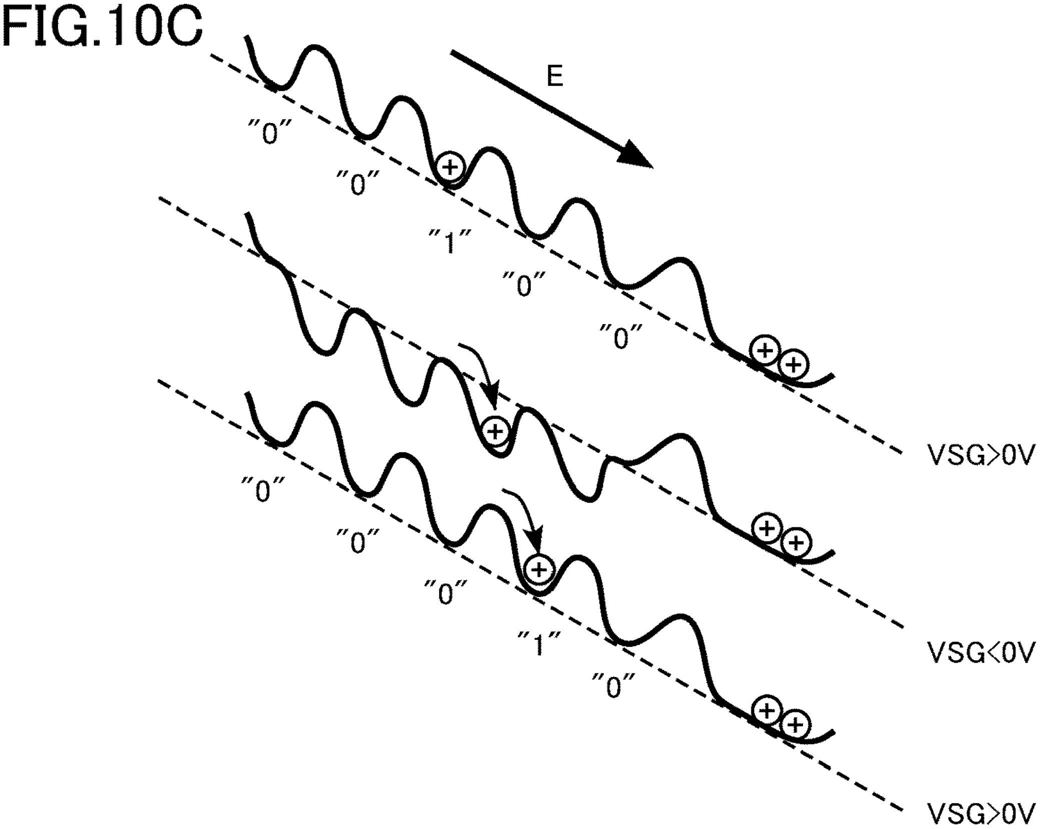

As shown in FIG. 10B, the bit line voltage VBL is set to 0 V, the plate voltage VPL is set to a positive voltage, and the cock gate voltage VCG is set to a positive voltage. The storage gate voltage VSG is changed from a positive voltage to a negative voltage, or from a negative voltage to a positive voltage.

As the storage gate voltage VSG is changed from a positive voltage to a negative voltage, or from a negative voltage to a positive voltage, the charged particles move toward the bit line BL and move into the respective adjacent cells. The charged particles move into the adjacent cells located on the side of the bit line BL, and the data is transferred. For example, the charged particle existing in the second memory cell MC2 moves into the first memory cell MC1. The data in the first memory cell MC1 becomes data "1". Also, the data "0" in the first memory cell MC1 is transferred to the standby cell SC, and the standby cell SC enters a "0" state.

Because of the data transfer, the first memory cell MC1 enters a data "1" state, the second memory cell MC2 enters a data "0" state, and the third memory cell MC3 enters a data "0" state.

The data “0” stored in the second memory cell MC2 in the initial state is transferred to the standby cell SC, and the standby cell SC enters a “0” state.

Figure 11A:
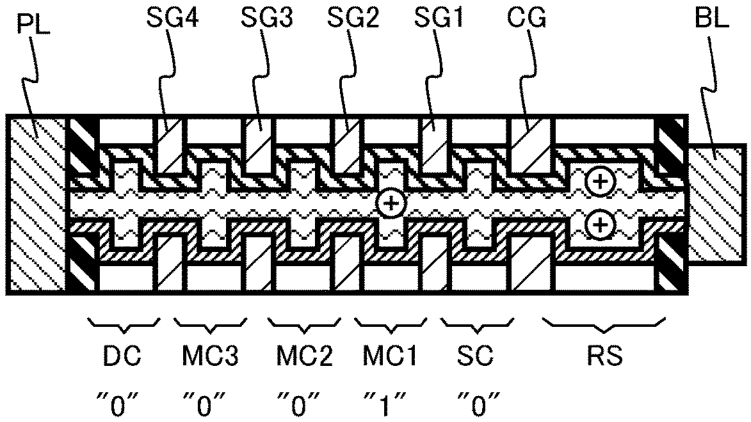
FIGS. 11A, 11B, and 11C are diagrams for explaining a read operation of the storage device of the first embodiment.
Figure 11B:
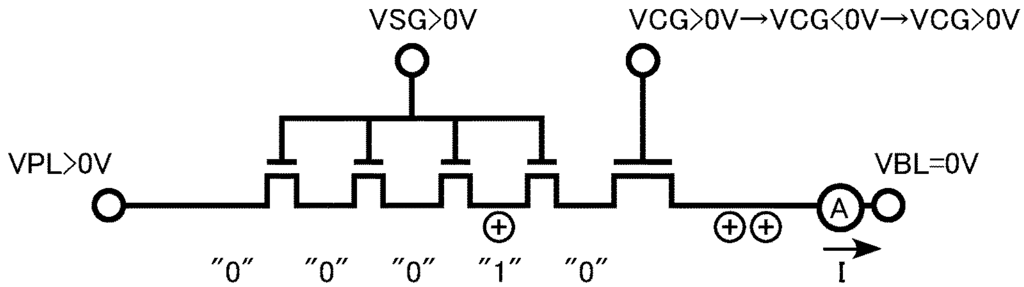

Next, as shown in FIG. 11B, the bit line voltage VBL is set to 0 V, the plate voltage VPL is set to a positive voltage, and the storage gate voltage VSG is set to a positive voltage. The cock gate voltage VCG is changed from a positive voltage to a negative voltage, or from a negative voltage to a positive voltage.

When the cock gate voltage VCG is a positive voltage, movement of the charged particles is restricted. When the cock gate voltage VCG switches to a negative voltage, the data “0” in the standby cell SC is transferred toward the bit line BL.

When the cock gate voltage VCG switches to a positive voltage, the electrostatic potential of the fluid layer facing the cock gate electrode CG rises. Therefore, the charged particle is kept in the reservoir RS.

Figure 11C:
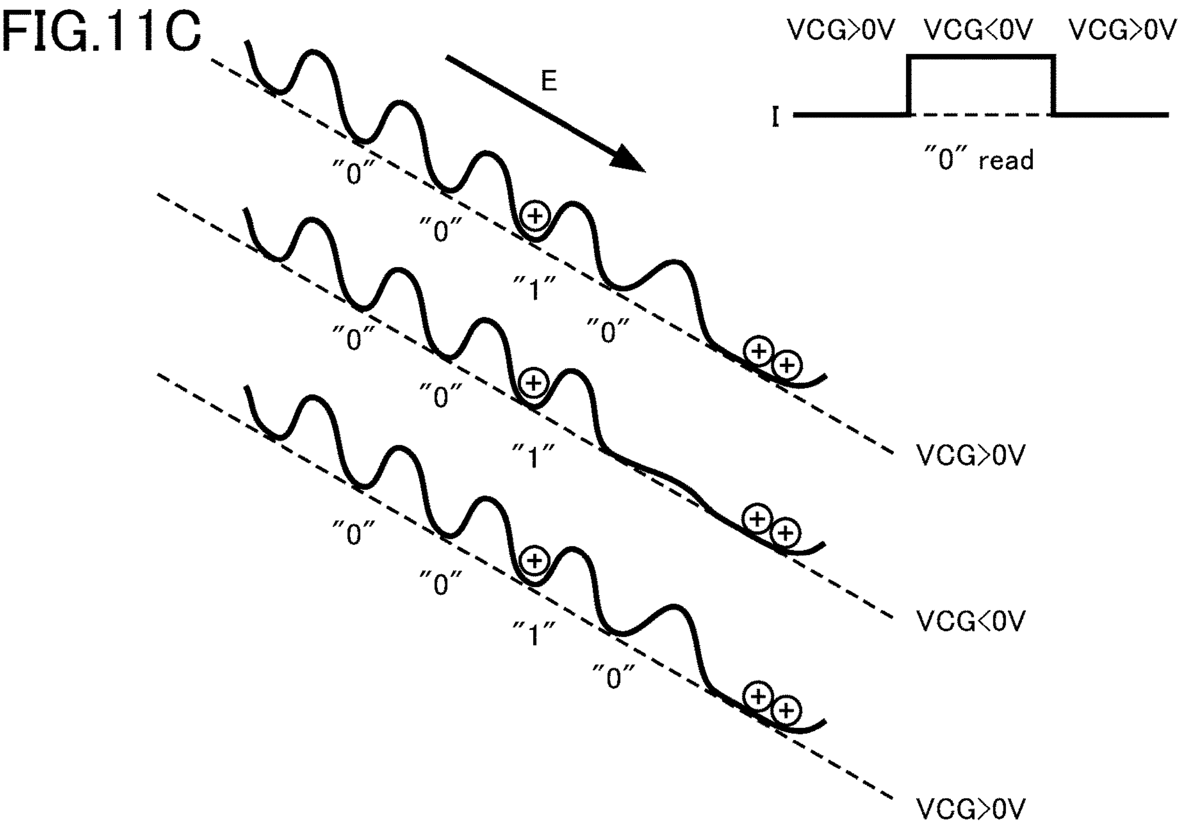

As indicated by the current waveforms of FIG. 11C, when the cock gate voltage VCG switches to a negative voltage, the current I flowing in the bit line BL rises temporarily. After that, the current I flowing in the bit line BL does not change and remains constant until the cock gate voltage VCG switches back to a positive voltage.

The current I flowing in the bit line BL rises temporarily, supposedly because the channel resistance of the cock gate transistor drops with a decrease in the electrostatic potential of the fluid layer facing the cock gate electrode CG. That is, the current I flowing in the bit line BL rises temporarily, supposedly because the ionic current flowing in the cock gate transistor increases with a decrease in the channel resistance.

Since any charged particle does not exist in the standby cell SC, charged particles do not pass through the channel of the cock gate transistor. Therefore, the ionic current flowing in the cock gate transistor does not change. Accordingly, the current I flowing in the bit line BL does not change either.

The current I flowing in the bit line BL is monitored, and no changes in the current I are detected as above, so that the data “0” stored in the second memory cell MC2 can be read out.

After the data in the second memory cell MC2 is read out, the first memory cell MC1 is maintained in a data “1” state, the second memory cell MC2 is maintained in a data “0” state, and the third memory cell MC3 is maintained in a data “0” state.

After that, the same read operation as described above with reference to FIGS. 8A, 8B, 8C, 9A, 9B, 9C, 10A, 10B, 10C, 11A, 11B, and 11C is performed. By this read operation, the data “1” stored in the third memory cell MC3 in the initial state can be read out.

After the data in the third memory cell MC3 is read out, the first memory cell MC1 is maintained in a data “0” state, the second memory cell MC2 is maintained in a data “0” state, and the third memory cell MC3 is maintained in a data “0” state. The standby cell SC and the dummy cell DC are in the state corresponding to data “0”. In the reservoir RS at this point, three charged particles are stored.

Next, a write operation of the nonvolatile memory 100 is described.

Figure 12A:
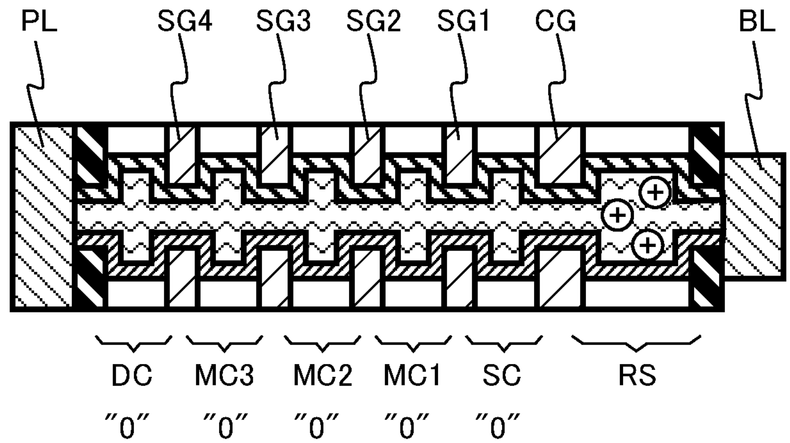
FIGS. 12A, 12B, and 12C are diagrams for explaining a data holding state of the storage device of the first embodiment.
Figure 12B:
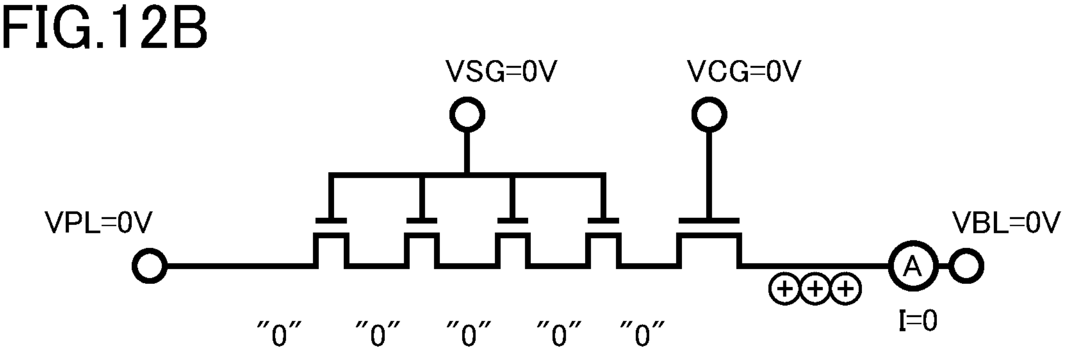
Figure 12C:
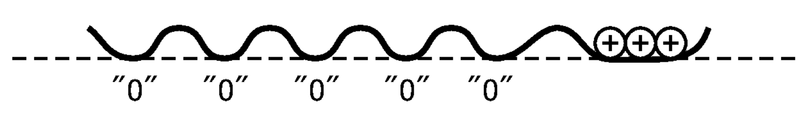

FIGS. 12A, 12B, and 12C are diagrams for explaining a data holding state of the storage device of the first embodiment. FIG. 12A is a schematic diagram of one memory bottle MB. FIG. 12B is an equivalent circuit diagram of the one memory bottle MB. FIG. 12C is a diagram showing the electrostatic potential distribution in the fluid layer in the memory bottle MB.

FIGS. 12A, 12B, and 12C show the data holding state after all the data in the memory bottle MB is read out. In the data holding state before data is written into the memory cell MC, the bit line voltage VBL is 0 V, the plate voltage VPL is 0 V, the cock gate voltage VCG is 0 V, and the storage gate voltage VSG is 0 V. No voltage is applied between the bit line BL and the plate electrode PL.

The first memory cell MC1 is maintained in a data “0” state, the second memory cell MC2 is maintained in a data “0” state, and the third memory cell MC3 is maintained in a data “0” state. The standby cell SC and the dummy cell DC are in the state corresponding to data “0”. In the reservoir RS at this point, three charged particles are stored.

Figure 13A:
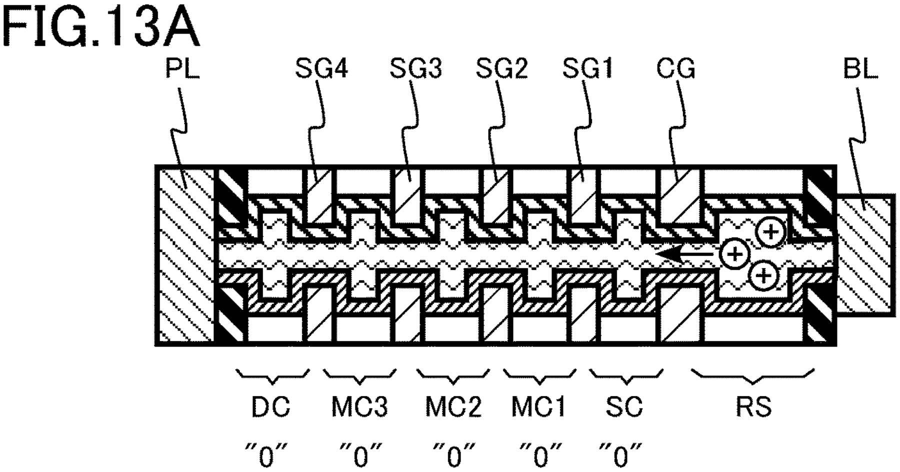
FIGS. 13A, 13B, and 13C are diagrams for explaining a write operation of the storage device of the first embodiment.
Figure 13B:
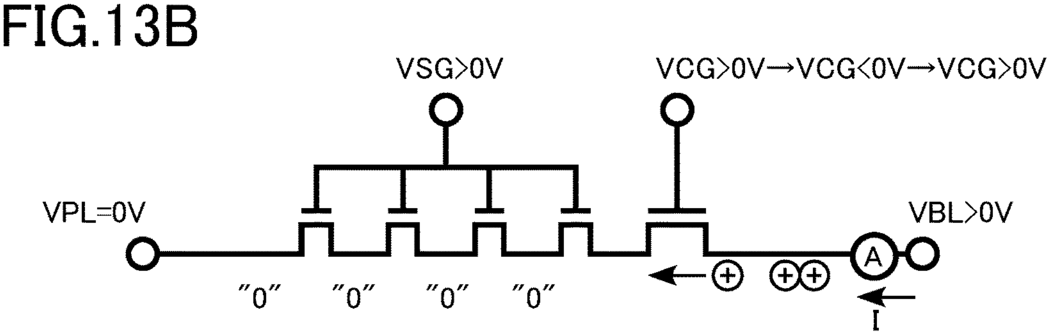
Figure 13C:
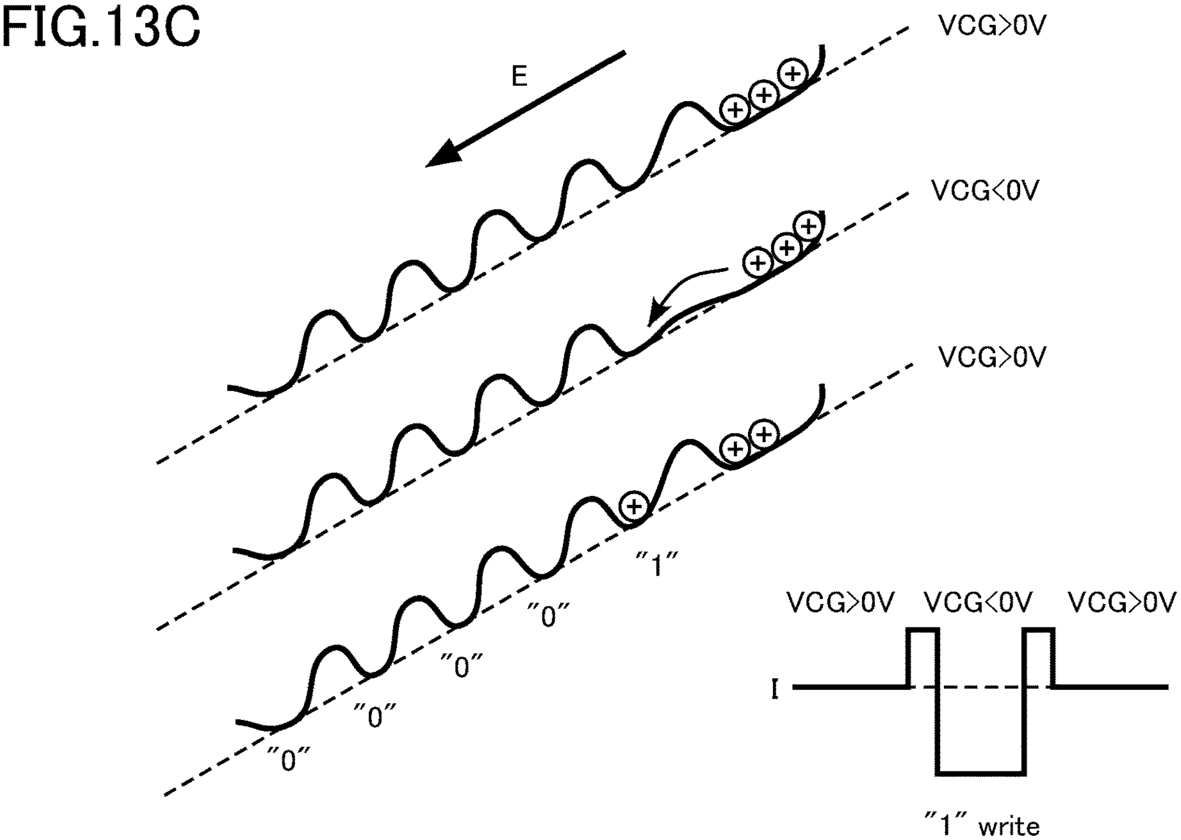
Figure 14A:
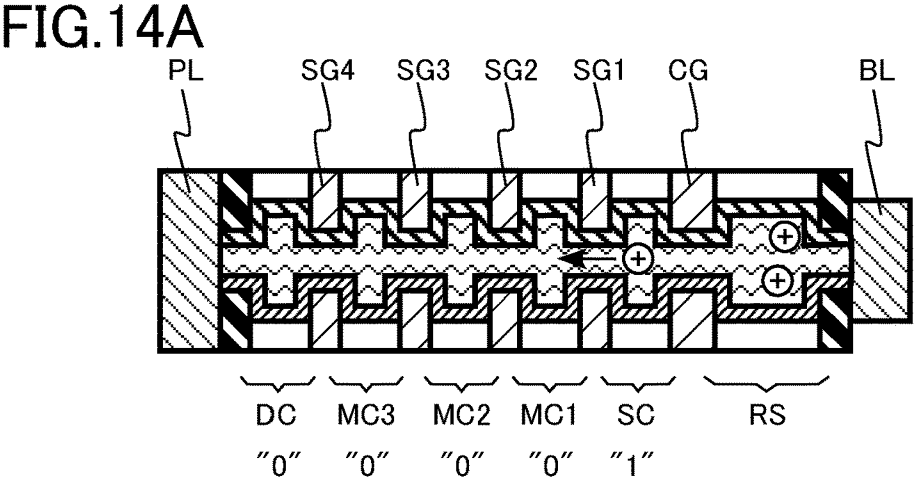
FIGS. 14A, 14B, and 14C are diagrams for explaining a write operation of the storage device of the first embodiment.
Figure 14B:
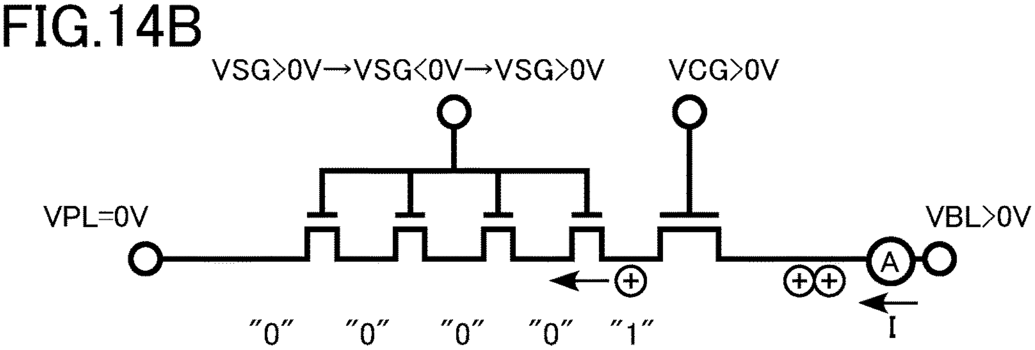
Figure 14C:
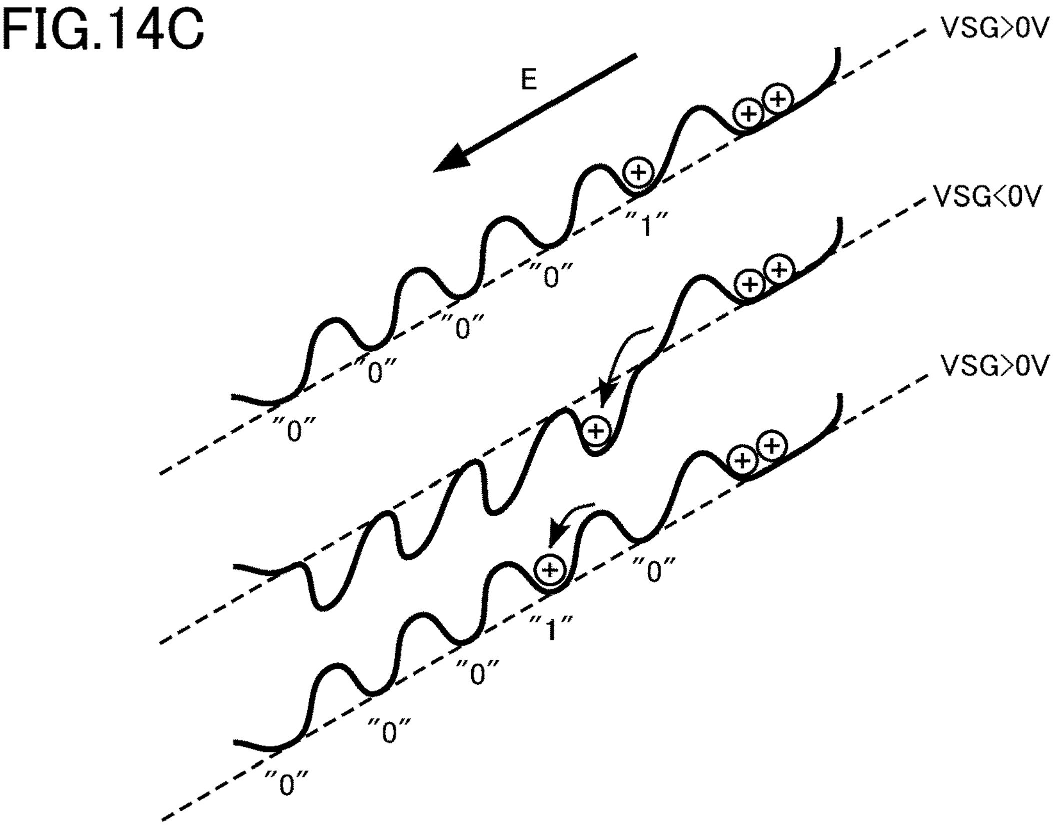
Figure 15A:
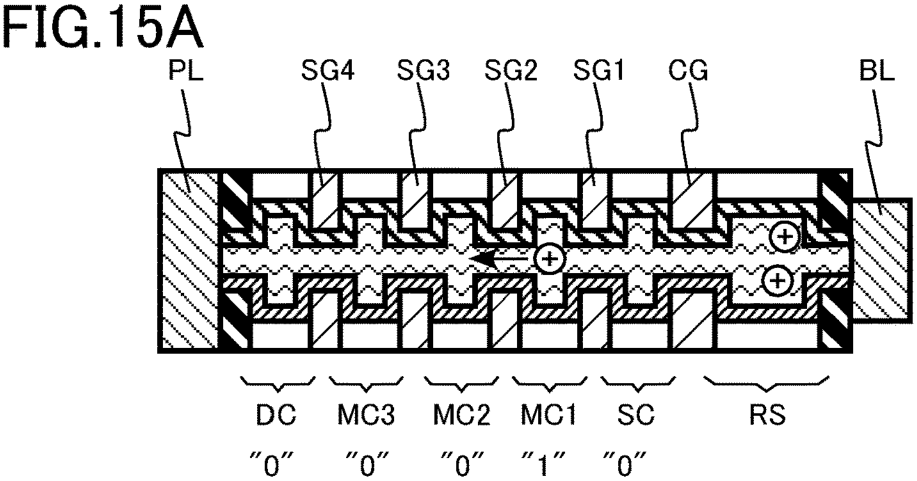
FIGS. 15A, 15B, and 15C are diagrams for explaining a write operation of the storage device of the first embodiment.
Figure 15B:
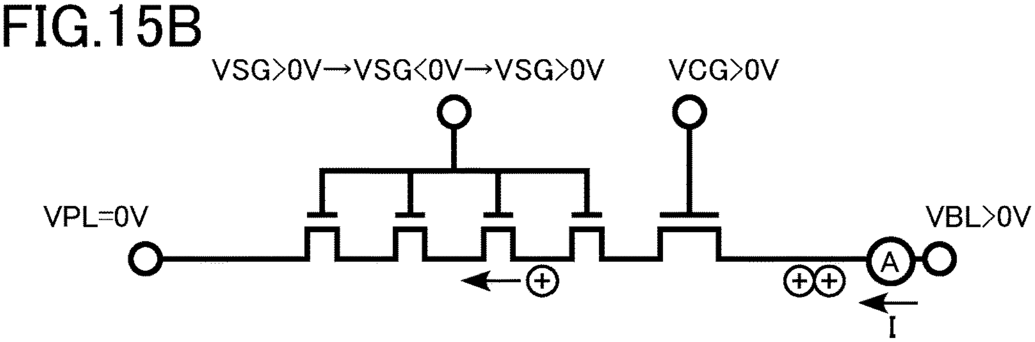
Figure 15C:
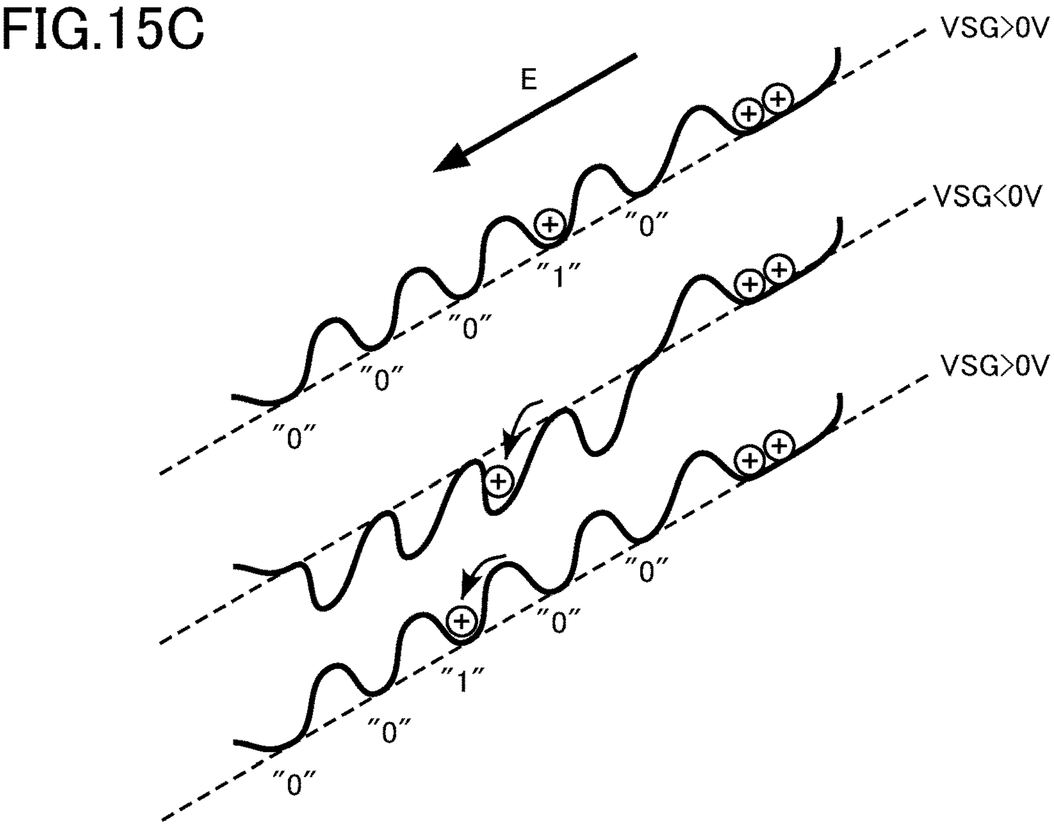

FIGS. 13A, 13B, 13C, 14A, 14B, 14C, 15A, 15B, and 15C are diagrams for explaining a write operation of the storage device of the first embodiment. FIGS. 13A, 14A, and 15A are schematic views of one memory bottle MB. FIGS. 13B, 14B, and 15B are equivalent circuit diagrams of the one memory bottle MB. FIGS. 13C, 14C, and 15C are diagrams showing the electrostatic potential distribution in the fluid layer in the memory bottle MB.

In the nonvolatile memory 100, the charged particles stored in the reservoir RS are moved to the first memory cell MC1, the second memory cell MC2, and the third memory cell MC3, so that data is written.

Writing of data “1” is first described.

First, as shown in FIG. 13B, the bit line voltage VBL is set to a positive voltage, the plate voltage VPL is set to 0 V, and the storage gate voltage VSG is set to a positive voltage. The cock gate voltage VCG is changed from a positive voltage to a negative voltage, or from a negative voltage to a positive voltage.

The magnitudes and the timings of the bit line voltage VBL, the plate voltage VPL, the cock gate voltage VCG, and the storage gate voltage VSG are controlled by the central control circuit 107.

As shown in FIG. 13C, the bit line voltage VBL is set to a positive voltage, and the plate voltage VPL is set to 0 V, so that an electric field E is induced in the direction from the bit line BL toward the plate electrode PL. Because of this electric field E, an ionic current from the bit line BL toward the plate electrode PL flows in the fluid layer.

When the cock gate voltage VCG is a positive voltage, the energy barrier between the standby cell SC and the reservoir RS is high. Therefore, when the electric field E is applied, charged particle movement is restricted.

When the cock gate voltage VCG switches to a negative voltage, the electrostatic potential of the fluid layer facing the cock gate electrode CG drops. Therefore, a charged particle in the reservoir RS moves toward the plate electrode PL, and moves into the standby cell SC.

When the cock gate voltage VCG switches to a positive voltage, the electrostatic potential of the fluid layer facing the cock gate electrode CG rises. Therefore, movement of the remaining charged particles in the reservoir RS to the standby cell SC is restricted.

While the cock gate voltage VCG is a negative voltage, the current I flowing in the bit line BL is monitored. For example, as indicated by the current waveforms in FIG. 13C, a pulse-type decrease in the current I is detected. Thus, it is possible to detect that one charged particle has passed through the cock gate and moved from the reservoir RS to the standby cell SC. After one charged particle having passed through the cock gate is detected, the cock gate voltage VCG is switched to a positive voltage before the next charged particle passes through the cock gate. Thus, it is possible to prevent two charged particles from passing through the cock gate.

The current I flowing in the bit line BL is monitored in this manner, so that the number of charged particles passing through the cock gate is counted.

In the nonvolatile memory 100, the central control circuit 107 controls the voltage to be applied to the bit line BL, the voltage to be applied to the plate electrode PL, and the voltage to be applied to the cock gate electrode CG, to control the number of charged particles moving between the reservoir RS and the standby cell SC to be a desired number. For example, the number of charged particles moving from the reservoir RS to the standby cell SC is controlled to be a desired number. The central control circuit 107 controls the number of charged particles moving from the reservoir RS to the standby cell SC to be a desired number, on the basis of the current I flowing in the bit line BL, for example.

In the above manner, one charged particle moves from the reservoir RS to the standby cell SC. The standby cell SC enters a state corresponding to data "1".

As shown in FIG. 14B, the bit line voltage VBL is then set to a positive voltage, the plate voltage VPL is set to 0 V, and the cock gate voltage VCG is set to a positive voltage. The storage gate voltage VSG is changed from a positive voltage to a negative voltage, or from a negative voltage to a positive voltage.

When the storage gate voltage VSG is a positive voltage, the energy barriers between the respective cells are high. Therefore, when the electric field E is applied, charged particle movement is restricted.

When the storage gate voltage VSG switches to a negative voltage, the electrostatic potential of the fluid layer facing the storage gate electrodes SG drops. Therefore, the charged particle existing in the standby cell SC moves to the electrostatic potential valley in the fluid layer facing the first storage gate electrode SG1.

When the storage gate voltage VSG switches to a positive voltage, the electrostatic potential of the fluid layer facing the storage gate electrodes SG rises. As a result, the charged particle existing in the standby cell SC moves into the first memory cell MC1. Thus, data "1" is written into the first memory cell MC1.

As the current I flowing in the bit line BL is monitored, and the change in the current I is detected as described above, data "1" can be written into the first memory cell MC1.

After data is written into the first memory cell MC1, the first memory cell MC1 is in a data "1" state, the second memory cell MC2 is in a data "0" state, and the third memory cell MC3 is in a data "0" state. No charged particles exist in the standby cell SC at this stage, and the standby cell SC is in a data "0" state.

Next, writing of data "0" is described.

As shown in FIG. 15B, the bit line voltage VBL is set to a positive voltage, the plate voltage VPL is set to 0 V, and the cock gate voltage VCG is set to a positive voltage. The storage gate voltage VSG is changed from a positive voltage to a negative voltage, or from a negative voltage to a positive voltage.

When the storage gate voltage VSG is a positive voltage, the energy barriers between the respective cells are high. Therefore, when the electric field E is applied, charged particle movement is restricted.

When the storage gate voltage VSG switches to a negative voltage, the electrostatic potential of the fluid layer facing the storage gate electrodes SG drops. Therefore, the charged particle existing in the first memory cell MC1 moves to the electrostatic potential valley in the fluid layer facing the second storage gate electrode SG2.

When the storage gate voltage VSG switches to a positive voltage, the electrostatic potential of the fluid layer facing the storage gate electrodes SG rises. As a result, the charged particle existing in the first memory cell MC1 move into the second memory cell MC2. Thus, data "1" is written into the second memory cell MC2.

Since there are no charged particles existing in the standby cell SC, the first memory cell MC1 with no charged particles enters a data "0" state. In other words, data "0" is written into the first memory cell MC1.

After data is written into the first memory cell MC1, the first memory cell MC1 is in a data "0" state, the second memory cell MC2 is in a data "1" state, and the third memory cell MC3 is in a data "0" state. No charged particles exist in the standby cell SC at this stage, and the standby cell SC is in a data "0" state.

After that, the same write operation as described above with reference to FIGS. 13A, 13B, 13C, 14A, 14B, 14C, 15A, 15B, and 15C is performed. By this write operation, desired data can be written into the first memory cell MC1, the second memory cell MC2, and the third memory cell MC3.

For ease of explanation, an example case where the data that can be stored in one memory cell MC is one bit has been described. However, it is possible to make the data that can be stored in one memory cell MC multi-valued data, by causing one memory cell MC to store two or more charged particles.

In a case where data is to be erased, voltage application is performed so that the bit line voltage VBL is set to 0 V, and the plate voltage VPL is set to a positive voltage, for example. In this state, the storage gate voltage VSG and the cock gate voltage VCG are set to a negative voltage, so that all the charged particles are moved into the reservoir RS. As a result, the data in the first memory cell MC1, the data in the second memory cell MC2, and the data in the third memory cell MC3 are erased, and the first memory cell MC1, the second memory cell MC2, and the third memory cell MC3 all enter a data "0" state.

Next, an example method for manufacturing the storage device of the first embodiment is described. In the description below, an example method for manufacturing the memory cell array 101 of the nonvolatile memory 100 is explained.

FIGS. 16, 17, 18, 19, 20, 21, 22, 23, 24, 25, 26, and 27 are schematic cross-sectional diagrams illustrating a method for manufacturing the storage device of the first embodiment. FIGS. 16 to 27 each show a cross-section corresponding to FIG. 3.

First, the substrate insulating layer 12 is formed on the semiconductor substrate 10. The substrate insulating layer 12 is a silicon oxide layer, for example. The substrate insulating layer 12 is formed by chemical vapor deposition (CVD), for example.

The plate electrode PL is then formed on the substrate insulating layer 12. The plate electrode PL is made of tungsten, for example. The plate electrode PL is formed by CVD, for example.

A silicon nitride layer 50 is then formed on the plate electrode PL. The silicon nitride layer 50 is formed by CVD, for example. Part of the silicon nitride layer 50 eventually turns into the lower insulating layer 14.

Silicon oxide layers 52 and silicon nitride layers 54 are then alternately stacked. The silicon oxide layers 52 and the silicon nitride layers 54 are formed by CVD, for example. Part of the silicon oxide layers 52 eventually turns into the interlayer insulating layers 16.

Figure 16:
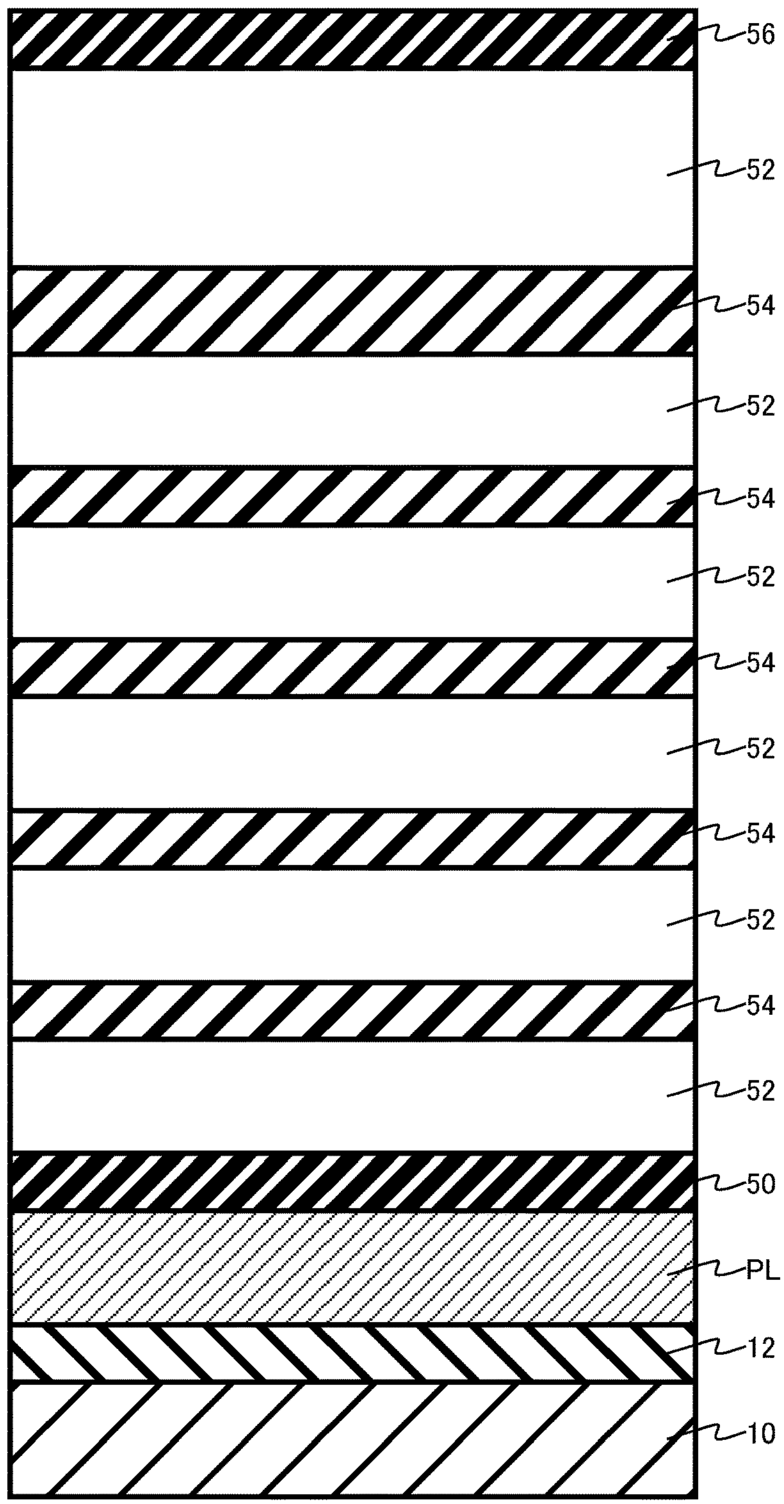
FIG. 16 is a schematic cross-sectional diagram illustrating a method for manufacturing the storage device of the first embodiment.

A silicon nitride layer 56 is then formed on the uppermost silicon oxide layer 52 (FIG. 16). The silicon nitride layer 56 is formed by CVD, for example. Part of the silicon nitride layer 56 eventually turns into the upper insulating layer 20.

Figure 17:
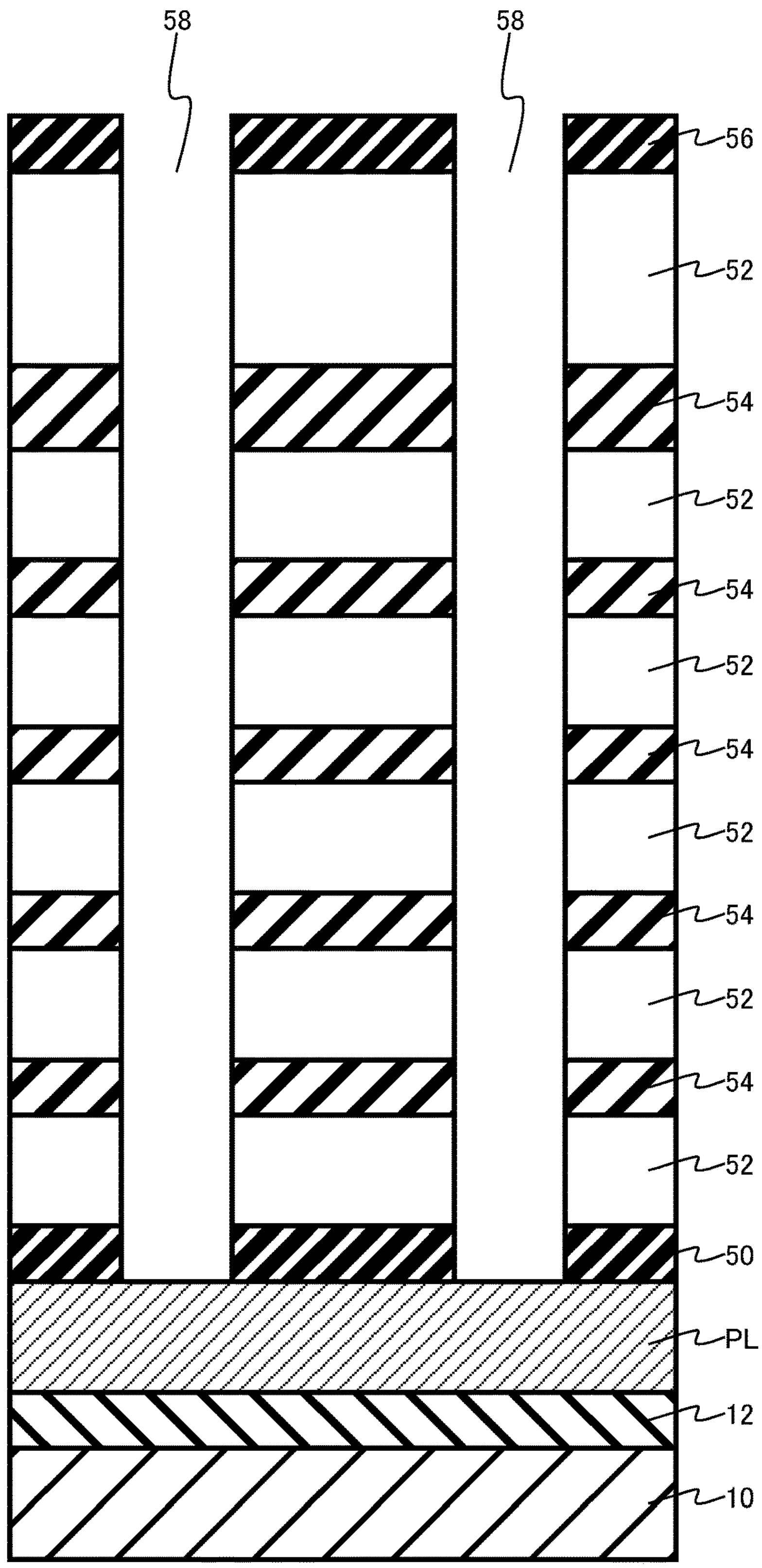
FIG. 17 is a schematic cross-sectional diagram illustrating a method for manufacturing the storage device of the first embodiment.

Openings 58 are then formed in the silicon nitride layer 56, the silicon oxide layers 52, the silicon nitride layers 54, and the silicon nitride layer 50 (FIG. 17). The openings 58 are formed by a lithographic technique and reactive ion etching (RIE), for example.

Figure 18:
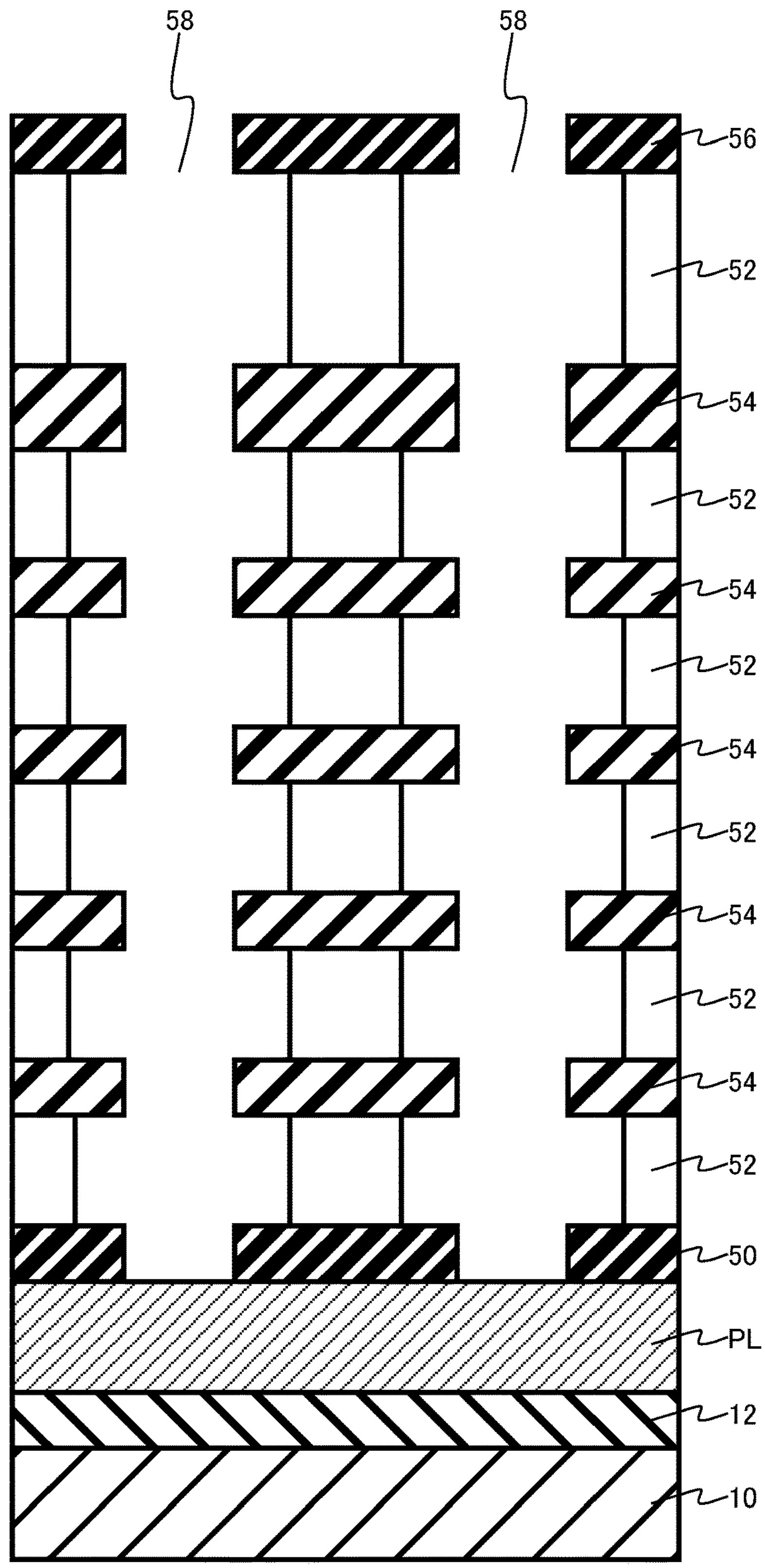
FIG. 18 is a schematic cross-sectional diagram illustrating a method for manufacturing the storage device of the first embodiment.

Etching is then performed on the silicon oxide layers 52 of the inner surfaces of the openings 58 (FIG. 18). The silicon oxide layers 52 of the inner surfaces of the openings 58 are retracted. The etching of the silicon oxide layers 52 is performed by wet etching, for example.

Figure 19:
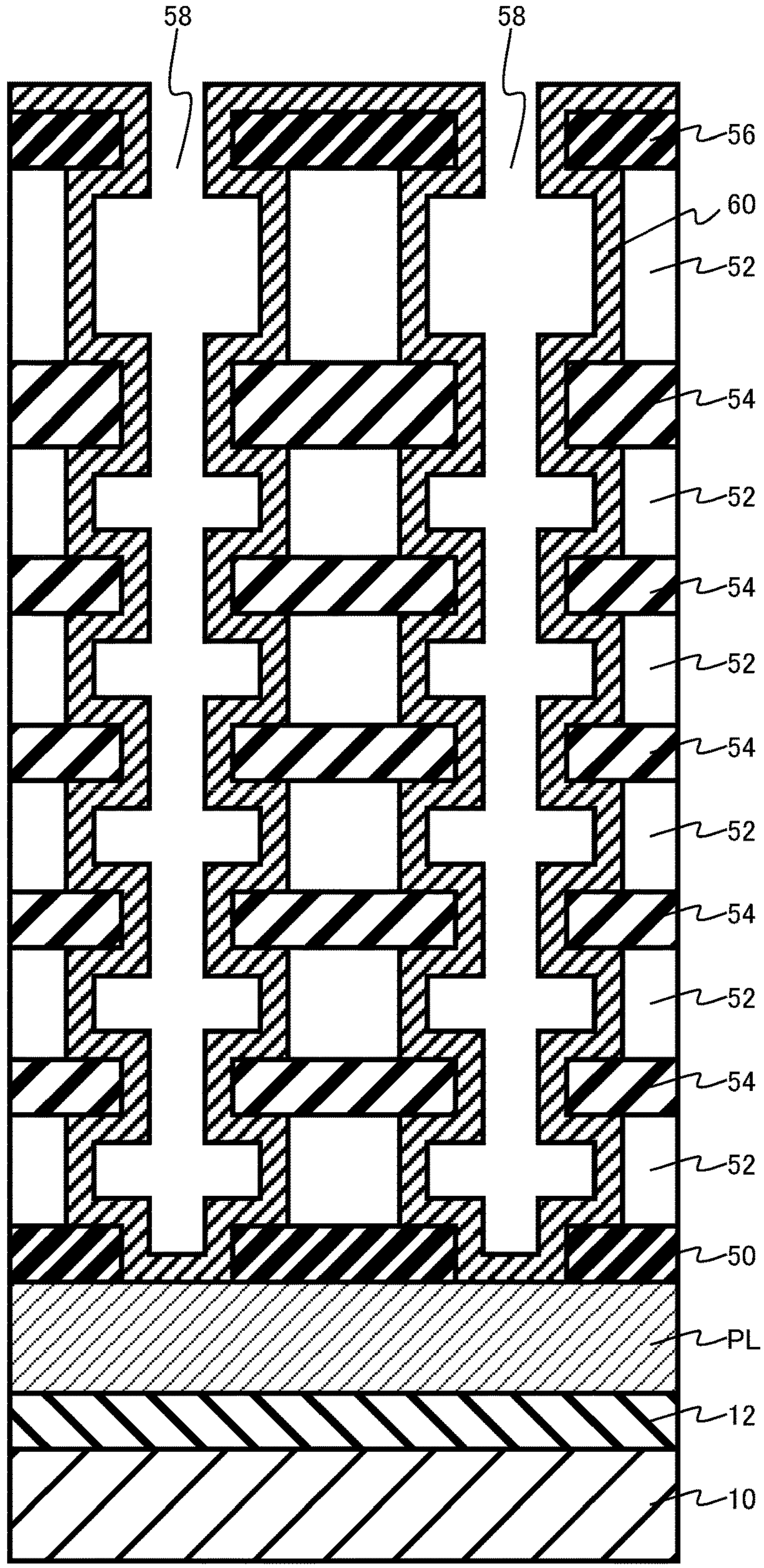
FIG. 19 is a schematic cross-sectional diagram illustrating a method for manufacturing the storage device of the first embodiment.

Aluminum oxide layers 60 are then formed on the inner surfaces of the openings 58 (FIG. 19). The aluminum oxide layers 60 are formed by atomic layer deposition (ALD), for example. Part of the aluminum oxide layers 60 eventually turns into the gate insulating film 18.

Figure 20:
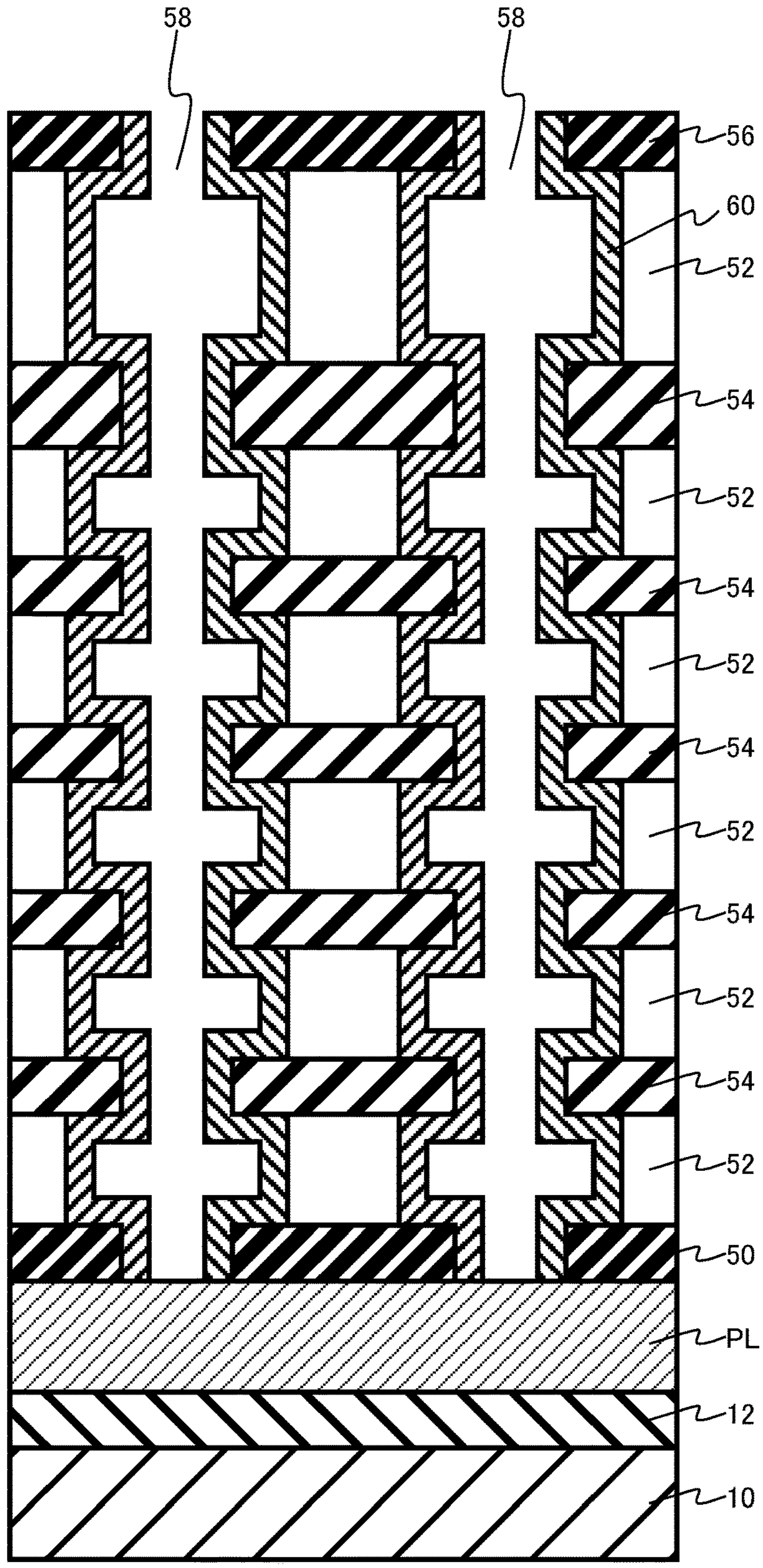
FIG. 20 is a schematic cross-sectional diagram illustrating a method for manufacturing the storage device of the first embodiment.

Etching is then performed on the aluminum oxide layers 60 at the bottoms of the openings 58 (FIG. 20). The plate electrode PL is exposed through the bottoms of the openings 58. The etching of the aluminum oxide layers 60 is performed by RIE, for example.

Amorphous silicon films 62 are then formed in the openings 58, to fill the openings 58. The amorphous silicon films 62 are formed by CVD, for example.

Figure 21:
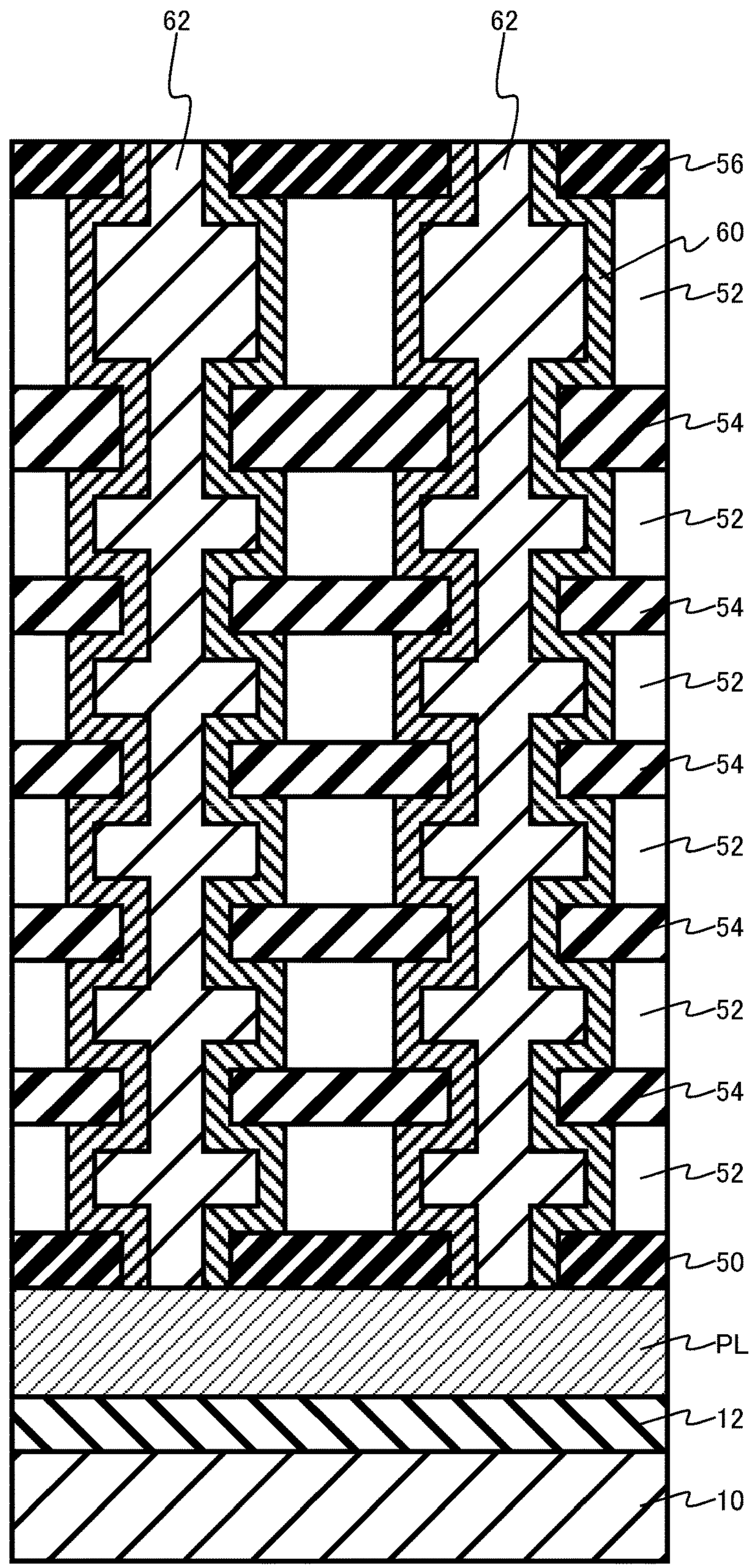
FIG. 21 is a schematic cross-sectional diagram illustrating a method for manufacturing the storage device of the first embodiment.

The amorphous silicon films 62 located on the silicon nitride layer 56 are then removed (FIG. 21). For the removal of the amorphous silicon films 62, chemical mechanical polishing (CMP) is used, for example.

Figure 22:
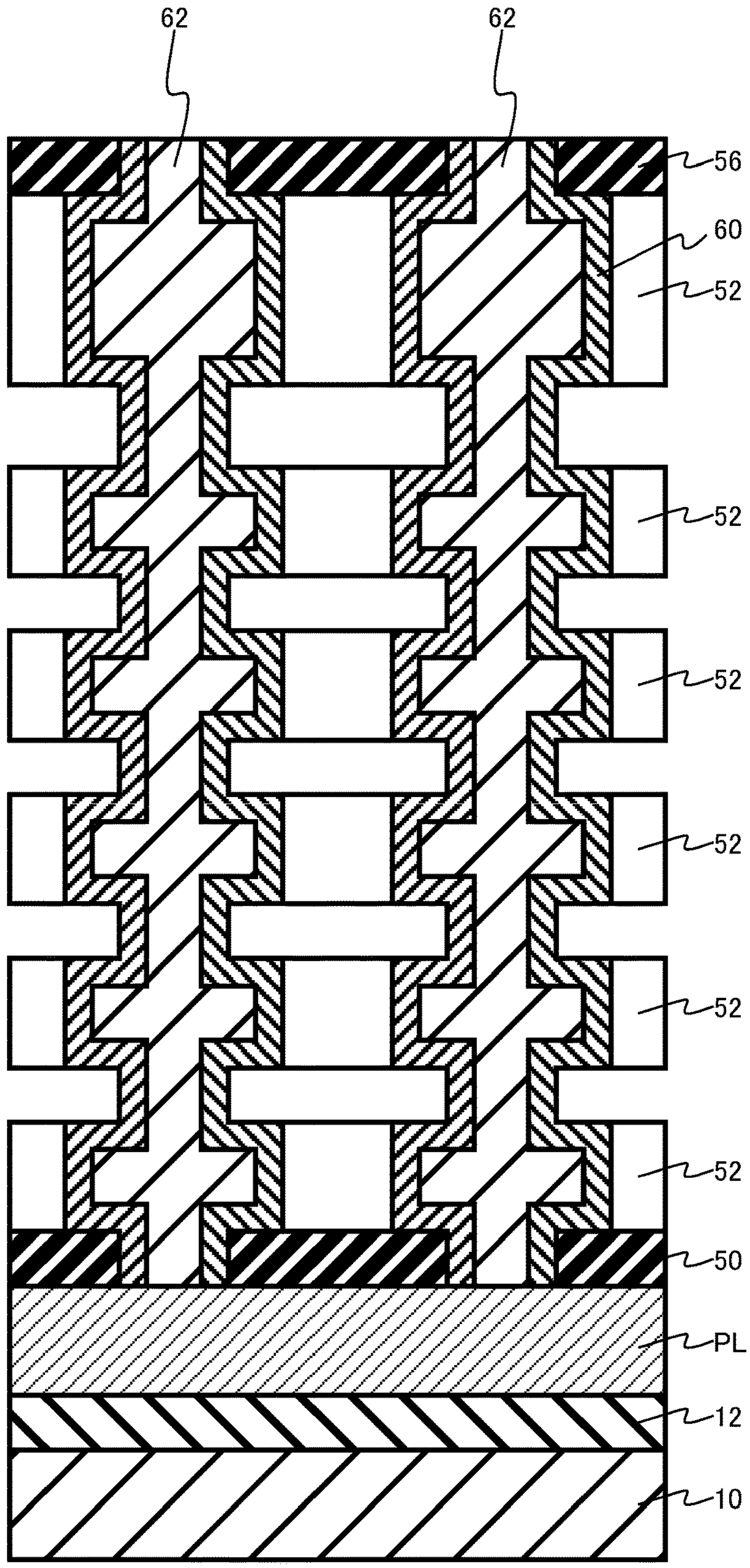
FIG. 22 is a schematic cross-sectional diagram illustrating a method for manufacturing the storage device of the first embodiment.

The silicon nitride layers 54 are then selectively removed by wet etching using grooves for etching (not shown) (FIG. 22). For the wet etching, a phosphoric acid solution is used, for example. Etching is performed selectively on the silicon nitride layers 54 with respect to the silicon oxide layers 52 and the aluminum oxide layers 60. For example, the grooves for etching are made shallower than the silicon nitride layer 50, so that no etching is performed on the silicon nitride layer 50 during the wet etching. Further, protective films are formed on the upper and side surfaces of the silicon nitride layer 56 before the wet etching, for example, so that no etching is performed on the silicon nitride layer 56.

Figure 23:
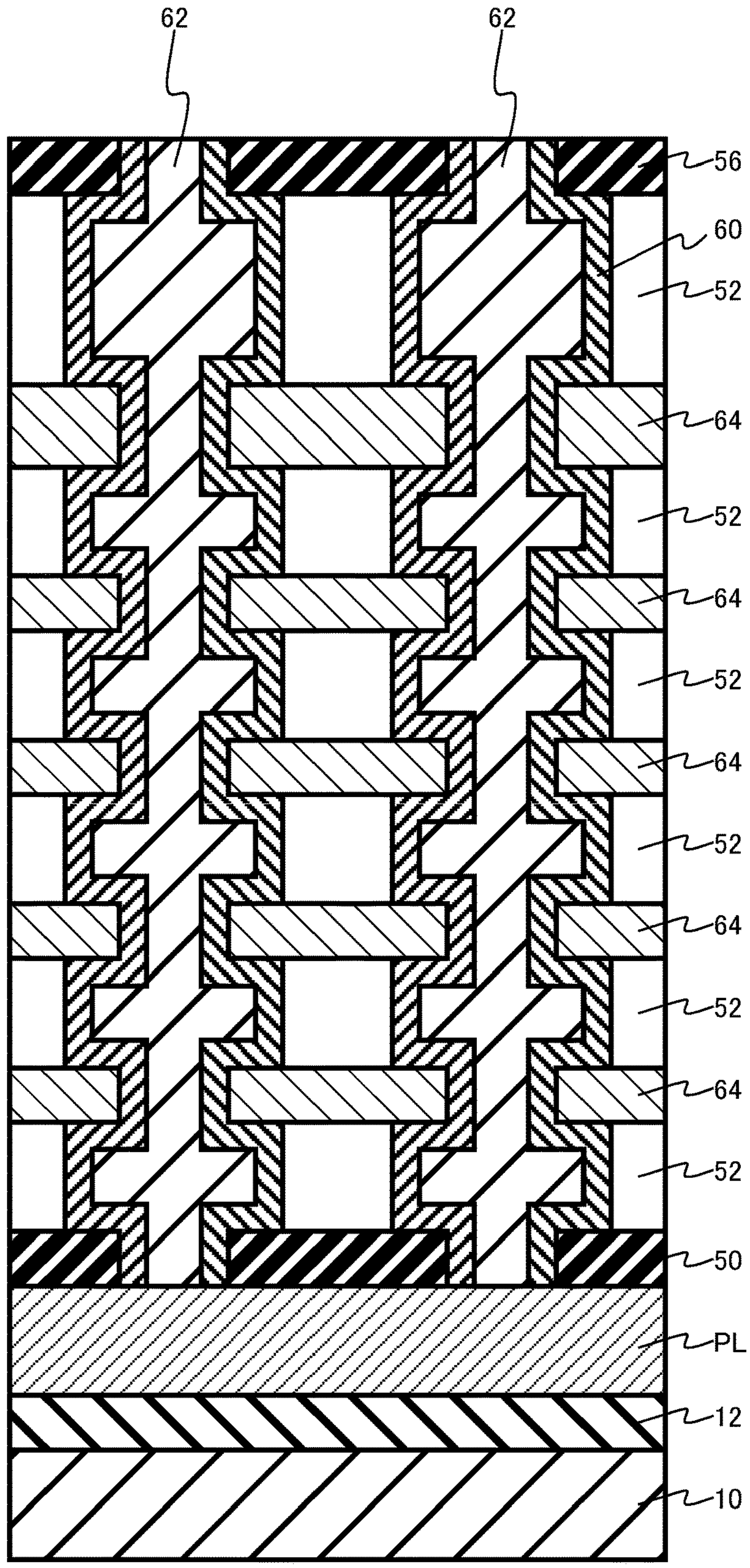
FIG. 23 is a schematic cross-sectional diagram illustrating a method for manufacturing the storage device of the first embodiment.

Metal films 64 are then formed (FIG. 23). The metal films 64 contain tungsten, for example. The metal films 64 are formed by CVD, for example. Part of the metal films 64 eventually turns into the storage gate electrodes SG and the cock gate electrode CG.

Figure 24:
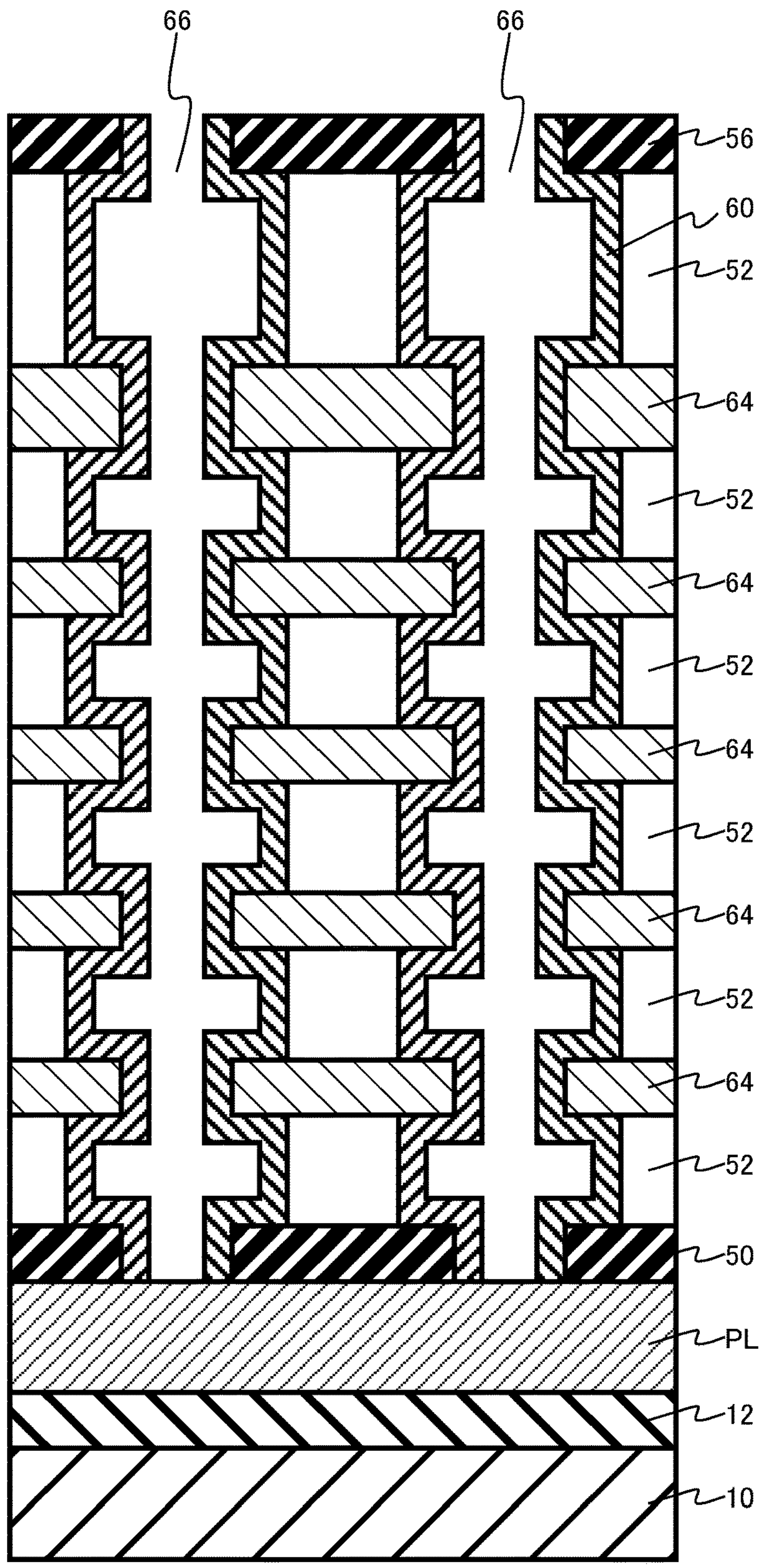
FIG. 24 is a schematic cross-sectional diagram illustrating a method for manufacturing the storage device of the first embodiment.

The amorphous silicon films 62 are then removed, to form openings 66 (FIG. 24). The amorphous silicon films 62 are removed by wet etching, for example.

Figure 25:
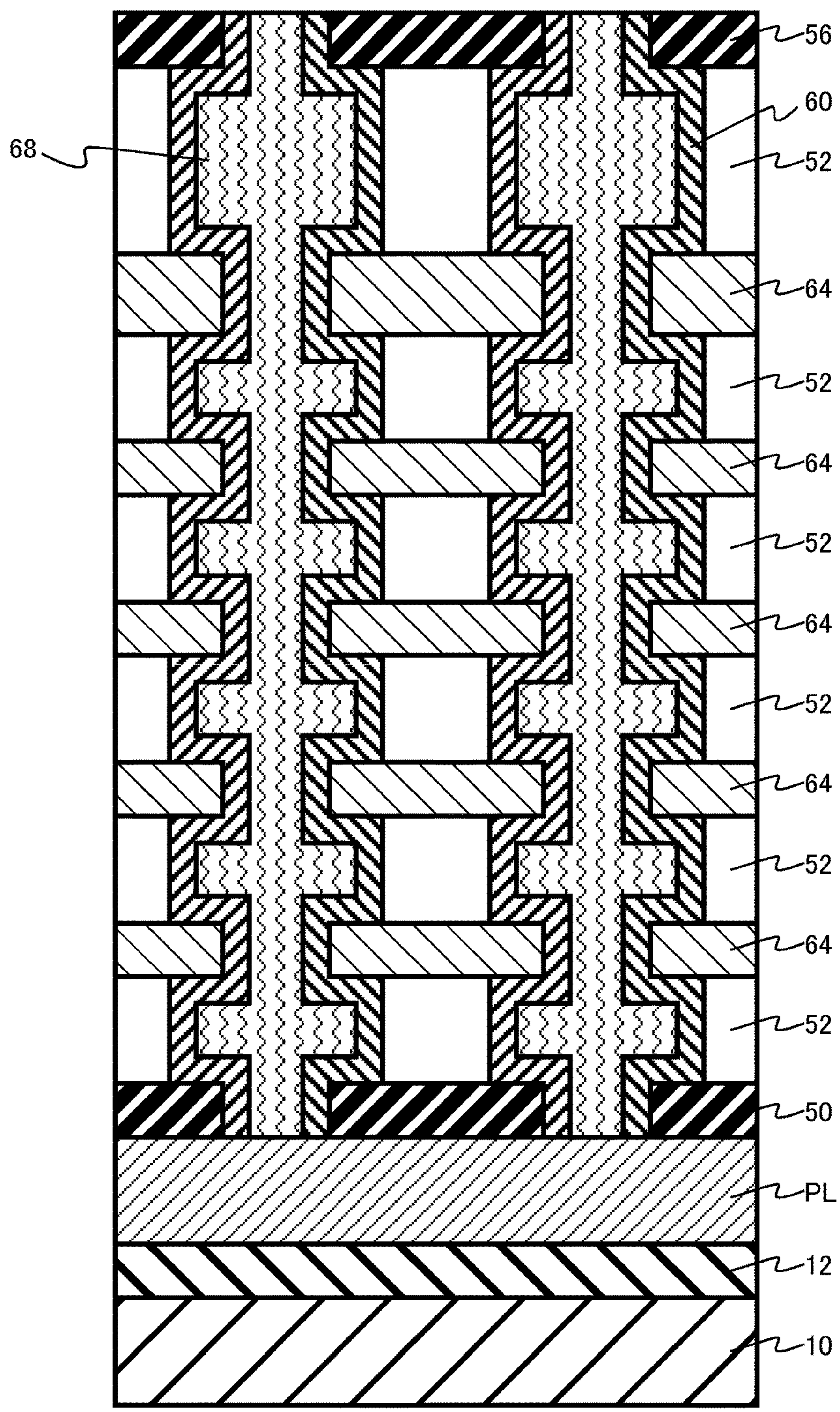
FIG. 25 is a schematic cross-sectional diagram illustrating a method for manufacturing the storage device of the first embodiment.

A liquid 68 is then injected into the openings 66 (FIG. 25). The liquid 68 is an ionic liquid, for example. The liquid 68 eventually turns into the fluid layer 22.

Figure 26:
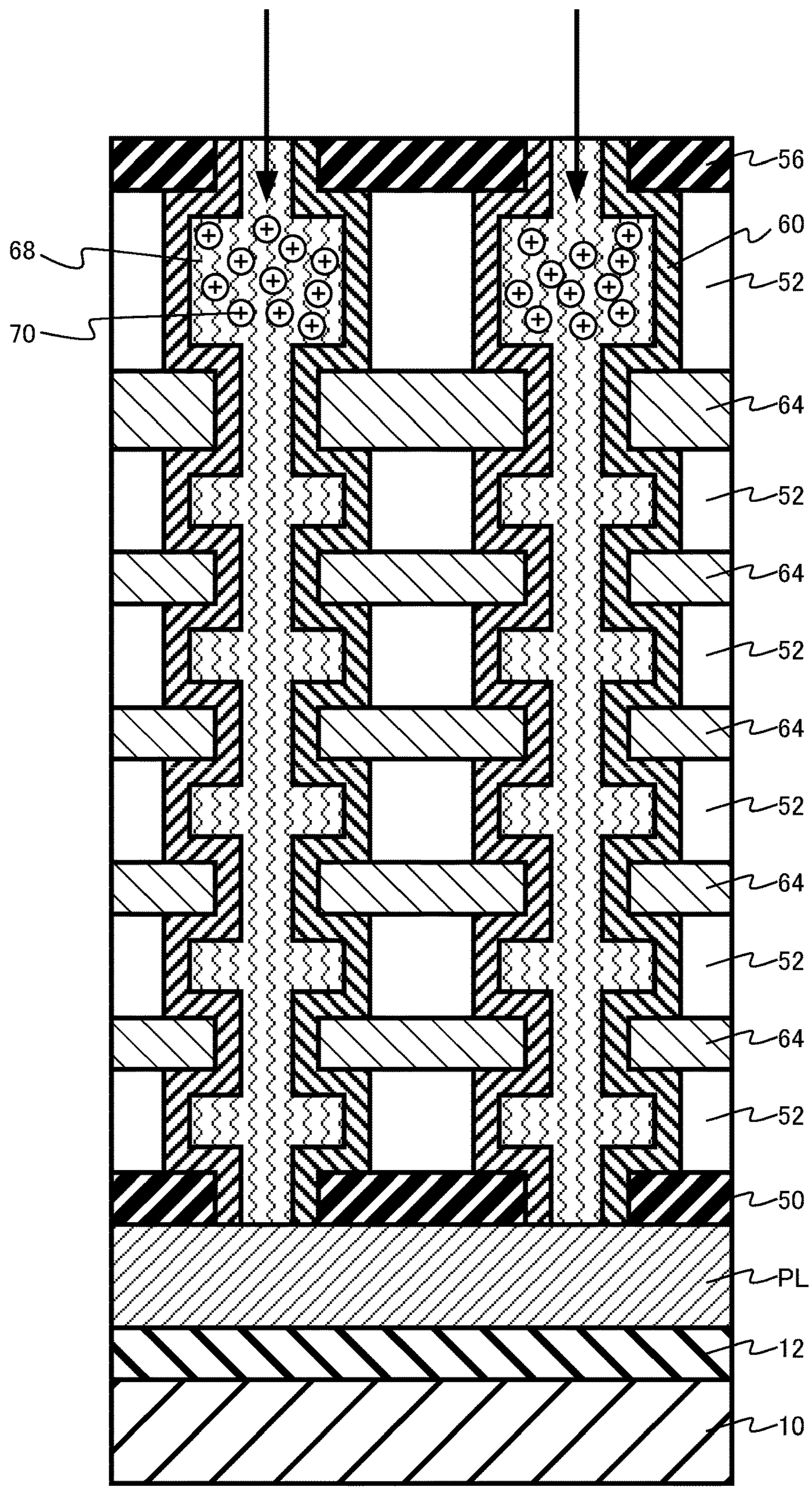
FIG. 26 is a schematic cross-sectional diagram illustrating a method for manufacturing the storage device of the first embodiment.

Particles 70 are then injected into the liquid 68 (FIG. 26). The particles 70 are metal nanoparticles, for example. The particles 70 are injected by a sputtering technique, for example. The particles 70 turn into positively charged particles in the liquid 68, for example. The particles 70 eventually turn into the charged particles 24.

Figure 27:
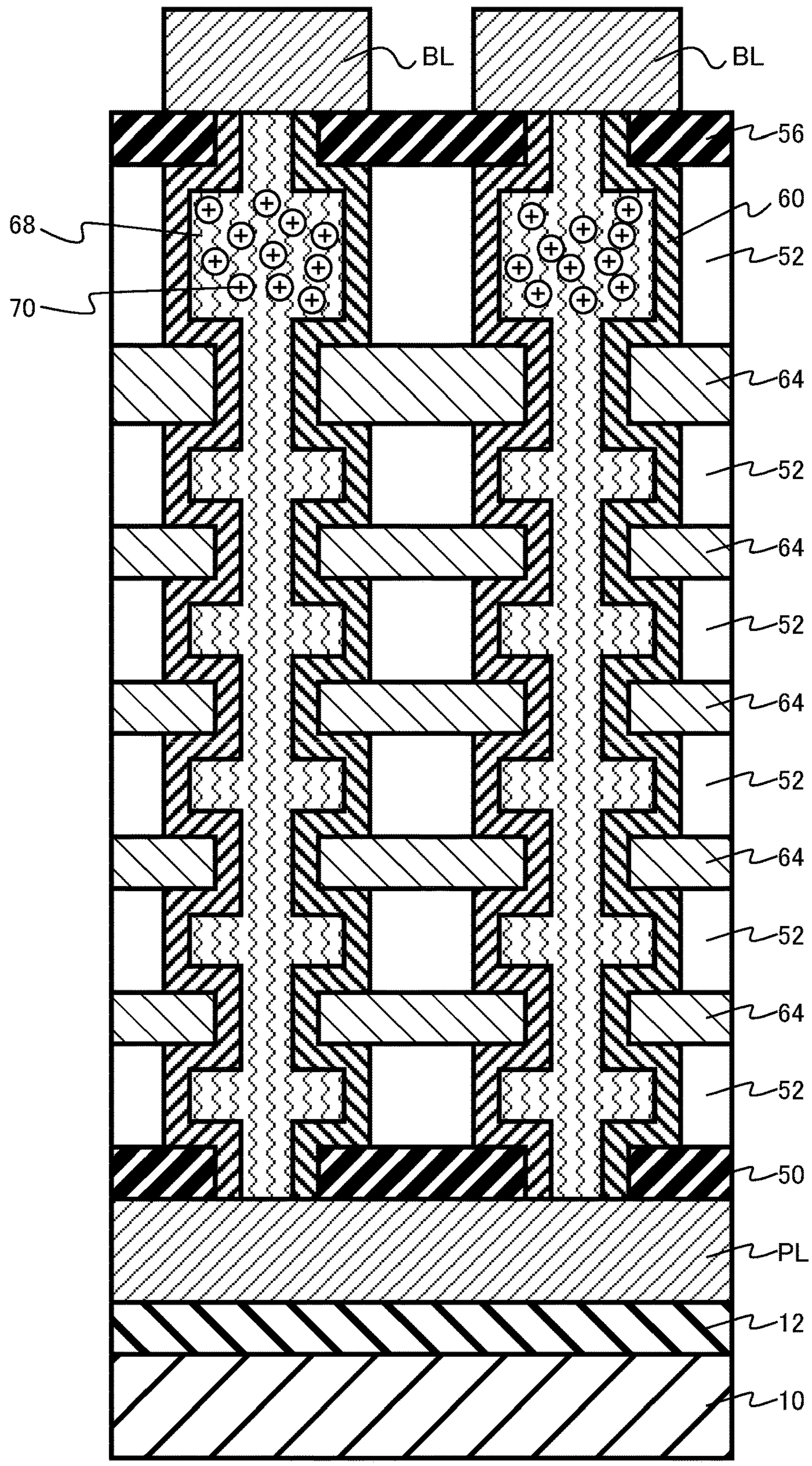
FIG. 27 is a schematic cross-sectional diagram illustrating a method for manufacturing the storage device of the first embodiment.

The bit lines BL are then formed on the liquid 68 (FIG. 27). The bit lines BL contain tungsten, for example. The bit lines BL are formed by CVD, a lithographic technique, and RIE, for example.

By the above manufacturing method, the memory cell array 101 of the nonvolatile memory 100 of the first embodiment is manufactured.

Next, the functions and the effects of the storage device of the first embodiment are described.

To increase the capacity of a nonvolatile memory, the memory cells are required to be three-dimensionally disposed. Also, to increase the capacity of a nonvolatile memory, the data stored in one memory cell is required to be multi-valued data.

In the nonvolatile memory 100 of the first embodiment, the memory cell array 101 includes a plurality of memory bottles MB in which a plurality of memory cells MC are connected in series. Accordingly, the memory cells MC are three-dimensionally disposed in the memory cell array 101. Thus, the capacity of the nonvolatile memory 100 can be increased.

Further, the data in the nonvolatile memory 100 of the first embodiment is based on the number of the charged particles 24 existing in the fluid layer 22 of the memory cells MC. Accordingly, the data to be stored in one memory cell MC can be easily made multi-valued data. Multi-valued data can also be stably read from a memory cell MC. Further, multi-valued data can be stably written into a memory cell MC.

The maximum number of charged particles 24 that can exist in one memory cell MC is $2^N$-1, for example. In this case, one memory cell MC can store N-bit data. For example, in a case where the maximum number of charged particles 24 that can exist in one memory cell MC is 255 ($2^8$-1), one memory cell MC can store 8-bit data.

The nonvolatile memory 100 of the first embodiment can increase the data to be stored in one memory cell MC by increasing the maximum number of charged particles 24 that can exist in one memory cell MC. Accordingly, the data to be stored in one memory cell MC can be easily made multi-valued data.

Further, in the nonvolatile memory 100 of the first embodiment, the data to be stored in a memory cell MC is based on the number of charged particles 24 in the memory cell MC. Accordingly, the data in the memory cells MC is completely digitized. The number of charged particles 24 passing through the cock transistor is then counted, so that the data stored in the memory cells MC is determined. Accordingly, the data read accuracy is high. Thus, multi-valued data can be stably read from the memory cells MC.

The nonvolatile memory 100 of the first embodiment then counts the number of charged particles 24 passing through the cock transistor, to write desired data into the memory cells MC. Accordingly, the data write accuracy is high. Thus, multi-valued data can be stably written into the memory cells MC.

The first cross-sectional area (S1 in FIG. 4A) of the fluid layer 22 in the first cross-section (the A-A' cross-section) perpendicular to the first direction, the first cross-section including the cock gate electrode CG is preferably smaller than the second cross-sectional area (S2 in FIG. 4B) of the fluid layer 22 in the second cross-section (the B-B' cross-section) perpendicular to the first direction, the second cross-section including the second interlayer insulating layer 16*b*. Also, the first cross-sectional area S1 is preferably equal to or smaller than one-fourth of the second cross-sectional area S2.

The first cross-sectional area S1 is preferably smaller than the third cross-sectional area (S3 in FIG. 5A) of the fluid layer 22 in the third cross-section (the C-C' cross-section) perpendicular to the first direction, the third cross-section including the third interlayer insulating layer 16*c*. Also, the first cross-sectional area S1 is preferably equal to or smaller than one-fourth of the third cross-sectional area S3.

As the first cross-sectional area S1 is made smaller, the channel region of the cock transistor becomes narrower. Accordingly, it becomes easier to allow the charged particles 24 to pass one by one. In this manner, the number of charged particles 24 passing through the cock transistor can be easily counted. Thus, the data read accuracy and write accuracy become higher.

Also, as the second cross-sectional area S2 is made larger, the volume of the fluid layer 22 of the standby cell SC can be increased. Thus, the maximum number of charged particles 24 that can exist in the standby cell SC can be made larger.

Further, as the third cross-sectional area S3 is made larger, the volume of the fluid layer 22 of each memory cell MC can be increased. Thus, the maximum number of charged particles 24 that can exist in the memory cells MC can be made larger.

The fourth cross-sectional area (S4 in FIG. 5B) of the fluid layer 22 in the fourth cross-section (the D-D' cross-section), perpendicular to the first direction, the fourth cross-section including the first storage gate electrode SG1 is preferably smaller than the second cross-sectional area S2. As the fourth cross-sectional area S4 is made smaller, the controllability of the storage transistor is improved. Thus, unintended movement of the charged particles 24 between the adjacent memory cells MC can be reduced.

The first cross-sectional area S1 is preferably smaller than the fourth cross-sectional area S4. As the first cross-sectional area S1 is made smaller, the channel region of the cock transistor becomes narrower, and the number of charged particles 24 passing through the cock transistor can be easily counted. Also, as the fourth cross-sectional area S4 is made larger, the channel region of each storage transistor becomes wider, and a decrease in the ionic current flowing between the bit lines BL and the plate electrode PL can be reduced.

The cock gate electrode CG preferably surrounds the fluid layer 22. The controllability of the cock transistor is improved. The storage gate electrodes SG preferably surround the fluid layer 22. The controllability of the storage transistors is improved.

The first length (L1 in FIG. 3) of the cock gate electrode CG in the first direction is preferably greater than the second length (L2 in FIG. 3) of the first storage gate electrode SG1 in the first direction. The first length L1 is preferably at least 1.5 times greater than the second length L2.

As the first length L1 is made greater, the controllability of the cock transistor is improved. Since the second length L2 is made shorter, the length of the memory cell array 101 in the first direction is shortened, and the capacity of the nonvolatile memory 100 can be easily increased.

The first distance in the first direction between the bit lines BL and the cock gate electrode CG (d1 in FIG. 3) is preferably greater than the second distance (d2 in FIG. 3) in the first distance between the cock gate electrode CG and the first storage gate electrode SG1. The first distance d1 is preferably at least twice the second distance d2.

Also, the first distance d1 is preferably greater than the third distance (d3 in FIG. 3) in the first direction between the first storage gate electrode SG1 and the second storage gate electrode SG2. The first distance d1 is preferably at least twice the third distance d3.

The reservoir RS is required to store a larger number of charged particles 24 than those in the standby cell SC and the memory cells MC. As the first distance d1 is made greater, the volume of the fluid layer 22 of the reservoir RS becomes larger. Thus, a larger number of charged particles 24 than that in the memory cells MC can be stored in the reservoir RS.

(Modification)

A storage device of a modification of the first embodiment differs from the storage device of the first embodiment in the method for counting the charged particles 24 passing through the cock transistor.

In the storage device of the modification of the first embodiment, the cock gate electrode CG has a first region and a second region that are electrically separated from each other, with the fluid layer 22 being interposed in between. When the charged particles 24 pass through the fluid layer 22 between the first region and the second region, the tunnel current flowing between the first region and the second region changes. Using the change in the tunnel current flowing between the first region and the second region, the storage device of the modification counts the number of charged particles 24 passing through the cock transistor.

As described above, according to the first embodiment and its modification, it is possible to obtain a storage device capable of storing multi-valued data into each one memory cell.

Second Embodiment

A storage device of a second embodiment includes a first conductive layer; a second conductive layer; a fluid layer provided between the first conductive layer and the second conductive layer; particles in the fluid layer; a first control electrode provided between the first conductive layer and the second conductive layer; a first insulating layer provided between the first conductive layer and the first control electrode, the first insulating layer surrounding the fluid layer; a second insulating layer provided between the first control electrode and the second conductive layer, the second insulating layer surrounding the fluid layer; and an insulator extending in a first direction from the first conductive layer toward the second conductive layer, and the insulator surrounded by the fluid layer and the second insulating layer. The storage device of the second embodiment differs from the storage device of the first embodiment in including the insulator that extends in the first direction from the first conductive layer toward the second conductive layer and is surrounded by the fluid layer and the second insulating layer. In the description below, part of the same contents as the first embodiment will not be repeated.

The storage device of the second embodiment is a nonvolatile memory in which memory cells are three-dimensionally disposed. In the nonvolatile memory, the memory cells store data, using charged particles in a fluid layer.

Figure 28:
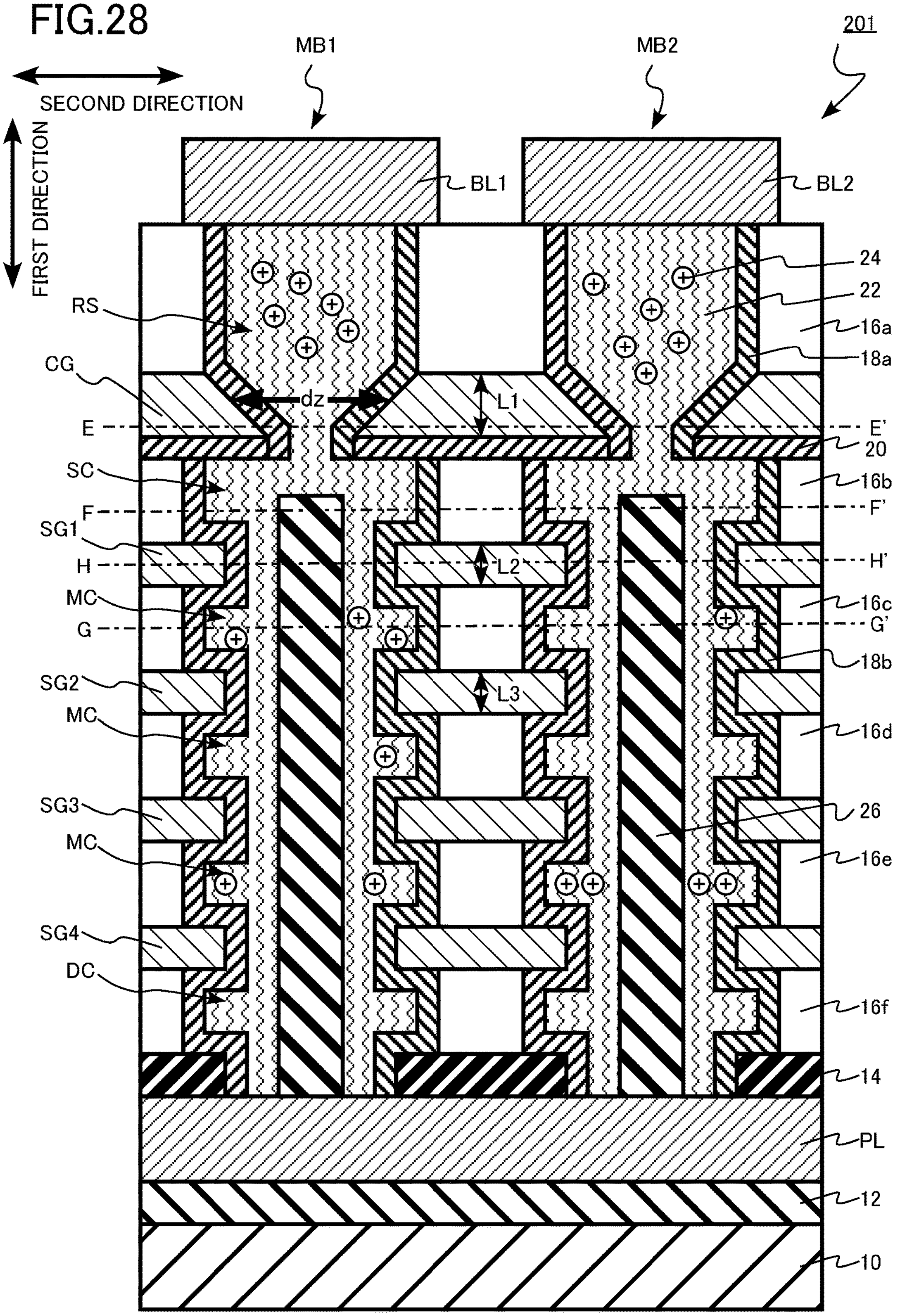
FIG. 28 is a schematic cross-sectional view of a storage device of a second embodiment.

FIG. 28 is a schematic cross-sectional view of the storage device of the second embodiment. FIG. 28 is a schematic cross-sectional view of a memory cell array 201. FIG. 28 is a schematic cross-sectional view including the first memory bottle MB1 and the second memory bottle MB2. FIG. 28 is a diagram corresponding to FIG. 3 of the first embodiment.

Figure 29A:
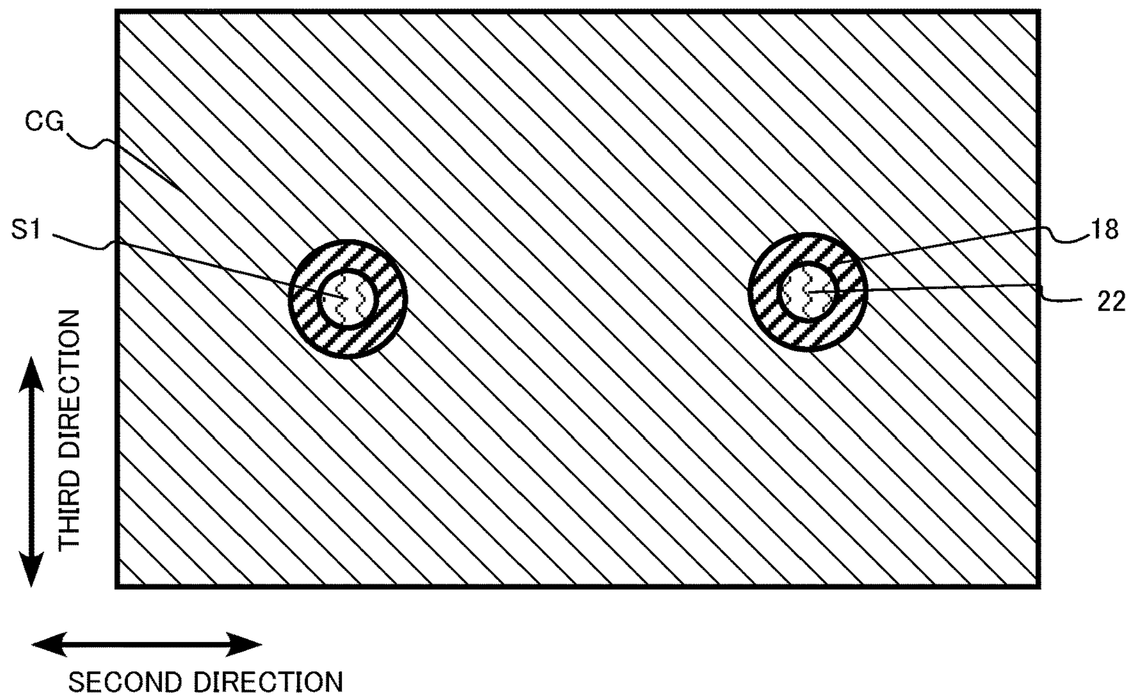
FIGS. 29A and 29B are schematic cross-sectional views of the storage device of the second embodiment.
Figure 29B:
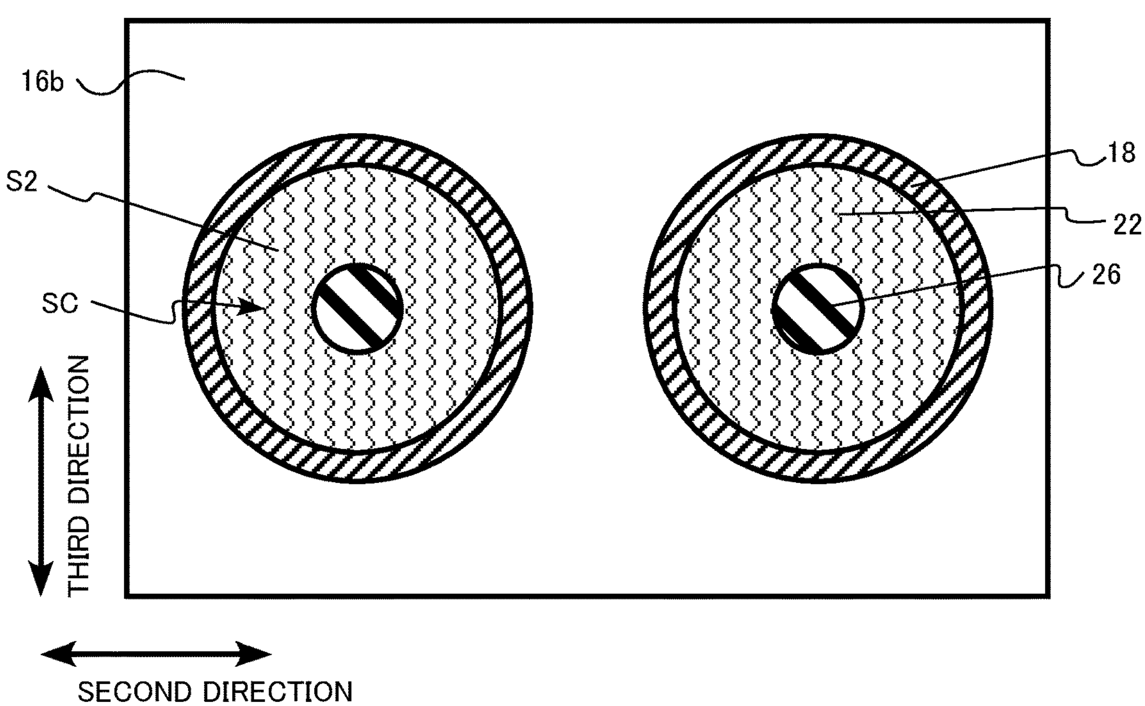

FIGS. 29A and 29B are schematic cross-sectional views of the storage device of the second embodiment. FIGS. 29A and 29B are schematic cross-sectional views of the memory cell array 201. FIGS. 29A and 29B are cross-sections of the memory cell array 201 perpendicular to the first direction. FIG. 29A is a cross-section taken along the E-E' line defined in FIG. 28, and FIG. 29B is a cross-section taken along the F-F' line defined in FIG. 28.

Figure 30A:
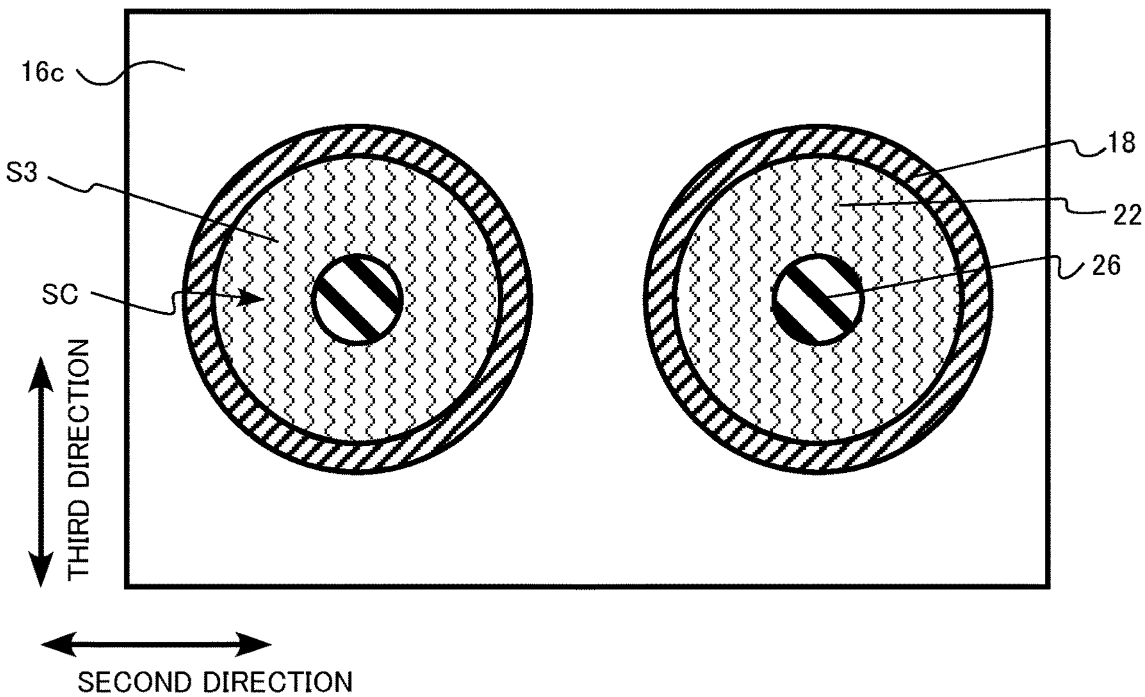
FIGS. 30A and 30B are schematic cross-sectional views of the storage device of the second embodiment.
Figure 30B:
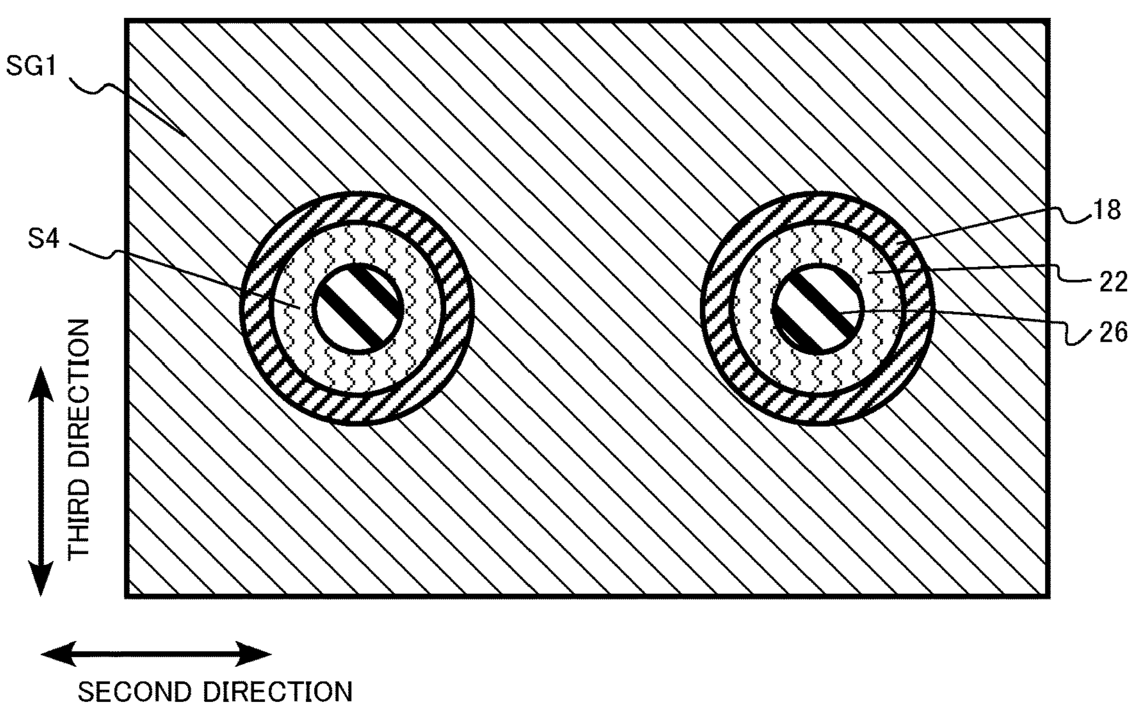

FIGS. 30A and 30B are schematic cross-sectional views of the storage device of the second embodiment. FIGS. 30A and 30B are cross-sections of the memory cell array 201 perpendicular to the first direction. FIG. 30A is a cross-section taken along the G-G' line defined in FIG. 28, and FIG. 30B is a cross-section taken along the H-H' line defined in FIG. 28.

The memory cell array 201 includes a semiconductor substrate 10, a substrate insulating layer 12, a lower insulating layer 14, a first interlayer insulating layer 16*a*, a second interlayer insulating layer 16*b*, a third interlayer insulating layer 16*c*, a fourth interlayer insulating layer 16*d*, a fifth interlayer insulating layer 16*e*, a sixth interlayer insulating layer 16*f*, a first gate insulating film 18*a*, a second gate insulating film 18*b*, an upper insulating layer 20, a fluid layer 22, a plurality of charged particles 24, and core insulators 26. The memory cell array 201 also includes a first bit line BL1, a second bit line BL2, a plate electrode PL, a cock gate electrode CG, a first storage gate electrode SG1, a second storage gate electrode SG2, a third storage gate electrode SG3, and a fourth storage gate electrode SG4. The memory cell array 201 further includes a reservoir RS, a standby cell SC, a plurality of memory cells MC, and a dummy cell DC.

The first bit line BL1 is an example of the first conductive layer. The plate electrode PL is an example of the second conductive layer. The cock gate electrode CG is an example of the first control electrode. The first storage gate electrode SG1 is an example of the second control electrode. The second storage gate electrode SG2 is an example of the third control electrode. The third storage gate electrode SG3 is an example of the fourth control electrode.

The first interlayer insulating layer 16*a* is an example of the first insulating layer. The second interlayer insulating layer 16*b* is an example of the second insulating layer. The third interlayer insulating layer 16*c* is an example of the third insulating layer. The fourth interlayer insulating layer 16*d* is an example of the fourth insulating layer. The fifth interlayer insulating layer 16*e* is an example of the fifth insulating layer. Hereinafter, the first interlayer insulating layer 16*a*, the second interlayer insulating layer 16*b*, the third interlayer insulating layer 16*c*, the fourth interlayer insulating layer 16*d*, the fifth interlayer insulating layer 16*e*, and the sixth interlayer insulating layer 16*f* will be mentioned individually of one another, or will be collectively referred to as the interlayer insulating layers 16.

The first gate insulating film 18*a* is an example of a first insulating film. The charged particles 24 are an example of the particles.

The first memory bottle MB1 and the second memory bottle MB2 are adjacent to each other. The second memory bottle MB2 is located in a second direction perpendicular to the first direction, with respect to the first memory bottle MB1.

The upper insulating layer 20 is provided between the bit lines BL and the second interlayer insulating layer 16*b*. The upper insulating layer 20 is an aluminum oxide layer, for example.

The cock gate electrode CG is provided between the bit lines BL and the plate electrode PL. The cock gate electrode CG is provided between the first interlayer insulating layer 16*a* and the second interlayer insulating layer 16*b*. The cock gate electrode CG is provided between the first interlayer insulating layer 16*a* and the upper insulating layer 20.

The cock gate electrode CG is a plate-like conductor, for example. The cock gate electrode CG surrounds the fluid layer 22, for example.

The end of the cock gate electrode CG facing the fluid layer 22 has a tapered shape in a cross-section parallel to the first direction. In the cross-section parallel to the first direction, the distance (dz in FIG. 28) between the two ends of the cock gate electrode CG facing each other, with the fluid layer 22 being interposed in between, becomes smaller in the direction from the bit lines BL toward the plate electrode PL. In a cross-section parallel to the first direction, the distance (dz in FIG. 28) at a first position is larger than the distance (dz in FIG. 28) at a second position. The first position is closer to the bit line BL than the second position.

The cock gate electrode CG contains a metal, a metal nitride, a metal carbide, or a semiconductor, for example. The cock gate electrode CG contains tungsten (W), for example.

The cock gate electrode CG has a first length (L1 in FIG. 28) in the first direction. The first length L1 is not smaller than 10 nm and not greater than 50 nm, for example.

The first storage gate electrode SG1 has a second length (L2 in FIG. 28) in the first direction. The second length L2 is not smaller than 5 nm and not greater than 30 nm, for example.

The first length L1 of the cock gate electrode CG is greater than the second length L2 of the first storage gate electrode SG1, for example. The first length L1 is at least 1.5 times greater than the second length L2, for example.

The distance between the bit lines BL and the cock gate electrode CG is greater than the distance between the cock gate electrode CG and the first storage gate electrode SG1.

The second storage gate electrode SG2 has a third length (L3 in FIG. 28) in the first direction. The third length L3 is not smaller than 5 nm and not greater than 30 nm, for example.

The first length L1 of the cock gate electrode CG is greater than the third length L3 of the second storage gate electrode SG2, for example. The first length L1 is at least 1.5 times greater than the third length L3, for example.

The second length L2 of the first storage gate electrode SG1 is equal to the third length L3 of the second storage gate electrode SG2, for example.

As shown in FIG. 29A, the fluid layer 22 has a first cross-sectional area (S1 in FIG. 29A) in a first cross-section (the E-E' cross-section) perpendicular to the first direction, the first cross-section including the cock gate electrode CG. Further, as shown in FIG. 29B, the fluid layer 22 has a second cross-sectional area (S2 in FIG. 29B) in a second cross-section (the F-F' cross-section) perpendicular to the first direction, the second cross-section including the second interlayer insulating layer 16*b*.

The first cross-sectional area S1 is smaller than the second cross-sectional area S2, for example. The first cross-sectional area S1 is equal to or smaller than one-fourth of the second cross-sectional area S2, for example.

As shown in FIG. 30A, the fluid layer 22 has a third cross-sectional area (S3 in FIG. 30A) in a third cross-section (the G-G' cross-section) perpendicular to the first direction, the third cross-section including the third interlayer insulating layer 16*c*. Also, as shown in FIG. 30B, the fluid layer 22 has a fourth cross-sectional area (S4 in FIG. 30B) in a fourth cross-section (the H-H' cross-section) perpendicular to the first direction, the fourth cross-section including the first storage gate electrode SG1.

The fourth cross-sectional area S4 is smaller than the third cross-sectional area S3, for example. The fourth cross-sectional area S4 is equal to or smaller than one-half of the third cross-sectional area S3, for example.

The fourth cross-sectional area S4 is smaller than the second cross-sectional area S2, for example. The fourth cross-sectional area S4 is equal to or smaller than one-half of the second cross-sectional area S2, for example.

The first cross-sectional area S1 is smaller than the third cross-sectional area S3, for example. The first cross-sectional area S1 is equal to or smaller than one-fourth of the third cross-sectional area S3, for example.

The first cross-sectional area S1 is smaller than the fourth cross-sectional area S4, for example. The first cross-sectional area S1 is equal to or smaller than one-half of the fourth cross-sectional area S4, for example.

The first gate insulating film 18*a* is provided between the cock gate electrode CG and the fluid layer 22. The first gate insulating film 18*a* surrounds the fluid layer 22. The first gate insulating film 18*a* is in contact with the fluid layer 22, for example. The first gate insulating film 18*a* functions as a gate insulating film of the cock transistor.

The second gate insulating film 18*b* is provided between the storage gate electrode SG and the fluid layer 22. The second gate insulating film 18*b* surrounds the fluid layer 22. The second gate insulating film 18*b* is in contact with the fluid layer 22, for example. The second gate insulating film 18*b* functions as a gate insulating film of the storage transistors.

The core insulators 26 extend in the first direction. The core insulators 26 are surrounded by the fluid layer 22. The core insulators 26 are surrounded by the interlayer insulating layers 16. The core insulators 26 are surrounded by the second interlayer insulating layer 16*b*, for example. The core insulators 26 are surrounded by the storage gate electrodes SG.

The core insulators 26 each have a columnar shape, for example.

The core insulators 26 contain an insulating material. The insulating material contained in the core insulators 26 is an oxide, a nitride, or an oxynitride, for example. The insulating material contained in the core insulators 26 is a silicon oxide, for example.

Next, an example method for manufacturing the storage device of the second embodiment is described. In the description below, an example method for manufacturing the memory cell array 201 of the nonvolatile memory of the second embodiment is explained.

FIGS. 31, 32, 33, 34, 35, 36, 37, 38, 39, 40, 41, 42, 43, 44, 45, 46, 47, 48, and 49 are schematic cross-sectional diagrams illustrating a method for manufacturing the storage device of the second embodiment. FIGS. 31 to 49 each show a cross-section corresponding to FIG. 28.

First, the substrate insulating layer 12 is formed on the semiconductor substrate 10. The substrate insulating layer 12 is a silicon oxide layer, for example. The substrate insulating layer 12 is formed by CVD, for example.

The plate electrode PL is then formed on the substrate insulating layer 12. The plate electrode PL is made of tungsten, for example. The plate electrode PL is formed by CVD, for example.

A silicon nitride layer 50 is then formed on the plate electrode PL. The silicon nitride layer 50 is formed by CVD, for example. Part of the silicon nitride layer 50 eventually turns into the lower insulating layer 14.

Figure 31:
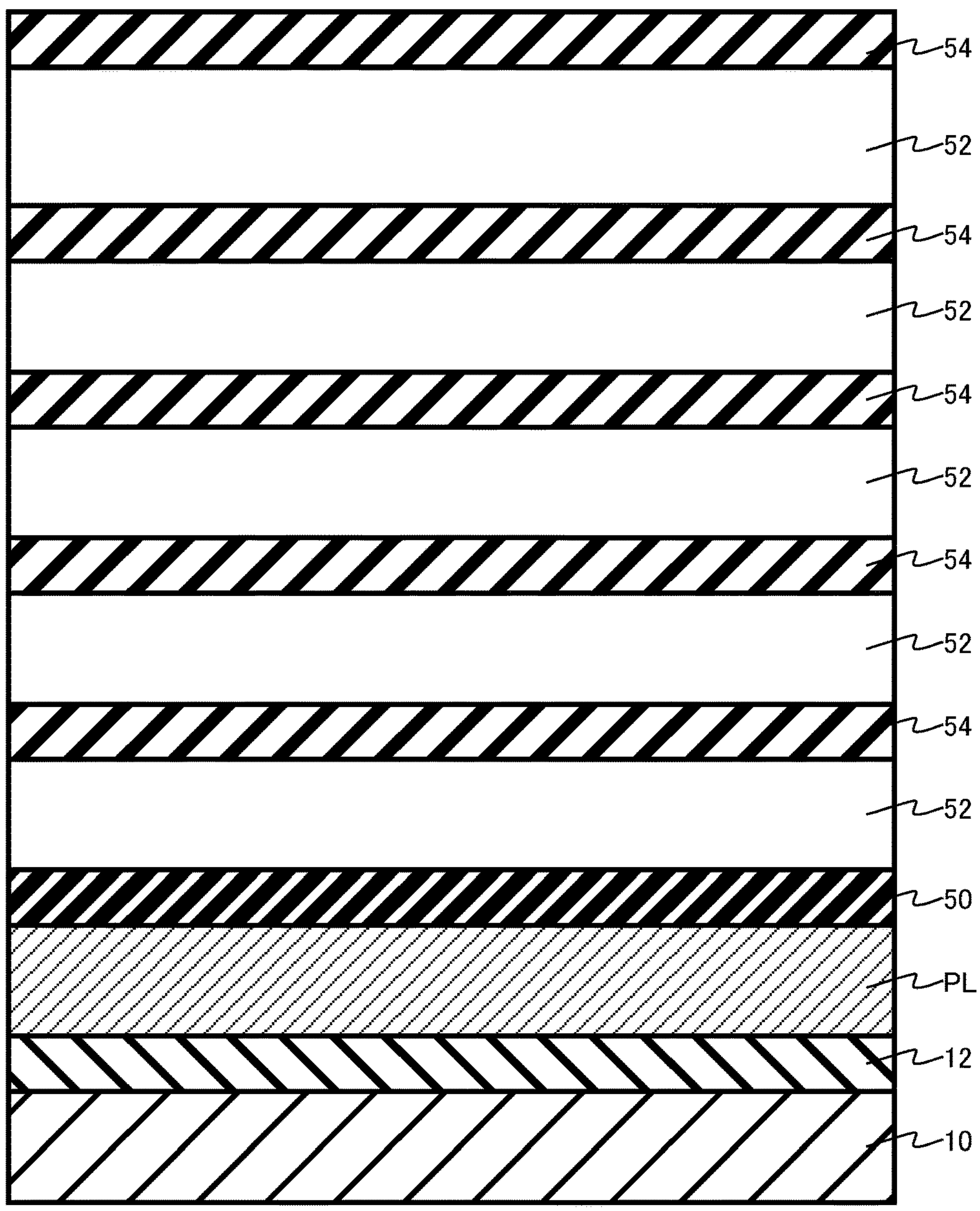
FIG. 31 is a schematic cross-sectional diagram illustrating a method for manufacturing the storage device of the second embodiment.

Silicon oxide layers 52 and silicon nitride layers 54 are then alternately stacked (FIG. 31). The silicon oxide layers 52 and the silicon nitride layers 54 are formed by CVD, for example. Part of the silicon oxide layers 52 eventually turns into the interlayer insulating layers 16.

Figure 32:
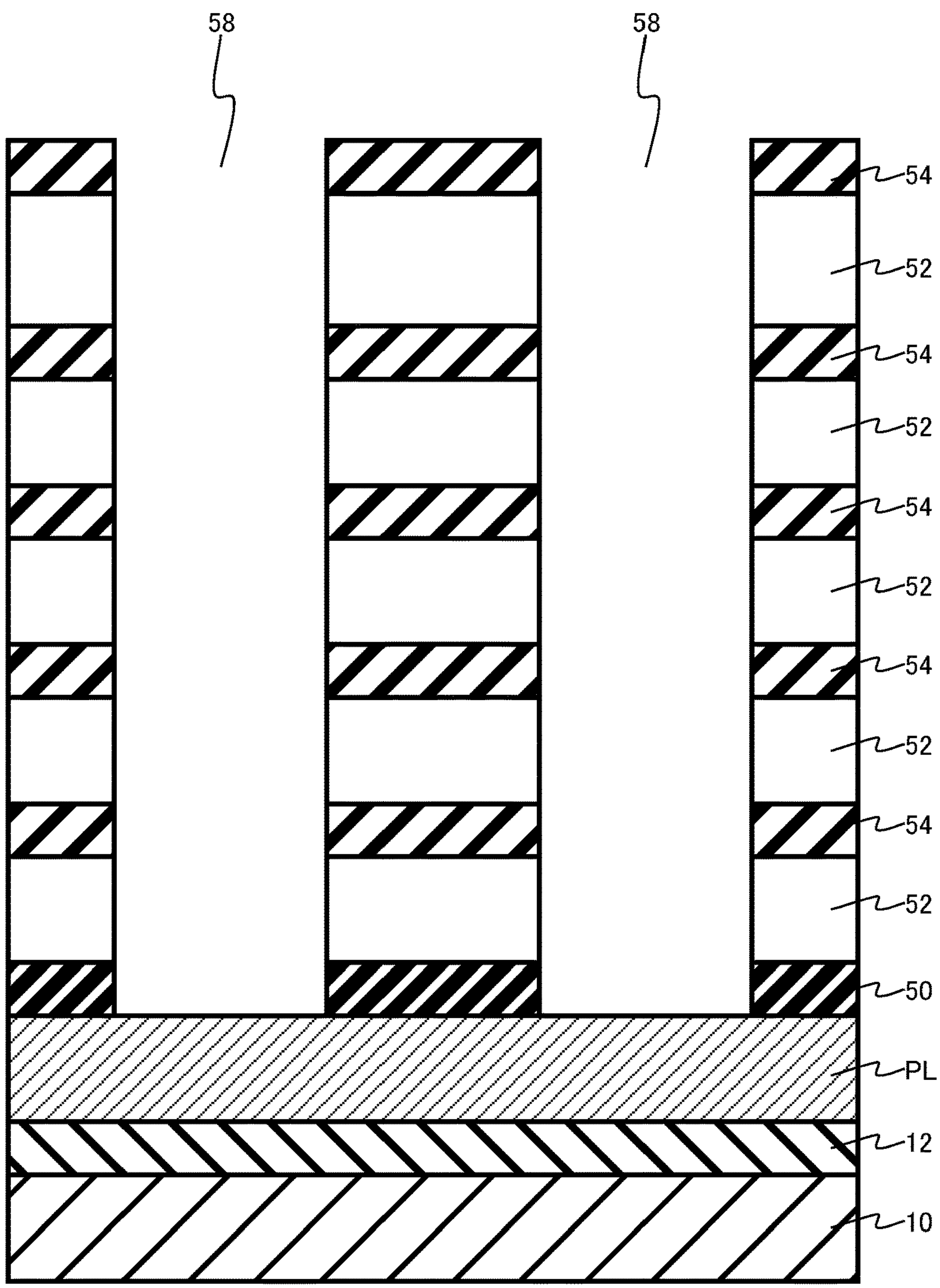
FIG. 32 is a schematic cross-sectional diagram illustrating a method for manufacturing the storage device of the second embodiment.

Openings 58 are then formed in the silicon oxide layers 52, the silicon nitride layers 54, and the silicon nitride layer 50 (FIG. 32). The openings 58 are formed by a lithographic technique and RIE, for example.

Figure 33:
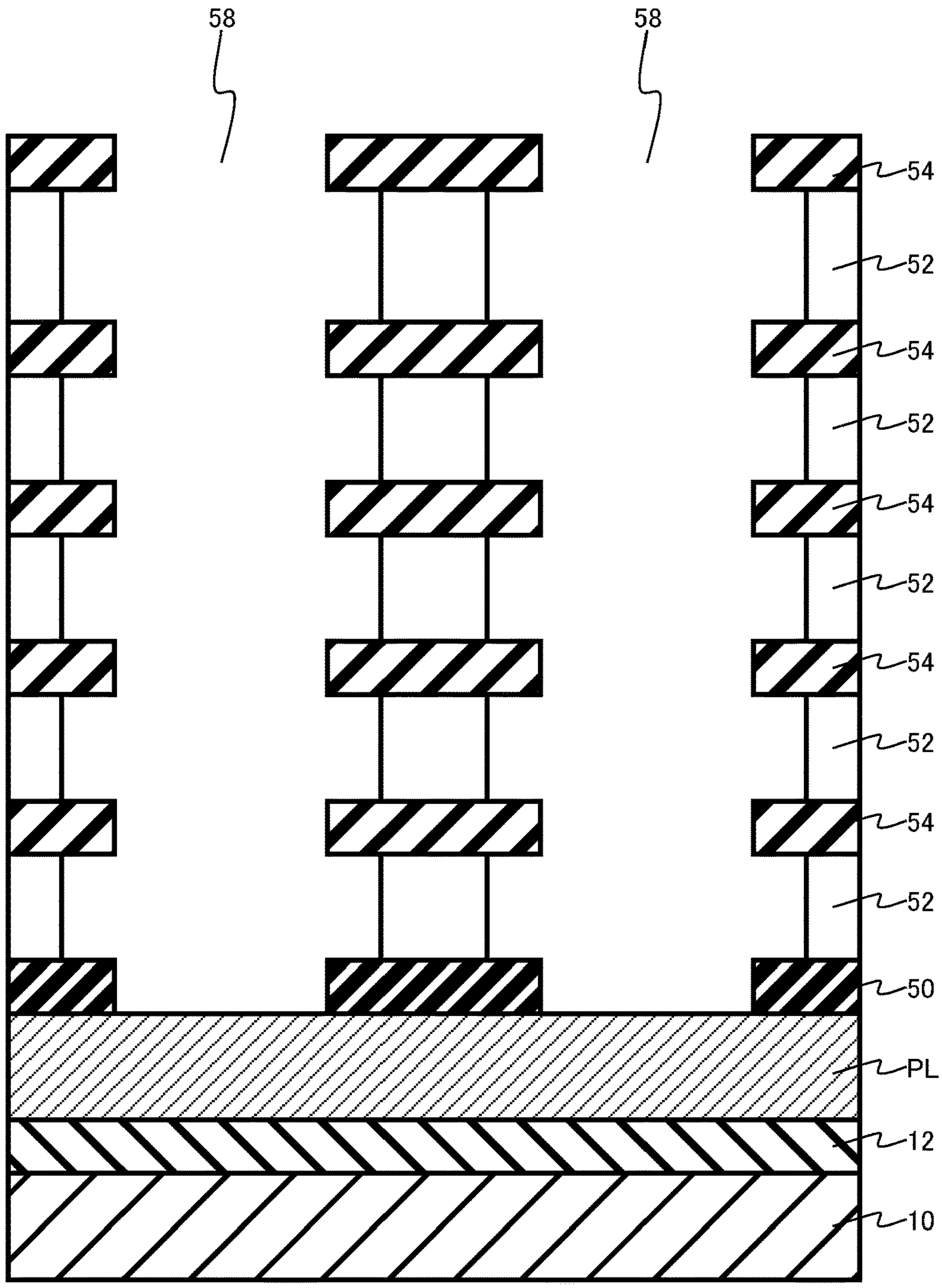
FIG. 33 is a schematic cross-sectional diagram illustrating a method for manufacturing the storage device of the second embodiment.

Etching is then performed on the silicon oxide layers 52 of the inner surfaces of the openings 58 (FIG. 33). The silicon oxide layers 52 of the inner surfaces of the openings 58 are retracted. The etching of the silicon oxide layers 52 is performed by wet etching, for example.

Figure 34:
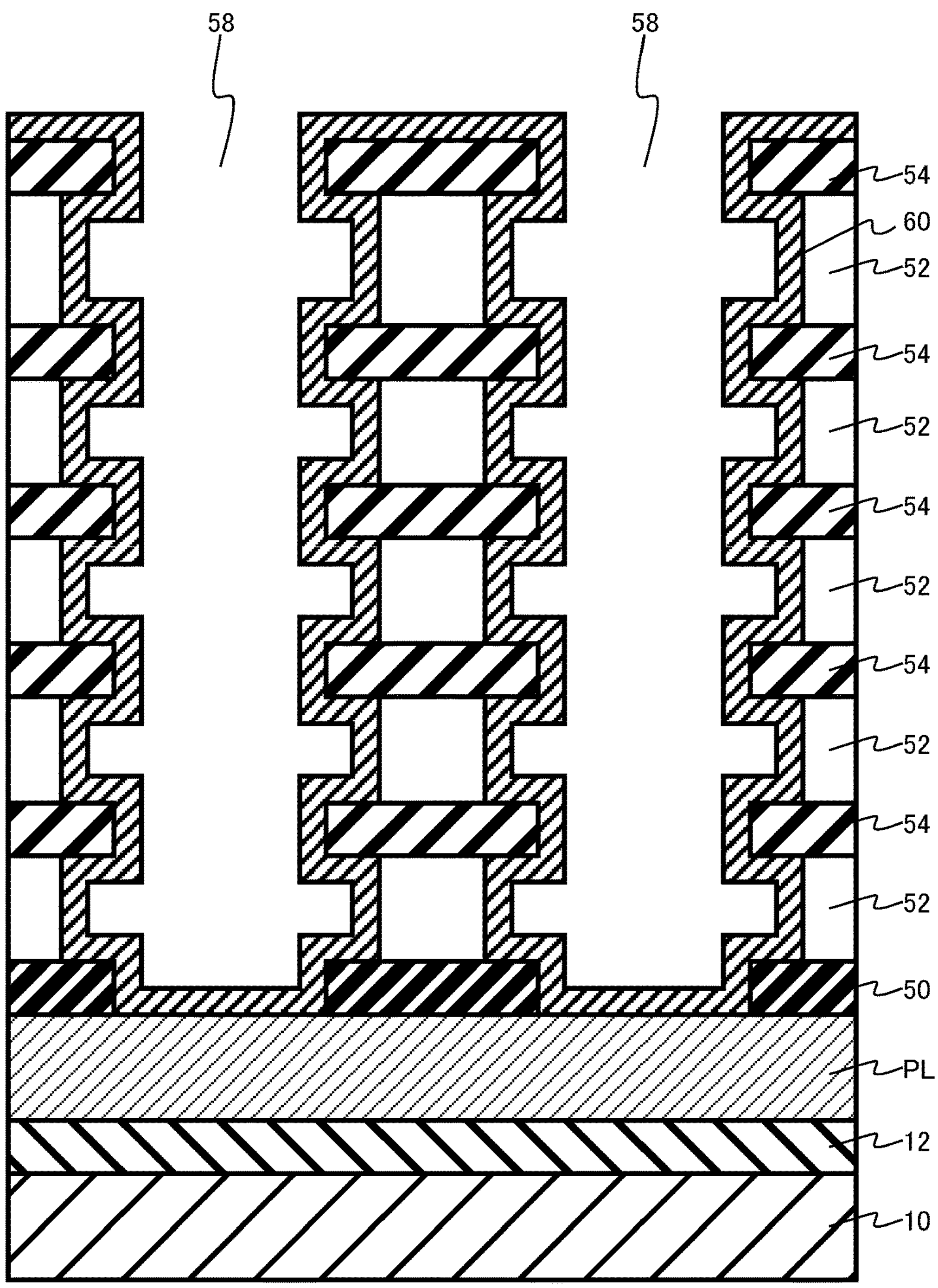
FIG. 34 is a schematic cross-sectional diagram illustrating a method for manufacturing the storage device of the second embodiment.

Aluminum oxide layers 60 are then formed on the inner surfaces of the openings 58 (FIG. 34). The aluminum oxide layers 60 are formed by ALD, for example. Part of the aluminum oxide layers 60 eventually turns into the second gate insulating film 18*b*.

Figure 35:
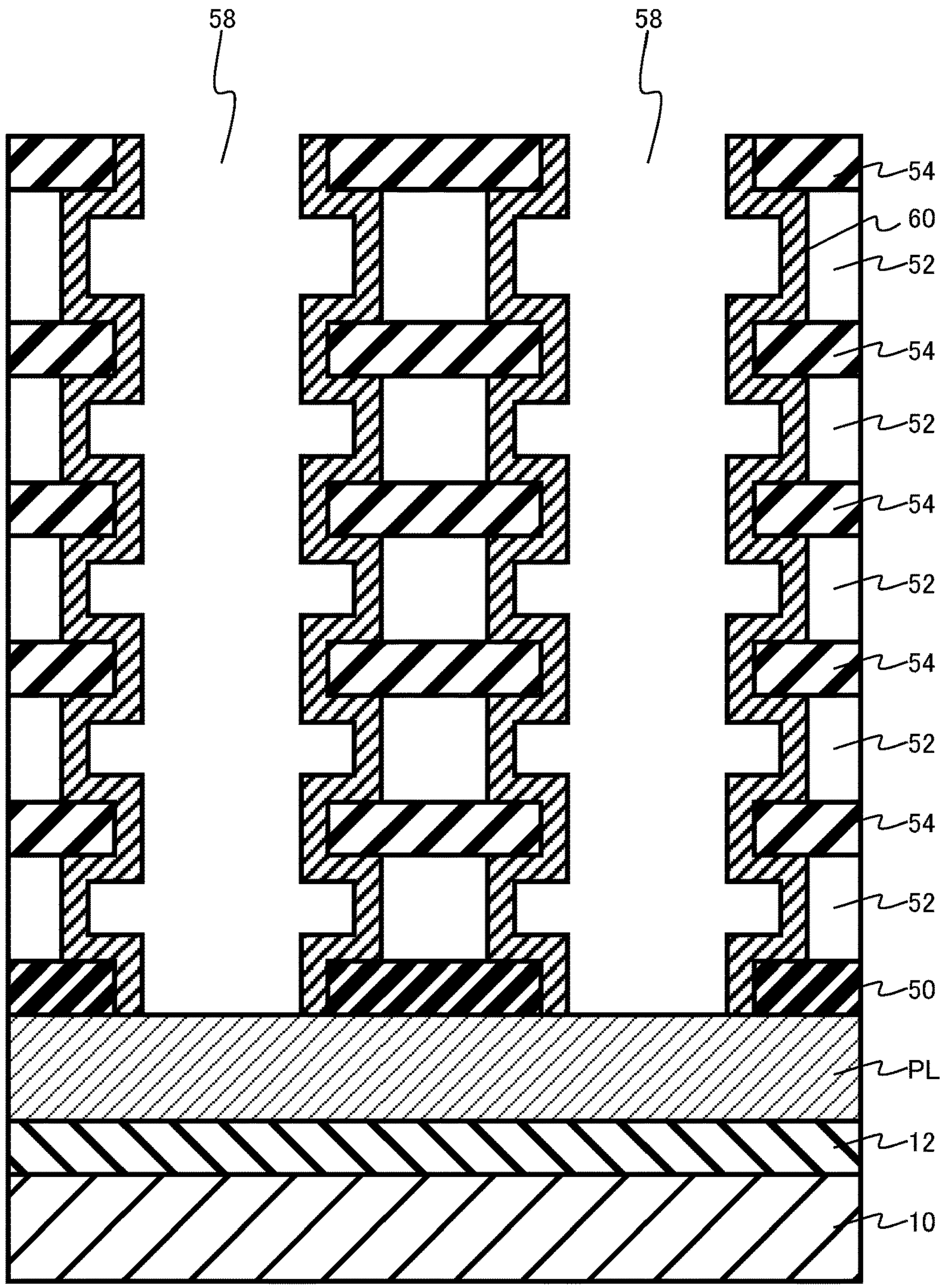
FIG. 35 is a schematic cross-sectional diagram illustrating a method for manufacturing the storage device of the second embodiment.

Etching is then performed on the aluminum oxide layers 60 at the bottoms of the openings 58 (FIG. 35). The plate electrode PL is exposed through the bottoms of the openings 58. The etching of the aluminum oxide layers 60 is performed by RIE, for example.

Amorphous silicon films 62 and silicon oxide films 63 are then formed in the openings 58. The openings 58 are filled with the amorphous silicon films 62 and the silicon oxide films 63. The amorphous silicon films 62 and the silicon oxide films 63 are formed by CVD, for example. The silicon oxide films 63 eventually turn into the core insulators 26.

Figure 36:
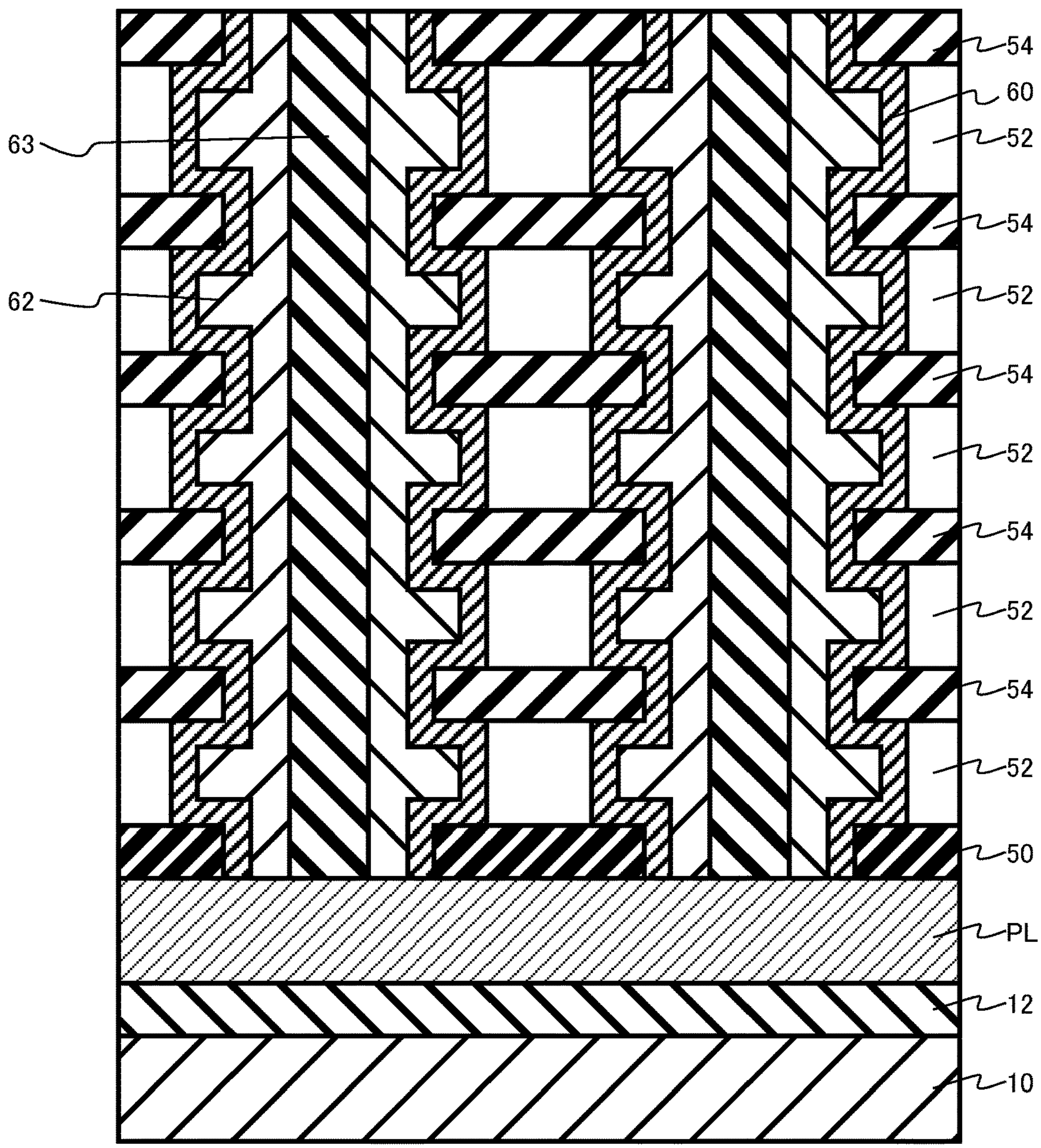
FIG. 36 is a schematic cross-sectional diagram illustrating a method for manufacturing the storage device of the second embodiment.

The amorphous silicon films 62 and the silicon oxide films 63 located on the uppermost silicon nitride layer 54 are then removed (FIG. 36). For the removal of the amorphous silicon films 62, CMP is used, for example.

Figure 37:
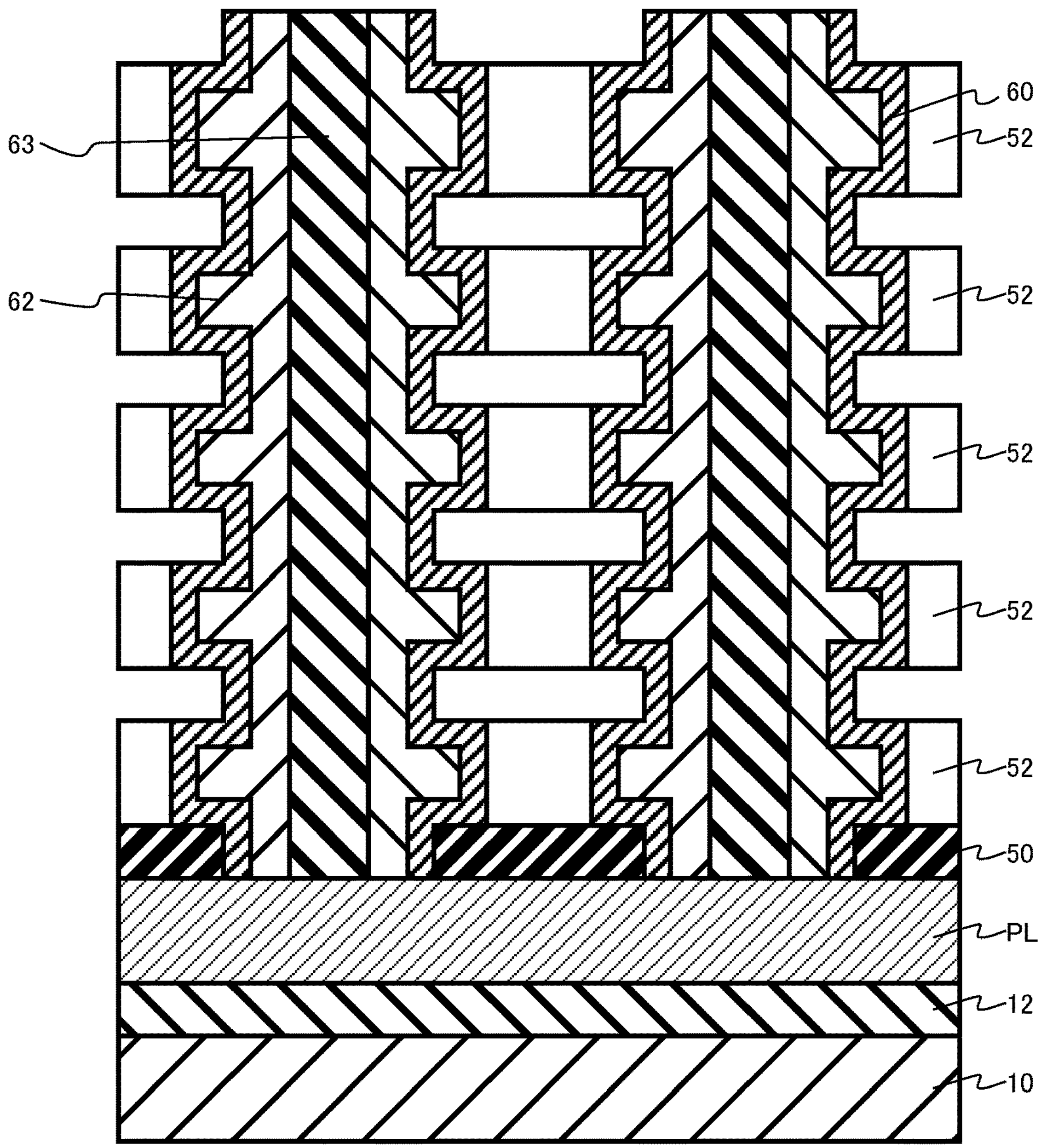
FIG. 37 is a schematic cross-sectional diagram illustrating a method for manufacturing the storage device of the second embodiment.

The silicon nitride layers 54 are then selectively removed by wet etching using grooves for etching (not shown) (FIG. 37). For the wet etching, a phosphoric acid solution is used, for example. Etching is performed selectively on the silicon nitride layers 54 with respect to the silicon oxide layers 52 and the aluminum oxide layers 60.

Figure 38:
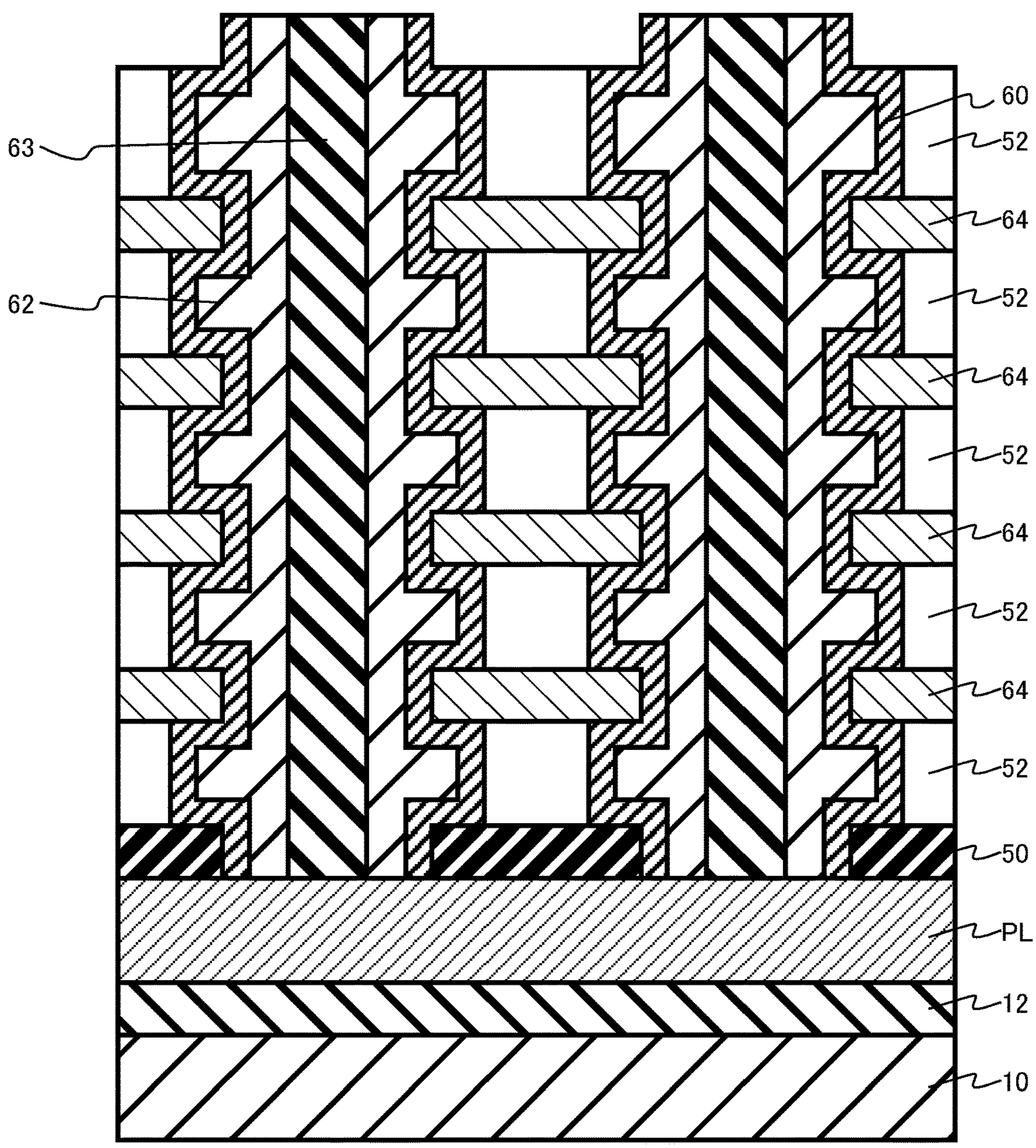
FIG. 38 is a schematic cross-sectional diagram illustrating a method for manufacturing the storage device of the second embodiment.

Metal films 64 are then formed (FIG. 38). The metal films 64 contain tungsten, for example. The metal films 64 are formed by CVD, for example. Part of the metal films 64 eventually turns into the storage gate electrodes SG.

Figure 39:
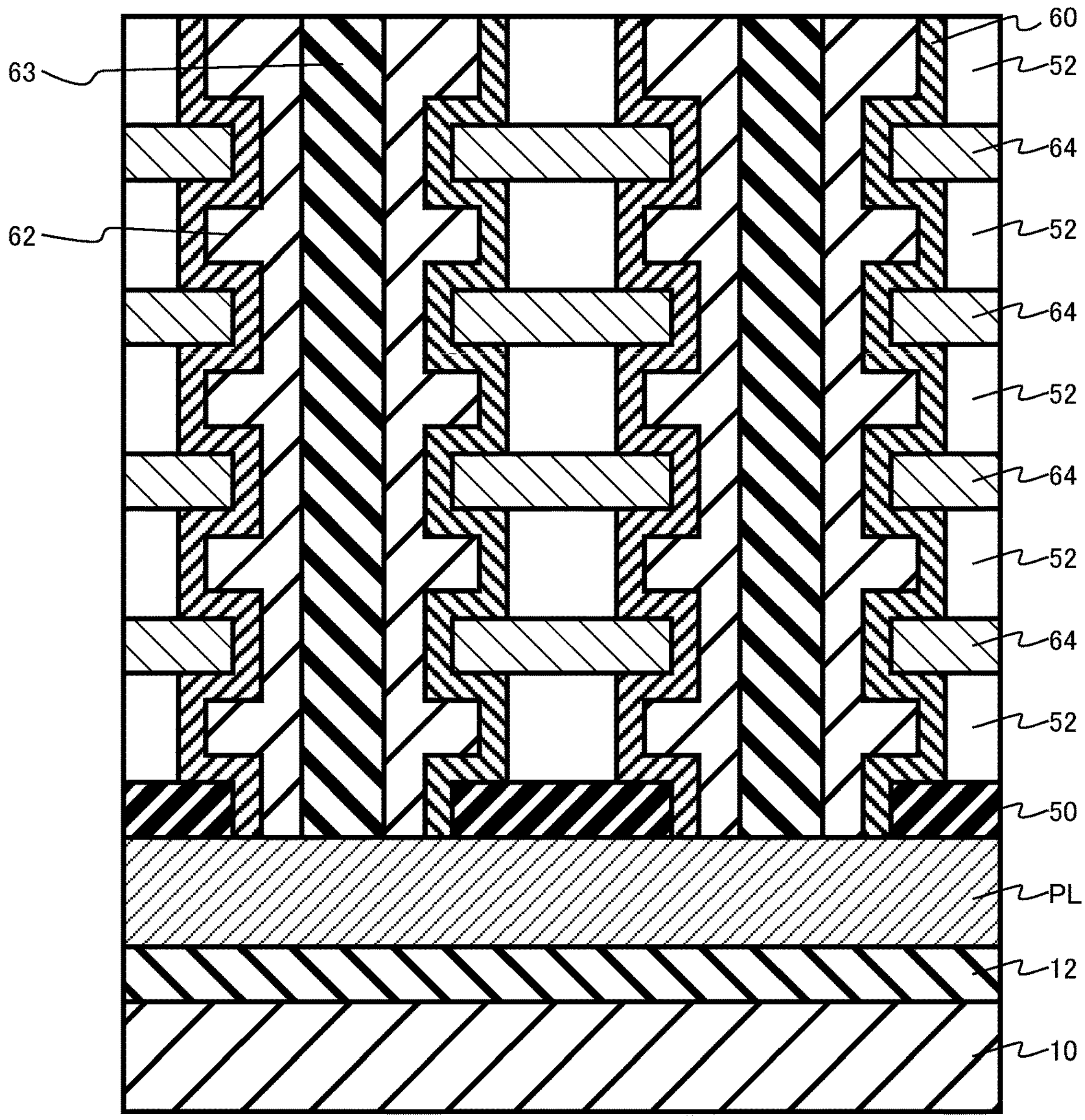
FIG. 39 is a schematic cross-sectional diagram illustrating a method for manufacturing the storage device of the second embodiment.

The aluminum oxide layers 60, the amorphous silicon films 62, and the silicon oxide films 63 protruding from the surface are removed, so that the surface is planarized (FIG. 39). For the removal of the aluminum oxide layers 60, the amorphous silicon films 62, and the silicon oxide films 63, CMP is used, for example.

Figure 40:
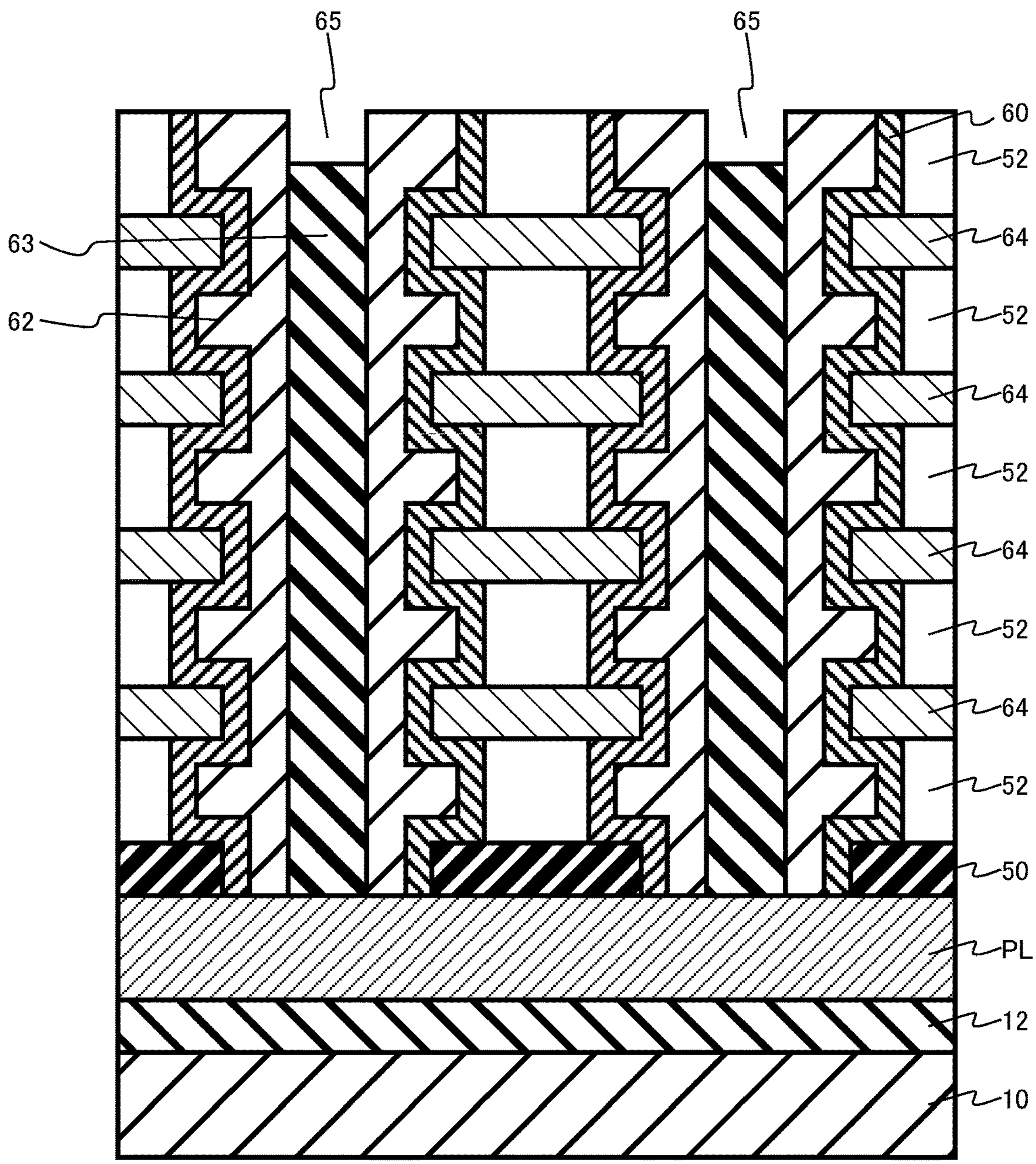
FIG. 40 is a schematic cross-sectional diagram illustrating a method for manufacturing the storage device of the second embodiment.

Etching is then performed on the silicon oxide films 63, to form recesses 65 (FIG. 40). The etching is performed on the silicon oxide films 63 by RIE, for example.

Figure 41:
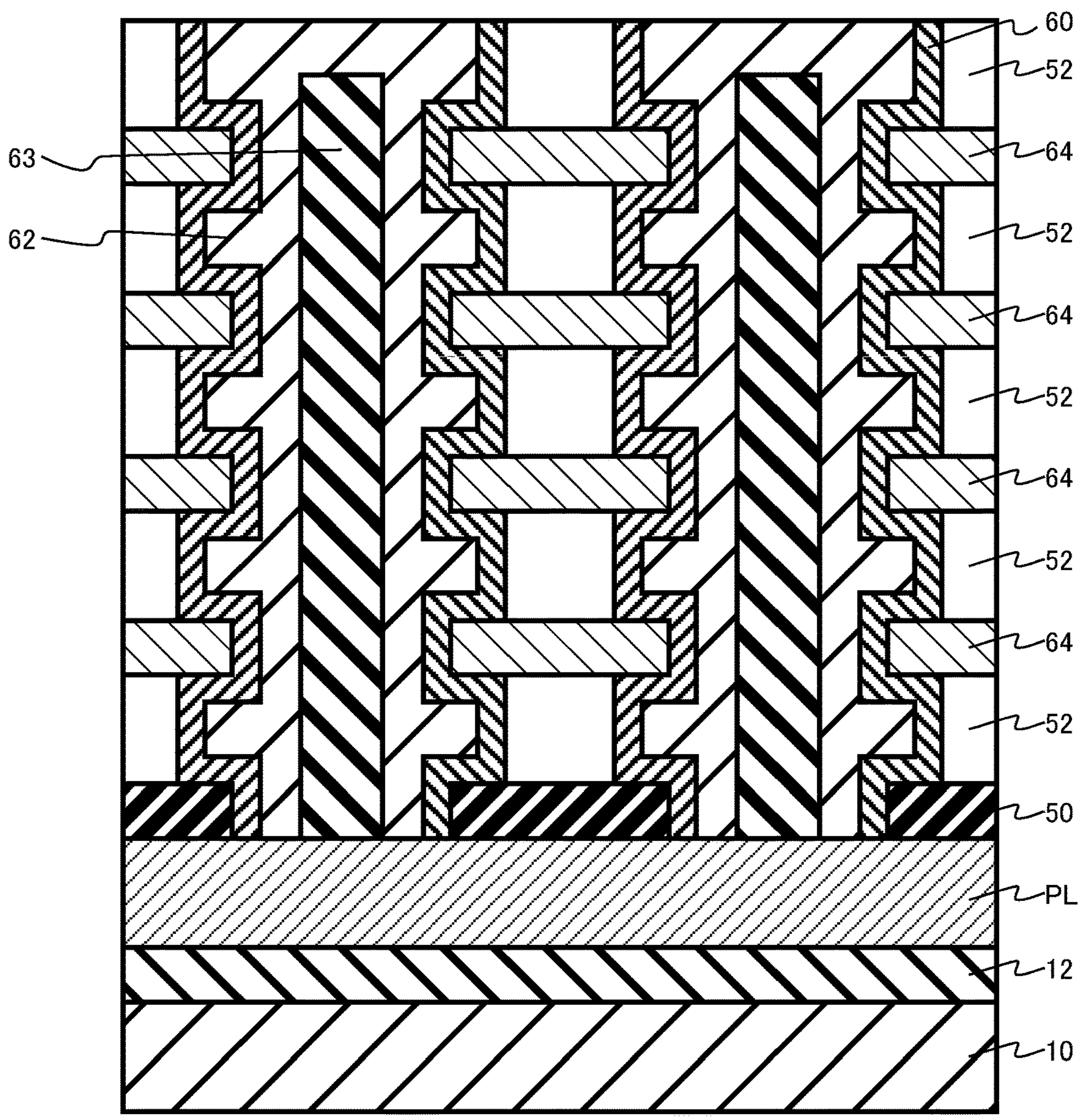
FIG. 41 is a schematic cross-sectional diagram illustrating a method for manufacturing the storage device of the second embodiment.

The recesses 65 are then filled with amorphous silicon films (FIG. 41). The recesses 65 are filled by formation of the amorphous silicon films by CVD, and by planarization using CMP, for example.

Figure 42:
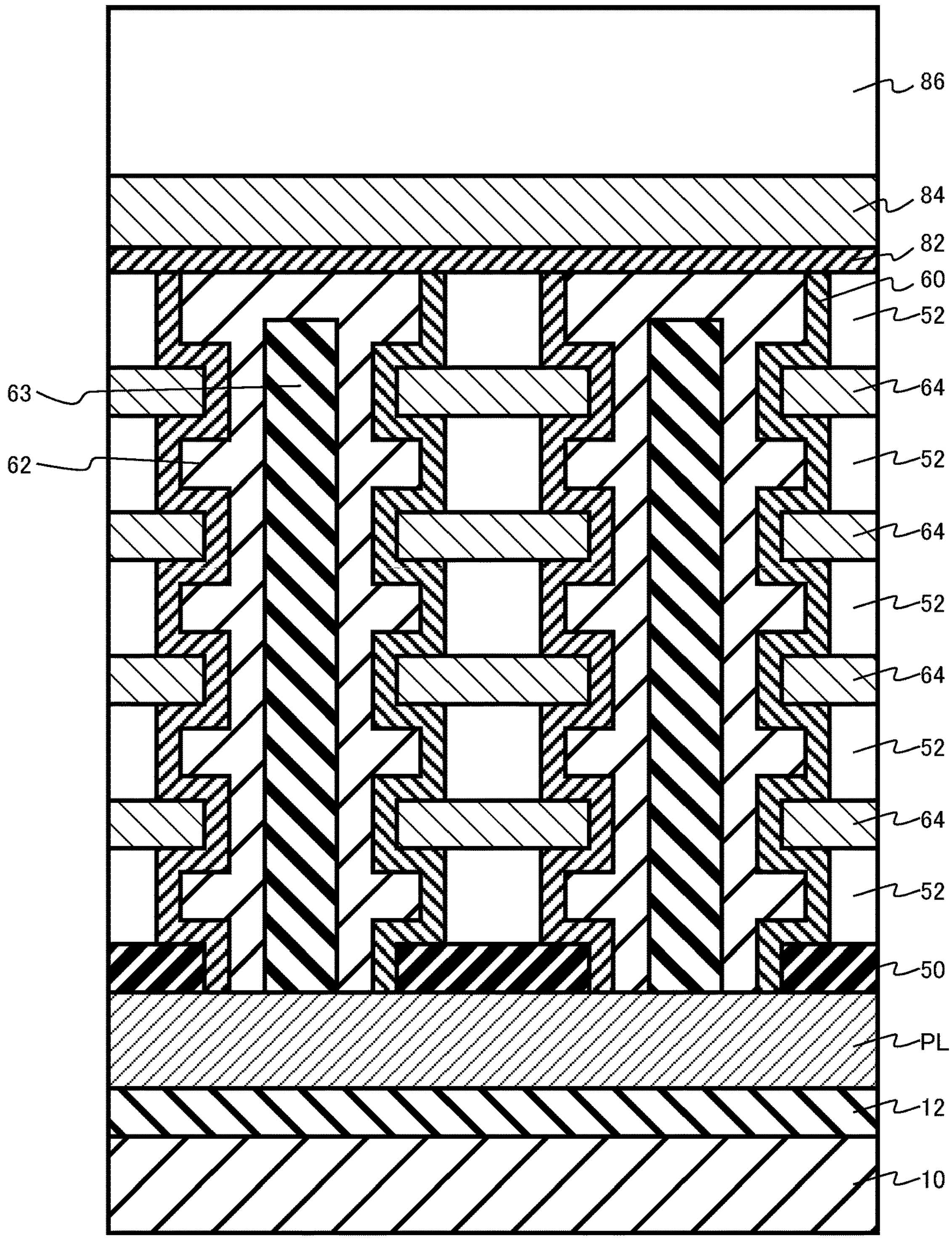
FIG. 42 is a schematic cross-sectional diagram illustrating a method for manufacturing the storage device of the second embodiment.

An aluminum oxide layer 82, a metal film 84, and a silicon oxide layer 86 are then formed (FIG. 42). The aluminum oxide layer 82, the metal film 84, and the silicon oxide layer 86 are formed by CVD, for example.

Part of the aluminum oxide layer 82 eventually turns into the upper insulating layer 20. Part of the metal film 84 eventually turns into the cock gate electrode CG. Further, part of the silicon oxide layer 86 eventually turns into an interlayer insulating layer 16.

Figure 43:
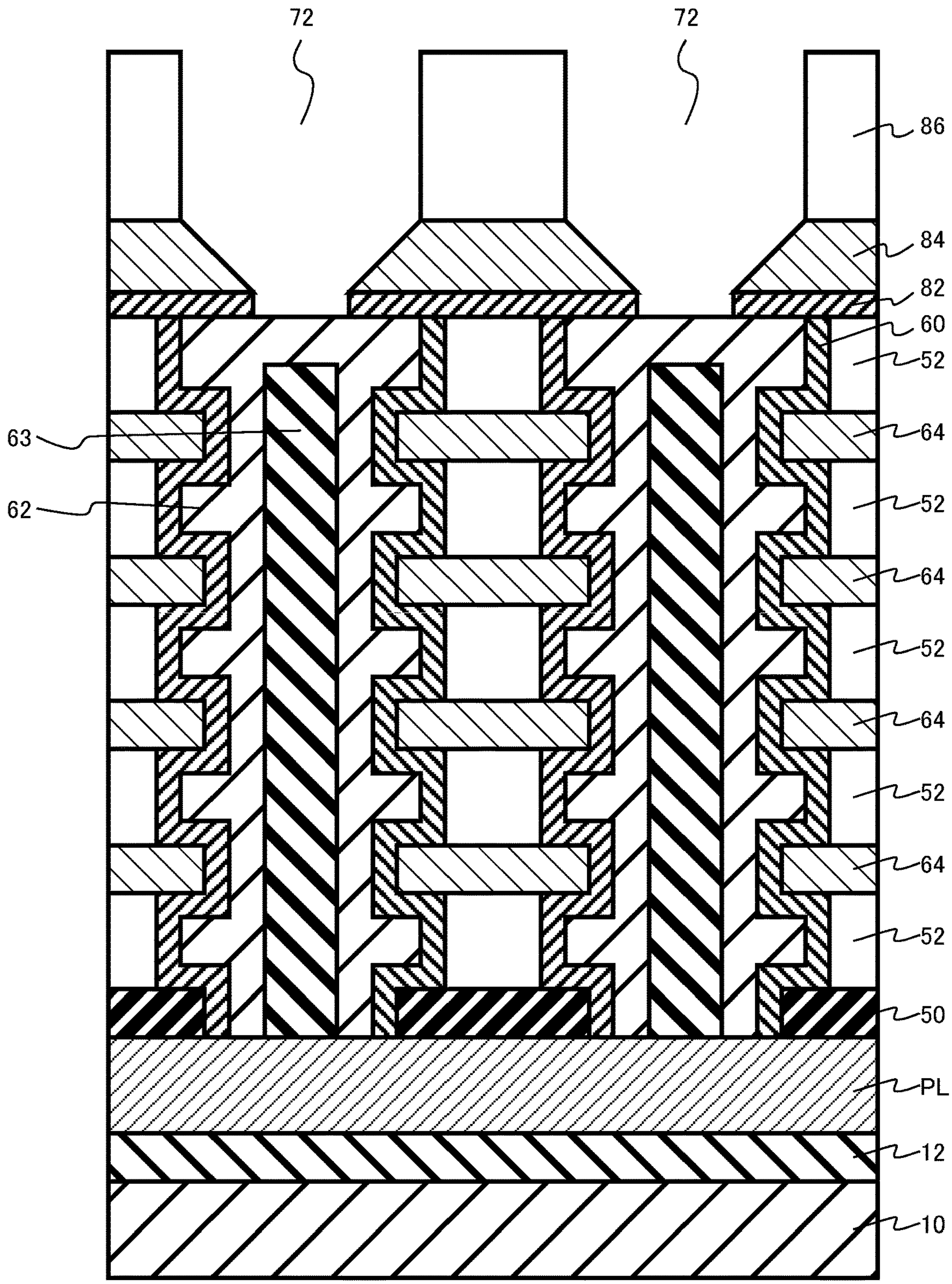
FIG. 43 is a schematic cross-sectional diagram illustrating a method for manufacturing the storage device of the second embodiment.

Etching is then performed on the silicon oxide layer 86, the metal film 84, and the aluminum oxide layer 82, to form openings 72 (FIG. 43). The openings 72 are formed by a lithographic technique and RIE, for example. When the openings 72 are formed, the etching is performed so that the metal film 84 has a tapered shape.

Figure 44:
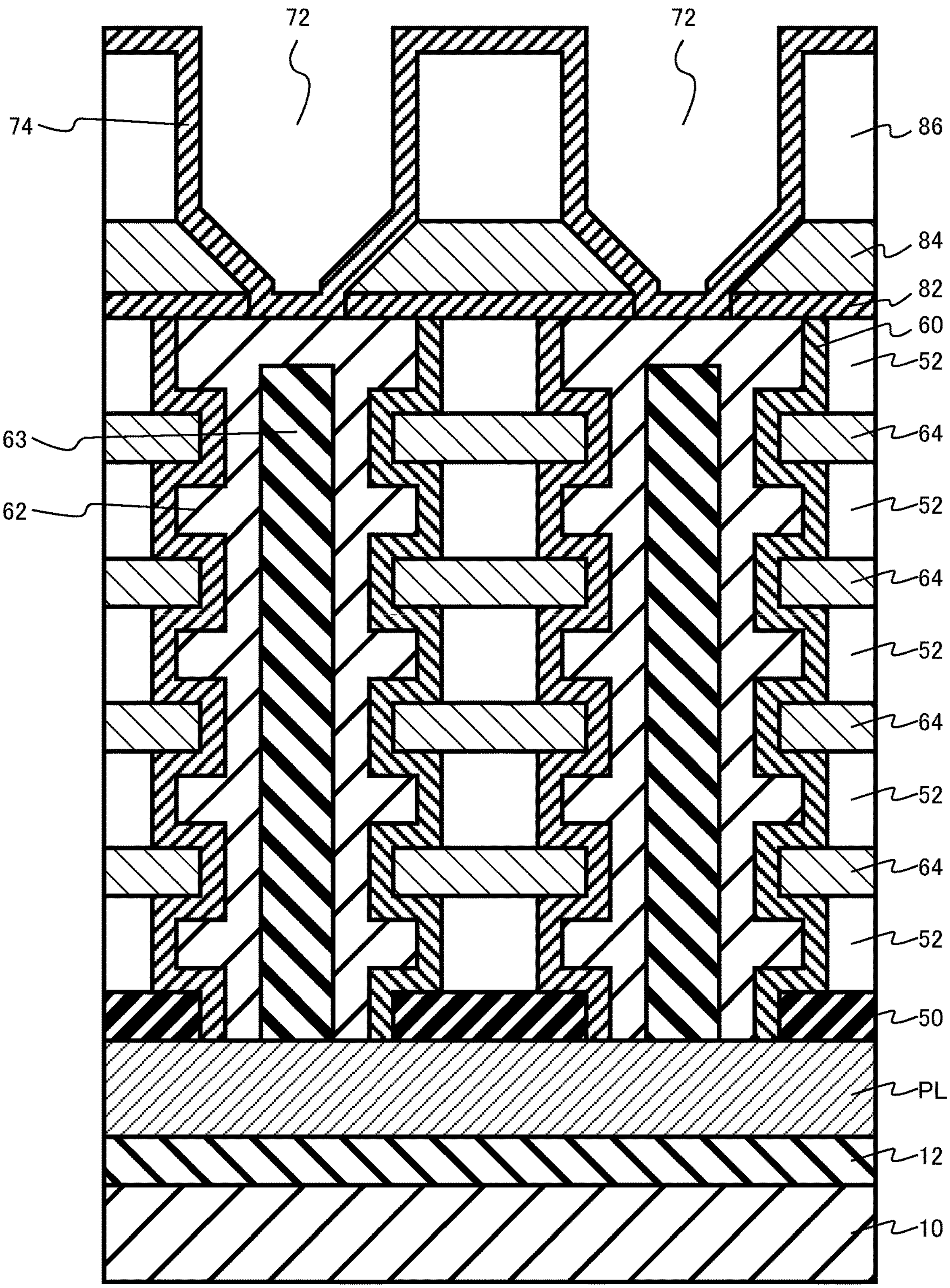
FIG. 44 is a schematic cross-sectional diagram illustrating a method for manufacturing the storage device of the second embodiment.

An aluminum oxide layer 74 is then formed in the openings 72 (FIG. 44). The aluminum oxide layer 74 is formed by ALD, for example. Part of the aluminum oxide layer 74 eventually turns into the first gate insulating film 18*a*.

Figure 45:
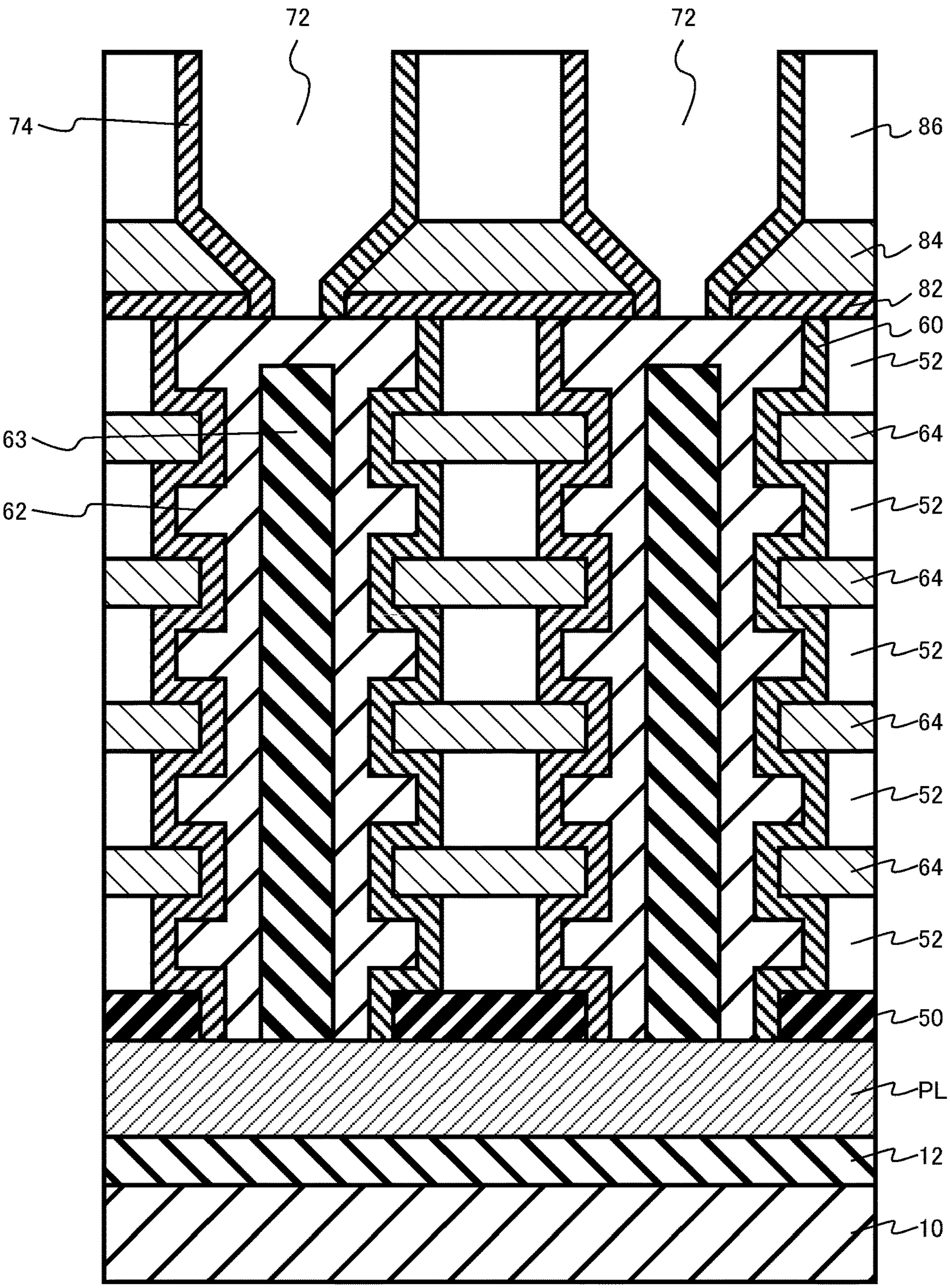
FIG. 45 is a schematic cross-sectional diagram illustrating a method for manufacturing the storage device of the second embodiment.

Etching is then performed on the aluminum oxide layer 74 at the bottoms of the openings 72 (FIG. 45). The amorphous silicon films are exposed through the bottoms of the openings 72. The etching of the aluminum oxide layer 74 is performed by RIE, for example.

Figure 46:
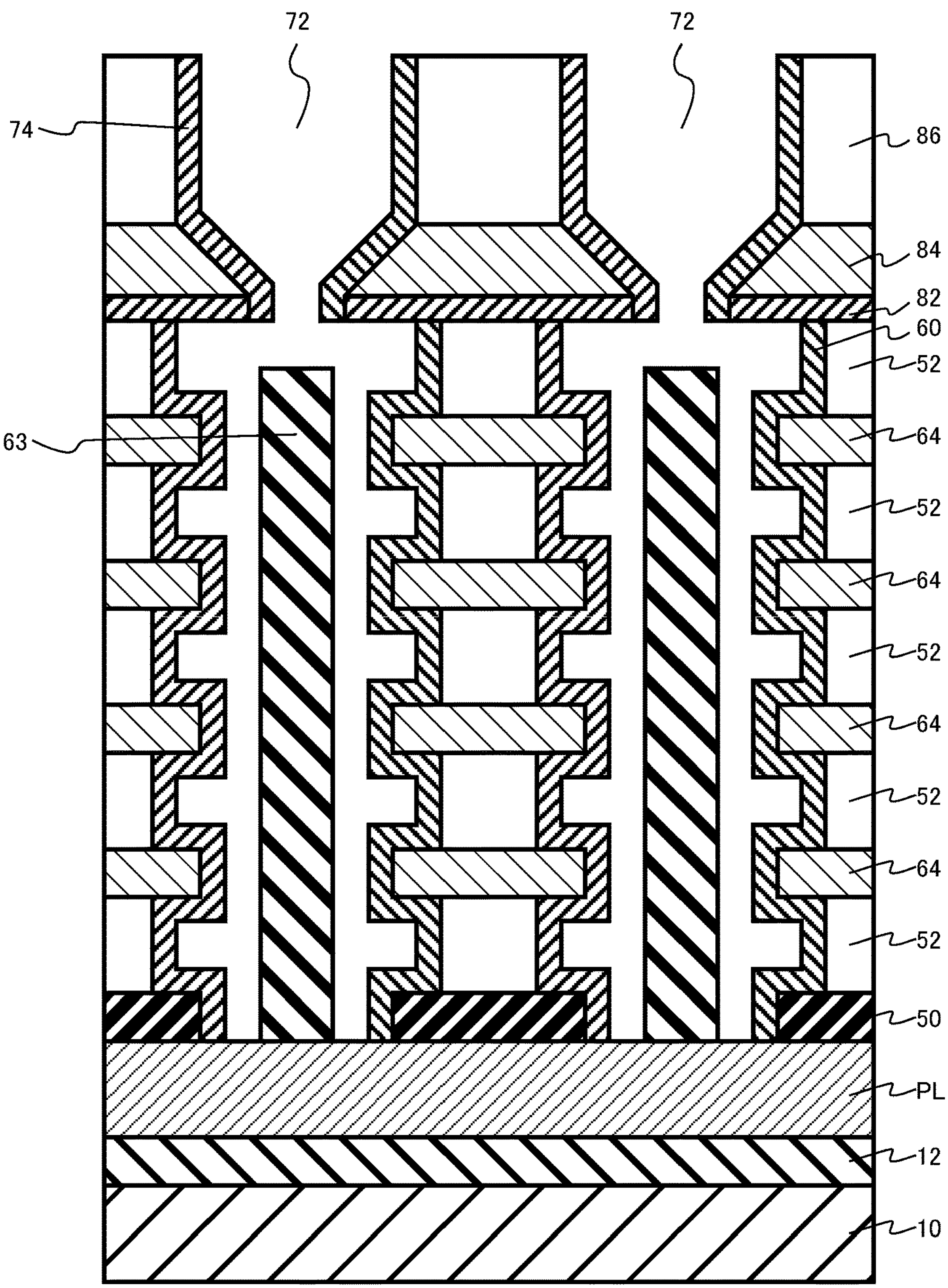
FIG. 46 is a schematic cross-sectional diagram illustrating a method for manufacturing the storage device of the second embodiment.

The amorphous silicon films 62 are then removed (FIG. 46). The amorphous silicon films 62 are removed by wet etching, for example.

Figure 47:
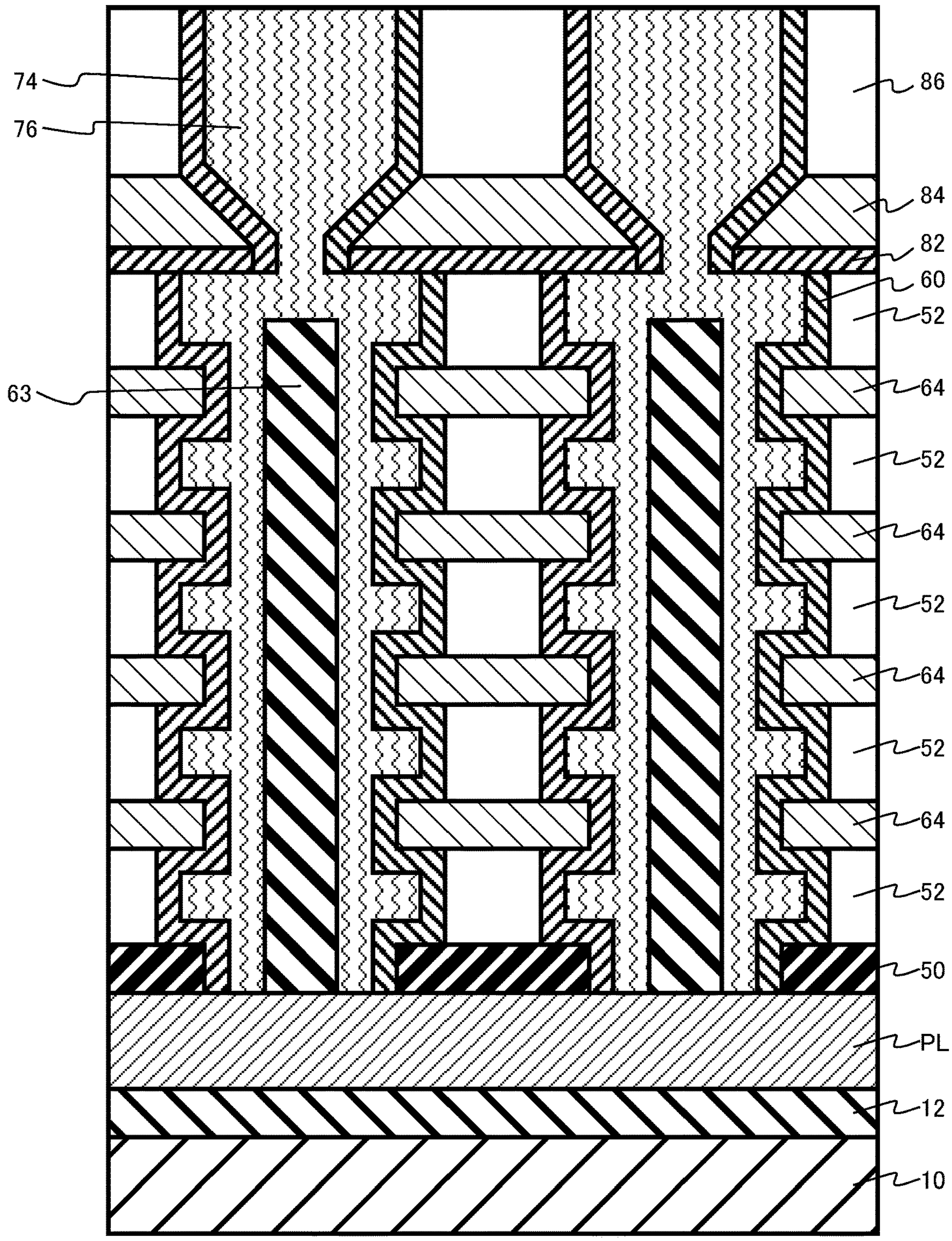
FIG. 47 is a schematic cross-sectional diagram illustrating a method for manufacturing the storage device of the second embodiment.

A liquid 76 is then injected into the openings 72 (FIG. 47). The liquid 76 is an ionic liquid, for example. The liquid 76 eventually turns into the fluid layer 22.

Figure 48:
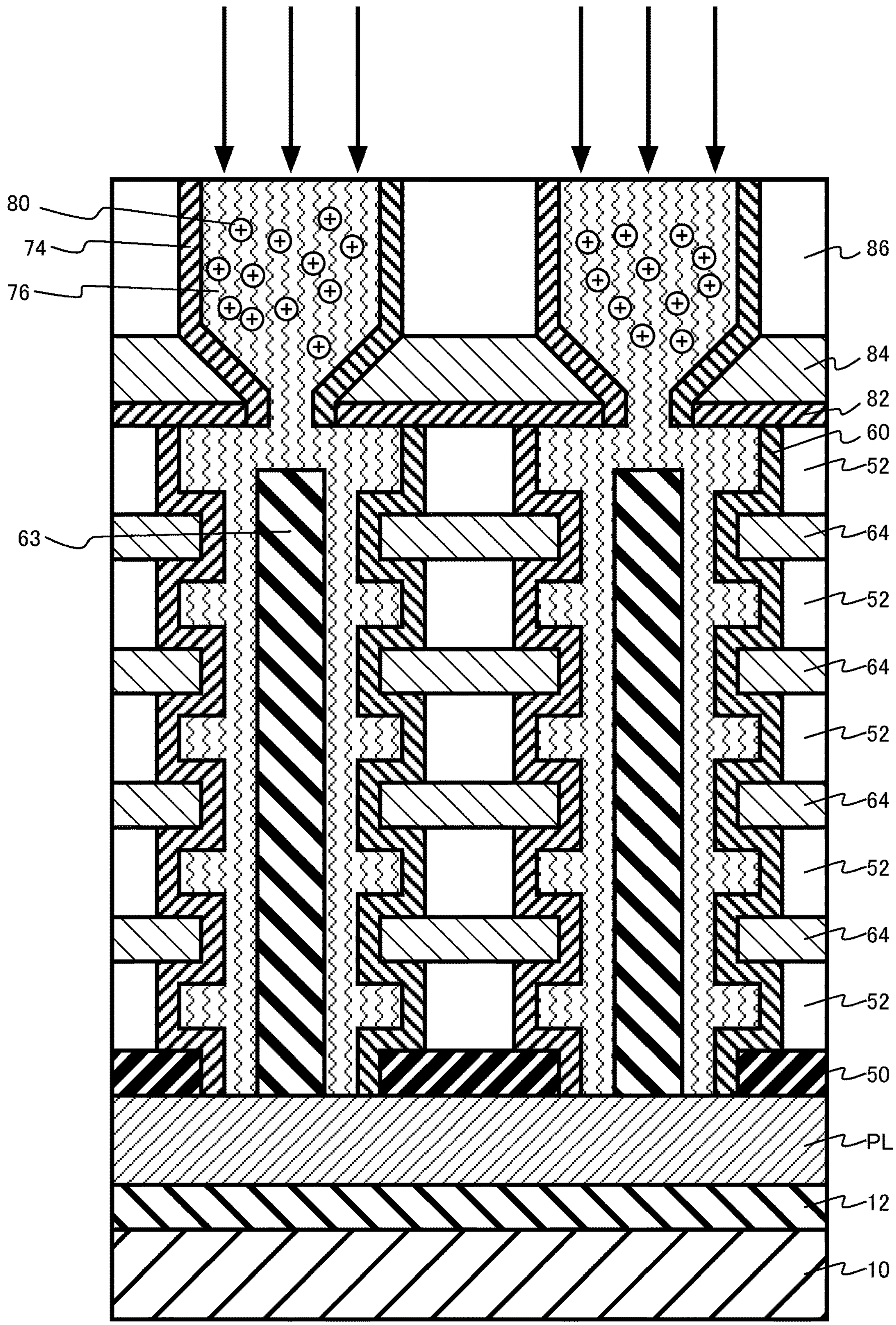
FIG. 48 is a schematic cross-sectional diagram illustrating a method for manufacturing the storage device of the second embodiment.

Particles 80 are then injected into the liquid 76 (FIG. 48). The particles 80 are metal nanoparticles, for example. The particles 80 are injected by a sputtering technique, for example. The particles 80 turn into positively charged particles in the liquid 76, for example. The particles 80 eventually turn into the charged particles 24.

Figure 49:
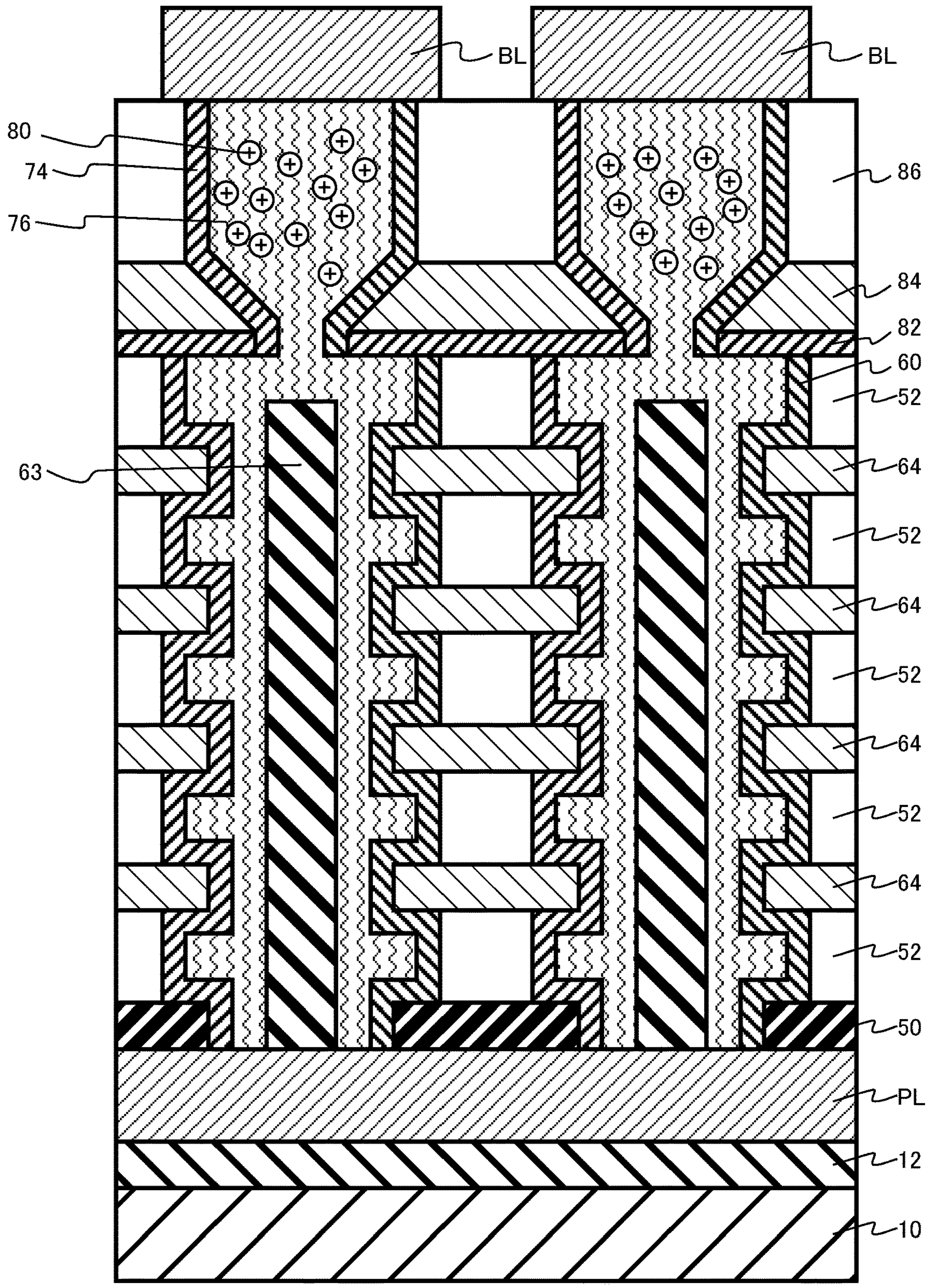
FIG. 49 is a schematic cross-sectional diagram illustrating a method for manufacturing the storage device of the second embodiment.

The bit lines BL are then formed on the liquid 76 (FIG. 49). The bit lines BL contain tungsten, for example. The bit lines BL are formed by CVD, a lithographic technique, and RIE, for example.

By the above manufacturing method, the memory cell array 201 of the nonvolatile memory of the second embodiment is manufactured.

In the nonvolatile memory of the second embodiment, the memory cells MC are three-dimensionally disposed, as in the nonvolatile memory 100 of the first embodiment. Thus, the capacity of the nonvolatile memory can be increased.

Further, the data in the nonvolatile memory of the second embodiment is based on the number of the charged particles 24 existing in the fluid layer 22 of the memory cells MC, like the data in the nonvolatile memory 100 of the first embodiment. Accordingly, the data to be stored in one memory cell MC can be easily made multi-valued data. Multi-valued data can also be stably read from a memory cell MC. Further, multi-valued data can be stably written into a memory cell MC.

The nonvolatile memory of the second embodiment further includes the core insulators 26. For example, the widths of the core insulators 26 are made to vary in the second direction, so that the volume of the fluid layer 22 of the memory cells MC can be adjusted. Thus, the volume of the fluid layer 22 of the memory cells MC can be easily optimized, and a nonvolatile memory having excellent characteristics can be provided.

Further, the cock gate electrode CG of the nonvolatile memory of the second embodiment has a tapered shape. As the cock gate electrode CG has a tapered shape, the first cross-sectional area (S1 in FIG. 29A) of the fluid layer 22 in the first cross-section (the A-A' cross-section) perpendicular to the first direction, the first cross-section including the cock gate electrode CG can be easily reduced.

As the first cross-sectional area S1 is made smaller, the channel region of the cock transistor becomes narrower. Accordingly, it becomes easier to allow the charged particles 24 to pass one by one. In this manner, the number of charged particles 24 passing through the cock transistor can be easily counted. Thus, the data read accuracy and write accuracy become higher.

As described above, like the first embodiment, the second embodiment can provide a storage device capable of storing multi-valued data into each one memory cell.

Third Embodiment

A storage device of a third embodiment differs from the storage device of the first embodiment in that the second control electrode and the third control electrode are electrically separated from each other. In the description below, part of the same contents as the first embodiment will not be repeated.

The storage device of the third embodiment is a nonvolatile memory in which memory cells are three-dimensionally disposed. In the nonvolatile memory, the memory cells store data, using charged particles in a fluid layer.

Figure 50:
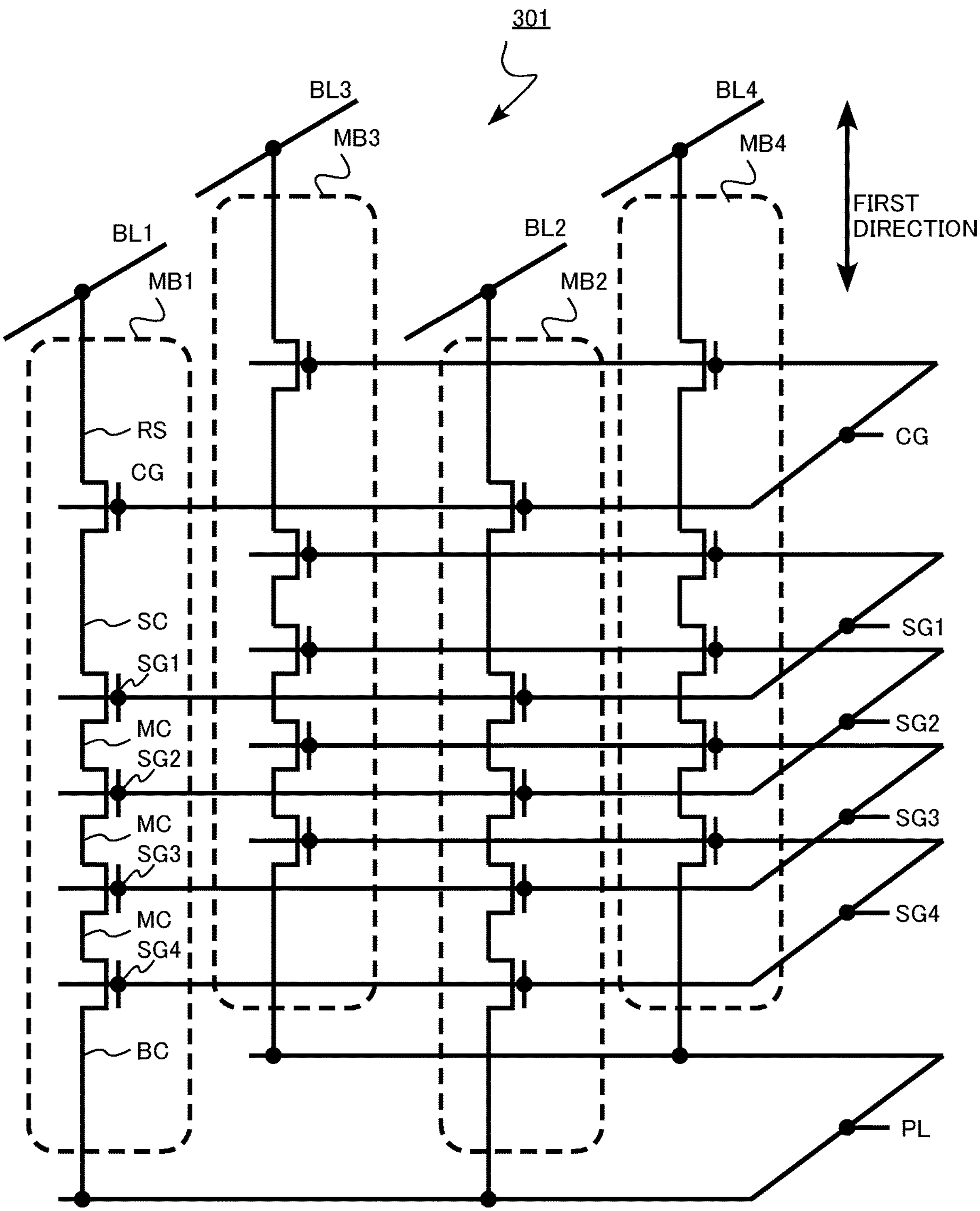
FIG. 50 is an equivalent circuit diagram of the memory cell array of a storage device of a third embodiment.

FIG. 50 is an equivalent circuit diagram of the memory cell array of the storage device of the third embodiment.

As shown in FIG. 50, the memory cell array 301 includes a first bit line BL1, a second bit line BL2, a third bit line BL3, a fourth bit line BL4, a plate electrode PL, a cock gate electrode CG, a first storage gate electrode SG1, a second storage gate electrode SG2, a third storage gate electrode SG3, a fourth storage gate electrode SG4, a first memory bottle MB1, a second memory bottle MB2, a third memory bottle MB3, and a fourth memory bottle MB4.

Hereinafter, the first bit line BL1, the second bit line BL2, the third bit line BL3, and the fourth bit line BL4 may be mentioned individually of one another, or may be collectively referred to as the bit lines BL. Also, the first storage gate electrode SG1, the second storage gate electrode SG2, the third storage gate electrode SG3, and the fourth storage gate electrode SG4 may be mentioned individually of one another, or may be collectively referred to as the storage gate electrodes SG. Further, the first memory bottle MB1, the second memory bottle MB2, the third memory bottle MB3, and the fourth memory bottle MB4 may be mentioned individually of one another, or may be collectively referred to as the memory bottles MB.

A plurality of storage gate electrodes SG is provided between the bit lines BL and the plate electrode PL. The plurality of storage gate electrodes SG is disposed in a first direction. The storage gate electrodes SG are electrically separated from one another.

The first direction is the direction from the bit lines BL toward the plate electrode PL. The direction from the plate electrode PL toward the bit lines BL is also referred to as the first direction.

The cock gate electrode CG is provided between the bit lines BL and the plurality of storage gate electrodes SG. The cock gate electrode CG and the plurality of storage gate electrodes SG are electrically separated from each other.

The memory bottles MB are provided between the bit lines BL and the plate electrode PL. The memory bottles MB extend in the first direction.

One bit line BL is connected to one memory bottle MB. The plate electrode PL is shared among the memory bottles MB.

Each memory bottle MB includes a reservoir RS, a standby cell SC, a plurality of memory cells MC, and a buffer cell BC that are connected in series between the bit line BL and the plate electrode PL. One memory cell MC is interposed between two transistors. Each transistor includes a storage gate electrode SG as its gate electrode. The standby cell SC is interposed between a transistor including the cock gate electrode CG and a transistor including a storage gate electrode SG as its gate electrode.

Hereinafter, a transistor including a storage gate electrode SG as its gate electrode will be referred to as a storage transistor, and a transistor including the cock gate electrode CG will be referred to as a cock transistor.

Figure 51:
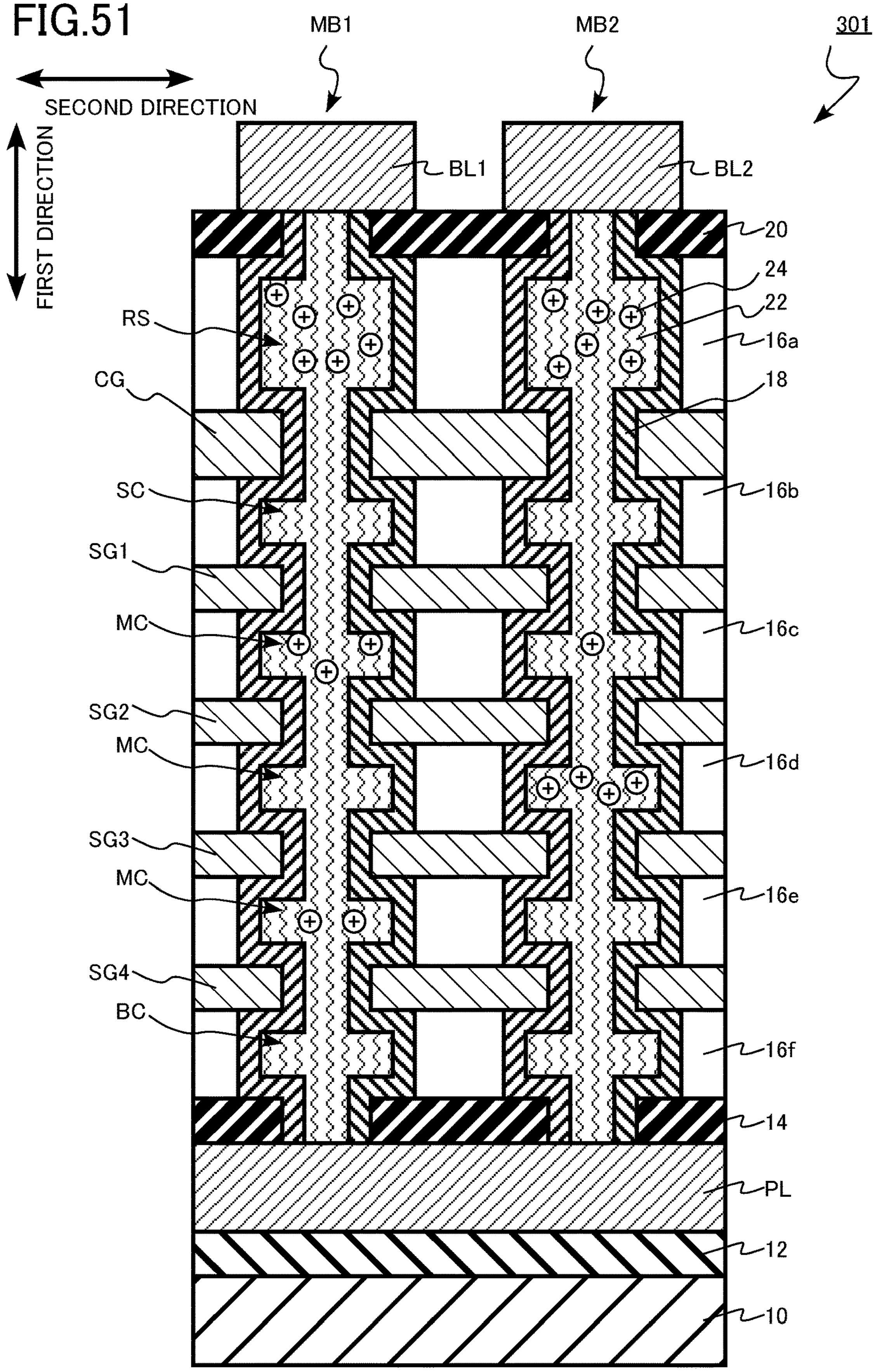
FIG. 51 is a schematic cross-sectional view of the storage device of the third embodiment.

FIG. 51 is a schematic cross-sectional view of the storage device of the third embodiment. FIG. 51 is a schematic cross-sectional view of the memory cell array 301.

The memory cell array 301 includes a semiconductor substrate 10, a substrate insulating layer 12, a lower insulating layer 14, a first interlayer insulating layer 16*a*, a second interlayer insulating layer 16*b*, a third interlayer insulating layer 16*c*, a fourth interlayer insulating layer 16*d*, a fifth interlayer insulating layer 16*e*, a sixth interlayer insulating layer 16*f*, a gate insulating film 18, an upper insulating layer 20, a fluid layer 22, and a plurality of charged particles 24. The memory cell array 301 also includes the first bit line BL1, the second bit line BL2, the plate electrode PL, the cock gate electrode CG, the first storage gate electrode SG1, the second storage gate electrode SG2, the third storage gate electrode SG3, and the fourth storage gate electrode SG4. The memory cell array 301 further includes a reservoir RS, a standby cell SC, a plurality of memory cells MC, and a buffer cell BC.

The region of the fluid layer 22 surrounded by the first interlayer insulating layer 16*a* functions as the reservoir RS. The region of the fluid layer 22 surrounded by the second interlayer insulating layer 16*b* functions as the standby cell SC. The region of the fluid layer 22 surrounded by the third interlayer insulating layer 16*c*, the region of the fluid layer 22 surrounded by the fourth interlayer insulating layer 16*d*, and the region of the fluid layer 22 surrounded by the fifth interlayer insulating layer 16*e* each function as a memory cell MC. The region of the fluid layer 22 surrounded by the sixth interlayer insulating layer 16*f* functions as the buffer cell BC.

Next, operations of the nonvolatile memory of the third embodiment are described. In particular, a read operation of the nonvolatile memory is described.

During a read operation and a write operation, the nonvolatile memory of the third embodiment transfers the data stored in the memory cells MCs connected in series in a memory bottle MB to the adjacent memory cells MC.

Unlike a read operation of the nonvolatile memory of the first embodiment, a read operation of the nonvolatile memory of the third embodiment is non-destructive reading in which the data stored in the memory cells MC is saved even after the data is read out. The nonvolatile memory of the third embodiment uses the buffer cell BC, and independently controls the electrically separated storage gate electrodes SG, to perform non-destructive reading.

Figure 52A:
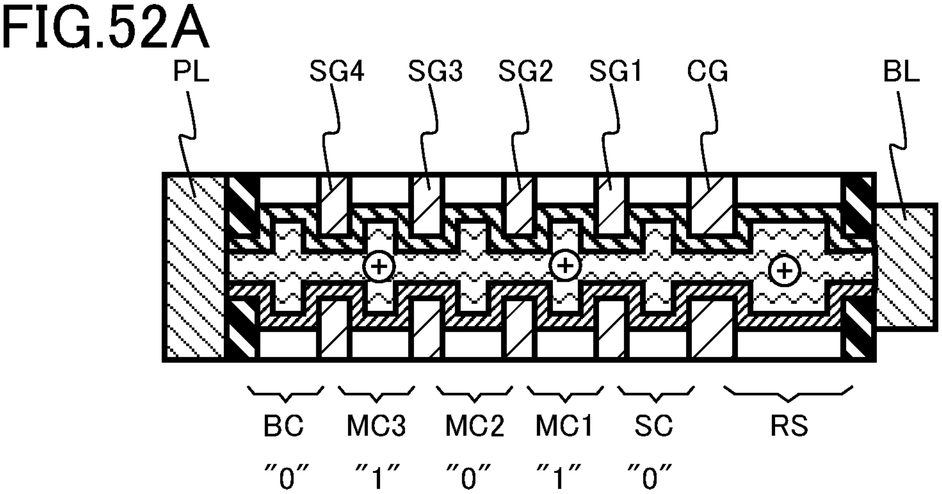
FIGS. 52A and 52B are diagrams for explaining an operation of the storage device of the third embodiment.
Figure 52B:
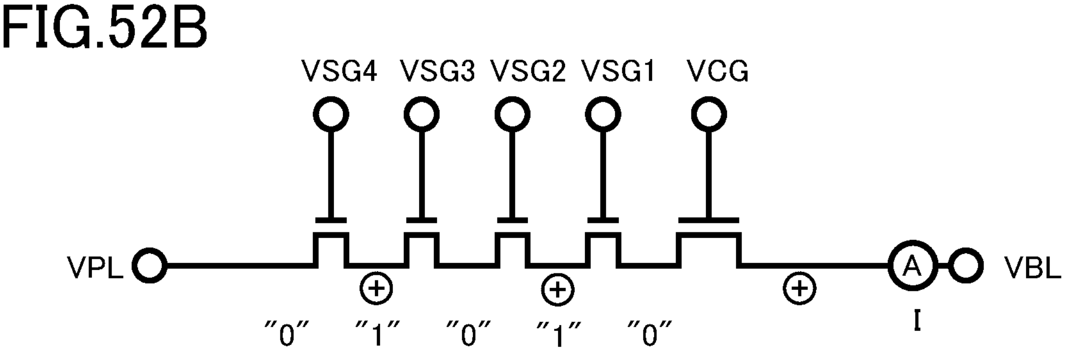

FIGS. 52A and 52B are diagrams for explaining an operation of the storage device of the third embodiment. FIG. 52A is a schematic diagram of one memory bottle MB. FIG. 52B is an equivalent circuit diagram of one memory bottle MB.

In the example case described below, the number of memory cells MC is three. The three memory cells MC are a first memory cell MC1, a second memory cell MC2, and a third memory cell MC3 in this order in the direction from the bit line BL toward the plate electrode PL. In the example case described below, the charged particles are positively charged.

As shown in FIG. 52B, a bit line voltage VBL is applied to the bit line BL. A plate voltage VPL is applied to the plate electrode PL. A cock gate voltage VCG is applied to the cock gate electrode CG. A storage gate voltage VSG1 is applied to the first storage gate electrode SG1. A storage gate voltage VSG2 is applied to the second storage gate electrode SG2. A storage gate voltage VSG3 is applied to the third storage gate electrode SG3. A storage gate voltage VSG4 is applied to the fourth storage gate electrode SG4. The first storage gate electrode SG1, the second storage gate electrode SG2, the third storage gate electrode SG3, and the fourth storage gate electrode SG4 are electrically separated, and voltages can be applied to these storage gate electrodes independently of one another.

The nonvolatile memory monitors the current I flowing in the bit line BL, as shown in FIG. 52B. On the basis of the current I flowing in the bit line BL, data is read from the memory cells MC, and data is written into the memory cells MC.

As shown in FIGS. 52A and 52B, a case where data “1” is stored in the first memory cell MC1, data “0” is stored in the second memory cell MC2, and data “1” is stored in the third memory cell MC3 in the initial state is described below as an example. Note that any charged particle does not exist in the standby cell SC and the buffer cell BC. The standby cell SC and the buffer cell BC are in the state corresponding to data “0”.

Figure 53A:
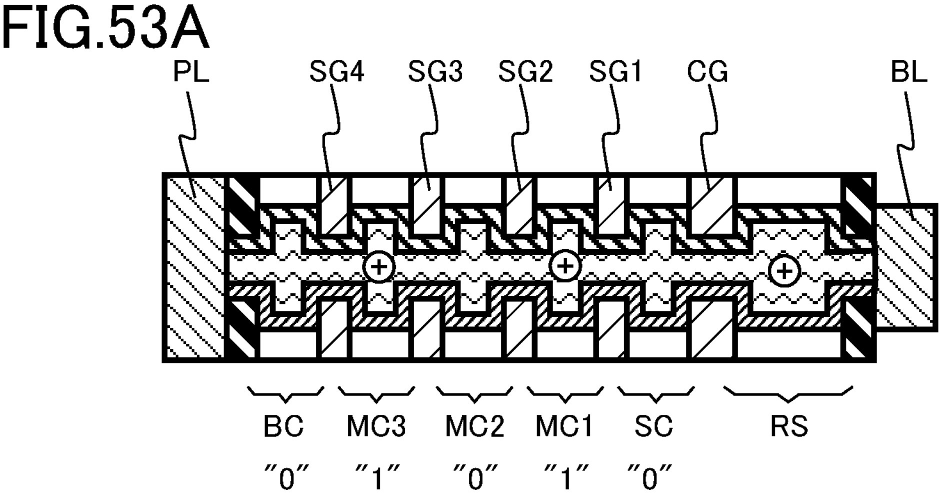
FIGS. 53A, 53B, and 53C are diagrams for explaining a data holding state of the storage device of the third embodiment.
Figure 53B:
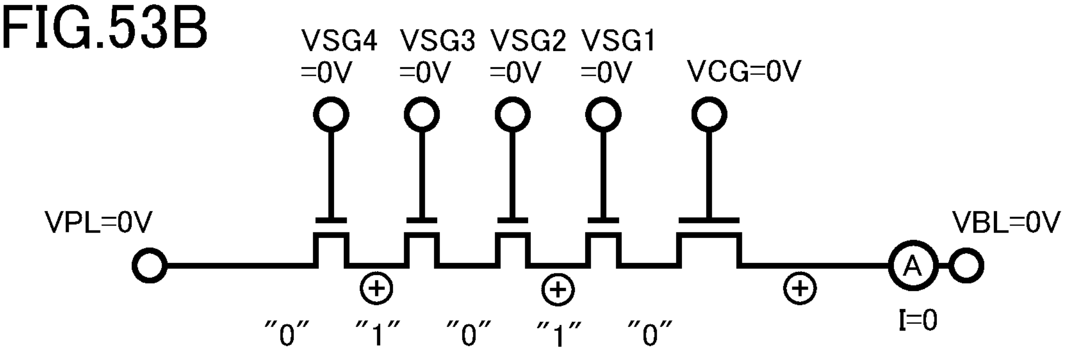
Figure 53C:

FIGS. 53A, 53B, and 53C are diagrams for explaining a data holding state of the storage device of the third embodiment. FIG. 53A is a schematic diagram of one memory bottle MB. FIG. 53B is an equivalent circuit diagram of the one memory bottle MB. FIG. 53C is a diagram showing the electrostatic potential distribution in the fluid layer in the memory bottle MB.

In the data holding state, the bit line voltage VBL is 0 V, the plate voltage VPL is 0 V, the cock gate voltage VCG is 0 V, the storage gate voltage VSG1, the storage gate voltage VSG2, the storage gate voltage VSG3, and the storage gate voltage VSG4 are 0 V. No voltage is applied between the bit line BL and the plate electrode PL.

Next, a read operation of the nonvolatile memory of the third embodiment is described.

Figure 54A:
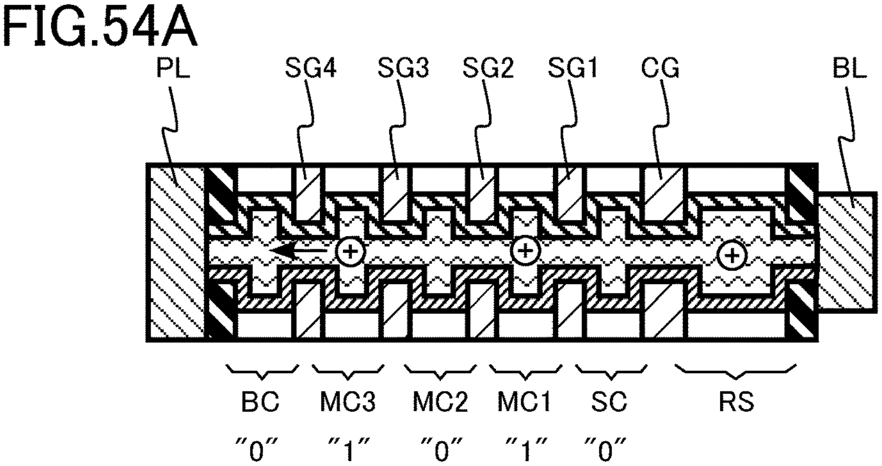
FIGS. 54A, 54B, and 54C are diagrams for explaining a read operation of the storage device of the third embodiment.
Figure 54B:
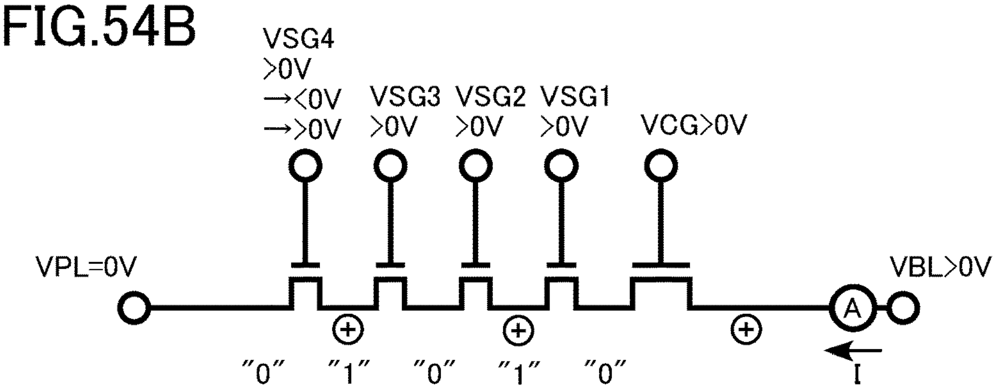
Figure 54C:
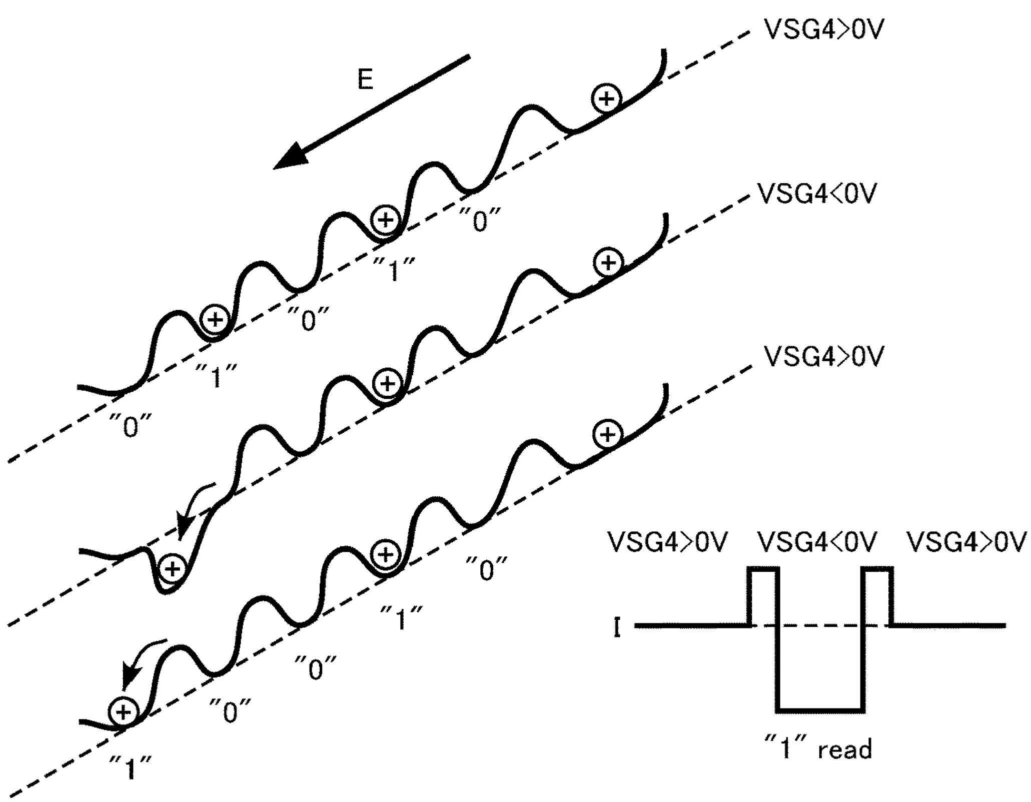
Figure 55A:
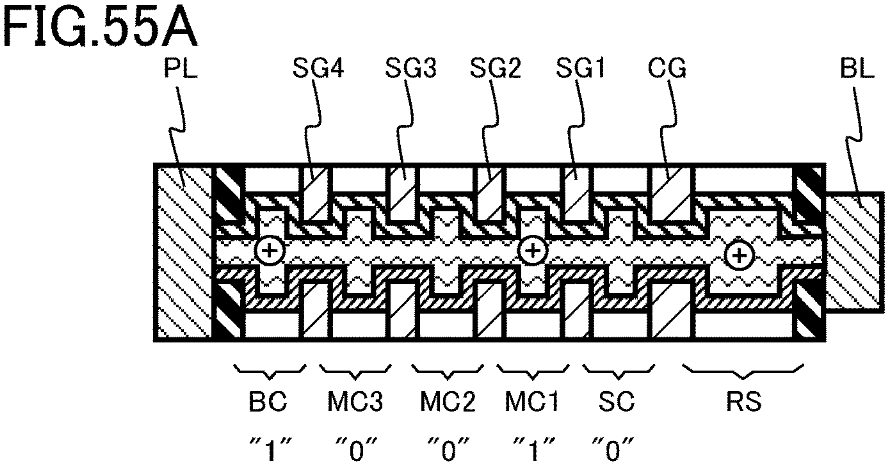
FIGS. 55A, 55B, and 55C are diagrams for explaining a read operation of the storage device of the third embodiment.
Figure 55B:
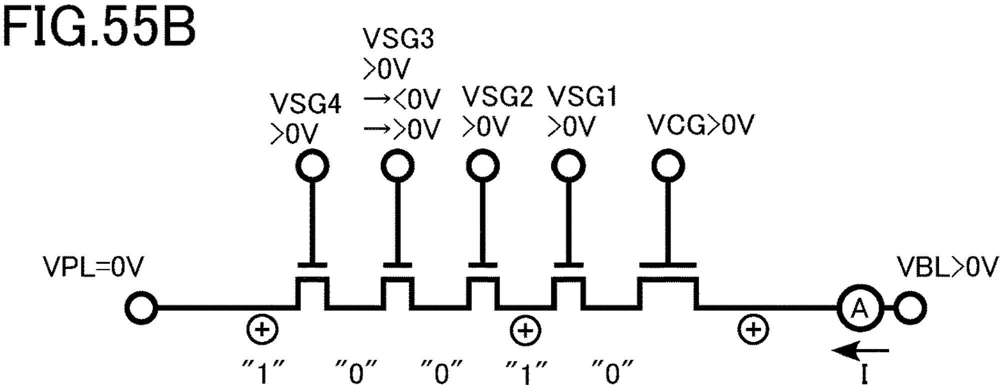
Figure 55C:
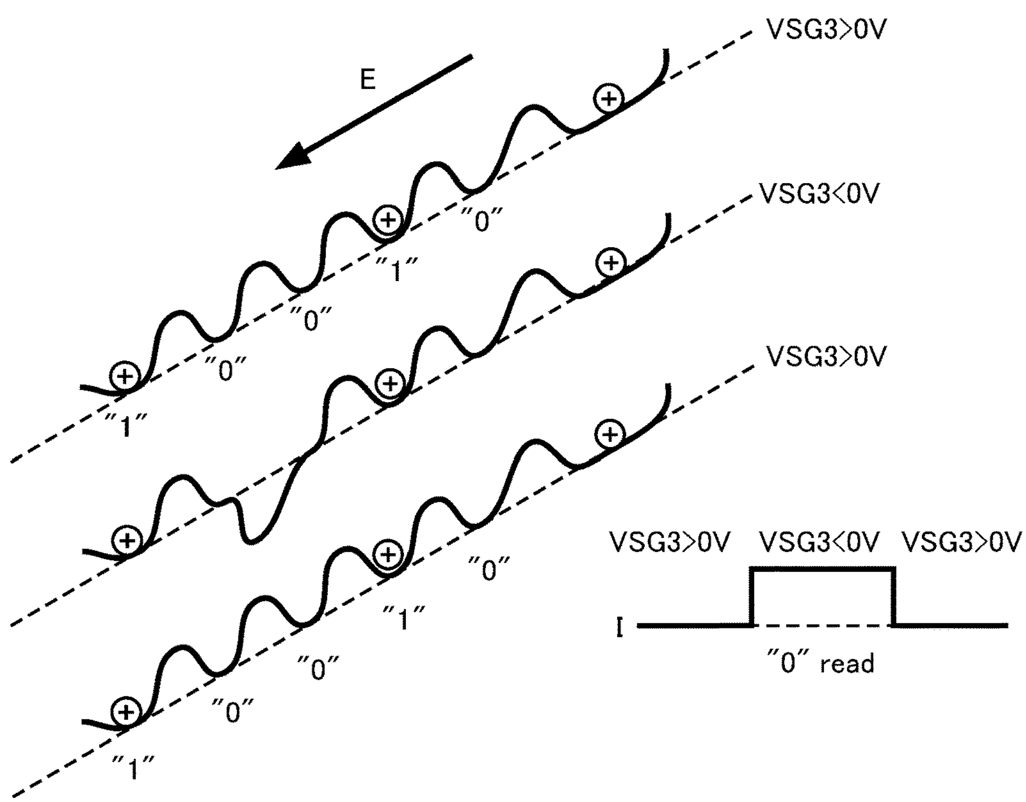
Figure 56A:
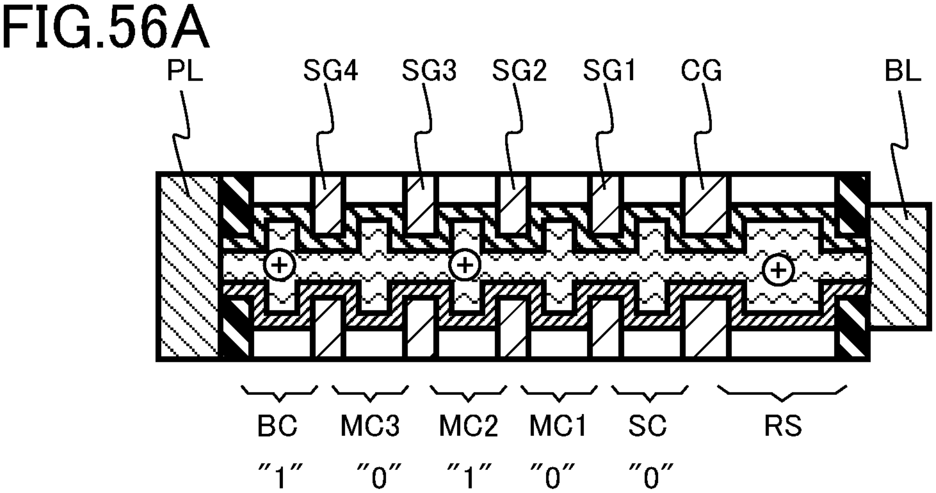
FIGS. 56A, 56B, and 56C are diagrams for explaining a read operation of the storage device of the third embodiment.
Figure 56B:
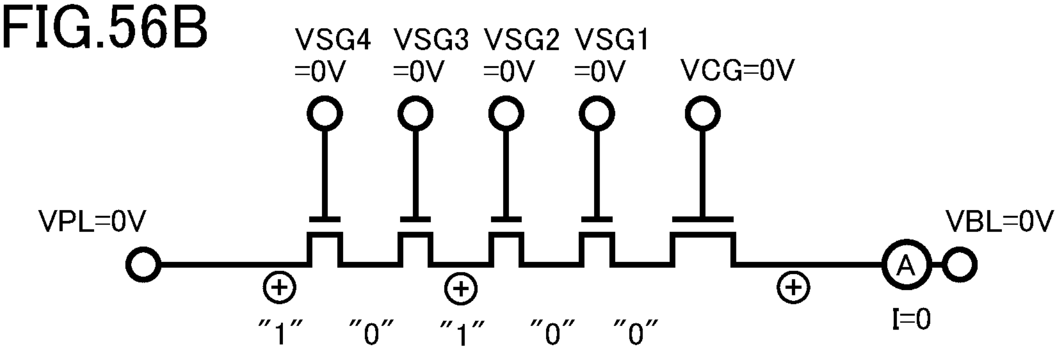
Figure 56C:
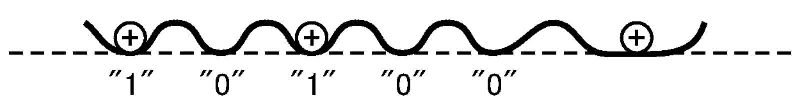

FIGS. 54A, 54B, 54C, 55A, 55B, 55C, 56A, 56B, and 56C are diagrams for explaining a read operation of the storage device of the third embodiment. FIGS. 54A, 55A, and 56A are schematic views of one memory bottle MB. FIGS. 54B, 55B, and 56B are equivalent circuit diagrams of the one memory bottle MB. FIGS. 54C, 55C, and 56C are diagrams showing the electrostatic potential distribution in the fluid layer in the memory bottle MB.

In the nonvolatile memory of the third embodiment, the charged particles are moved to the respective adjacent cells, so that the data stored in the first memory cell MC1, the second memory cell MC2, and the third memory cell MC3 is read out.

Reading of the data “1” stored in the third memory cell MC3 is first described.

First, as shown in FIG. 54B, the bit line voltage VBL is set to a positive voltage, the plate voltage VPL is set to 0 V, and the cock gate voltage VCG is set to a positive voltage. The storage gate voltages VSG1, VSG2, and VSG3 are set to a positive voltage. The storage gate voltage VSG4 is changed from a positive voltage to a negative voltage, or from a negative voltage to a positive voltage.

As shown in FIG. 54C, the bit line voltage VBL is set to a positive voltage, and the plate voltage VPL is set to 0 V, so that an electric field E is induced in the direction from the bit line BL toward the plate electrode PL. Because of this electric field E, an ionic current from the bit line BL toward the plate electrode PL flows in the fluid layer.

When the storage gate voltage VSG4 is a positive voltage, the energy barriers between the respective cells are high. Therefore, when the electric field E is applied, charged particle movement is restricted.

When the storage gate voltage VSG4 switches to a negative voltage, the electrostatic potential of the fluid layer facing the fourth storage gate electrode SG4 drops, and an electrostatic potential valley is formed. The charged particle held in the third memory cell MC3 moves toward the plate electrode PL, and falls into the electrostatic potential valley.

When the storage gate voltage VSG4 switches to a positive voltage, the electrostatic potential of the fluid layer facing the fourth storage gate electrode SG4 rises. Therefore, the charged particle moves toward the plate electrode PL, and moves into the buffer cell BC.

Note that the charged particle held in the first memory cell MC1 does not move, and stays in the first memory cell MC1.

As indicated by the current waveforms in FIG. 54C, when the storage gate voltage VSG4 switches to a negative voltage, the current I flowing in the bit line BL rises temporarily, then falls, and then rises again.

The current I flowing in the bit line BL rises temporarily, supposedly because the channel resistance of the storage transistor drops with a decrease in the electrostatic potential of the fluid layer facing the fourth storage gate electrode SG4. That is, the current I flowing in the bit line BL rises temporarily, supposedly because the ionic current flowing in the storage transistor increases with a decrease in the channel resistance.

The current I flowing in the bit line BL decreases after that, supposedly because the charged particle passes through the channel of the storage transistor. That is, the current I flowing in the bit line BL decreases, supposedly because the ionic current flowing in the storage transistor decreases, being hindered by the charged particle.

The current I flowing in the bit line BL is monitored in this manner, and the change in the current I is detected. Thus, the data "1" stored in the third memory cell MC3 can be read out.

After the data in the third memory cell MC3 is read out, the first memory cell MC1 is maintained in a data "1" state, the second memory cell MC2 is maintained in a data "0" state, the third memory cell MC3 is maintained in a data "0" state, and the buffer cell BC is maintained in a data "1" state. The data "1" stored in the third memory cell MC3 in the initial state is not destroyed and is saved in the buffer cell BC.

Next, reading of the data "0" stored in the second memory cell MC2 is described. After the data in the third memory cell MC3 is read out, the data "0" stored in the second memory cell MC2 is saved as it is in the second memory cell MC2.

As shown in FIG. 55B, the bit line voltage VBL is set to a positive voltage, the plate voltage VPL is set to 0 V, and the cock gate voltage VCG is set to a positive voltage. The storage gate voltages VSG1, VSG2, and VSG4 are set to a positive voltage. The storage gate voltage VSG3 is changed from a positive voltage to a negative voltage, or from a negative voltage to a positive voltage.

When the storage gate voltage VSG3 is a positive voltage, the energy barriers between the respective cells are high. Therefore, when the electric field E is applied, charged particle movement is restricted.

When the storage gate voltage VSG3 switches to a negative voltage, the electrostatic potential of the fluid layer facing the third storage gate electrode SG3 drops, and an electrostatic potential valley is formed. Since there are no charged particles existing in the second memory cell MC2, any charged particle does not move from the second memory cell MC2.

When the storage gate voltage VSG3 switches to a positive voltage, the electrostatic potential of the fluid layer facing the third storage gate electrode SG3 rises. Since there are no charged particles existing in the second memory cell MC2, any charged particle does not move into the third memory cell MC3.

Note that the charged particle held in the first memory cell MC1 does not move, and stays in the first memory cell MC1.

As indicated by the current waveforms of FIG. 55C, when the storage gate voltage VSG3 switches to a negative voltage, the current I flowing in the bit line BL rises temporarily. After that, the current I flowing in the bit line BL does not change and remains constant until the storage gate voltage VSG3 switches back to a positive voltage.

The current I flowing in the bit line BL rises temporarily, supposedly because the channel resistance of the storage transistor drops with a decrease in the electrostatic potential of the fluid layer facing the third storage gate electrode SG3. That is, the current I flowing in the bit line BL rises temporarily, supposedly because the ionic current flowing in the storage transistor increases with a decrease in the channel resistance.

After that, since there are no charged particles existing in the second memory cell MC2, any charged particle does not pass through the channel of the storage transistor. Accordingly, the ionic current flowing in the storage transistor is not hindered by any charged particle. Thus, the ionic current flowing in the storage transistor does not change, and the current I flowing in the bit line BL does not change either.

The current I flowing in the bit line BL is monitored, and no changes in the current I are detected as above, so that the data "0" stored in the second memory cell MC2 can be read out.

After the data in the second memory cell MC2 is read out, the first memory cell MC1 is maintained in a data "1" state, the second memory cell MC2 is maintained in a data "0" state, the third memory cell MC3 is maintained in a data "0" state, and the buffer cell BC is maintained in a data "1" state. The data "0" stored in the second memory cell MC2 in the initial state is not destroyed and is saved in the third memory cell MC3.

After that, the same read operation as described above with reference to FIGS. 54A, 54B, 54C, 55A, 55B, 55C, 56A, 56B, and 56C is performed. By this read operation, the data "1" stored in the first memory cell MC1 in the initial state can be read out.

As shown in FIGS. 56A to 56C, after the data in the first memory cell MC1 is read out, the first memory cell MC1 is maintained in a data "0" state, the second memory cell MC2 is maintained in a data "1" state, the third memory cell MC3 is maintained in a data "0" state, and the buffer cell BC is maintained in a data "1" state.

At this stage, the data held in the first memory cell MC1, the data held in the second memory cell MC2, and the data held in the third memory cell MC3 in the initial state are stored in the second memory cell MC2, the third memory cell MC3, and the buffer cell BC, respectively.

After that, a reset operation is performed to return the data held in the first memory cell MC1, the data held in the second memory cell MC2, and the data held in the third memory cell MC3 to the initial state. First, voltage application is performed so that the bit line voltage VBL switches to 0V, and the plate voltage VPL switches to a positive voltage. As a result, the electric field E is induced in the direction from the plate electrode PL toward the bit line BL. The storage gate voltages VSG2, VSG3, and VSG4 are then simultaneously changed from a positive voltage to a negative voltage, or from a negative voltage to a positive voltage.

As the storage gate voltages VSG are changed from a positive voltage to a negative voltage, or from a negative voltage to a positive voltage, the charged particles move toward the bit line BL and move into the respective adjacent cells. The charged particles move into the adjacent cells located on the side of the bit line BL, and the data is transferred. For example, the charged particle existing in the buffer cell BC moves into the third memory cell MC3. The data in the third memory cell MC3 becomes data "1". Also, the data "0" in the third memory cell MC3 is transferred to the second memory cell MC2, and the second memory cell MC2 enters a "0" state. Further, the data "1" in the second memory cell MC2 is transferred to the first memory cell MC1, and the first memory cell MC1 enters a "1" state.

By the reset operation, the data held in the first memory cell MC1, the data held in the second memory cell MC2, and the data held in the third memory cell MC3 return to the initial state. That is, the states of the memory cells MC return to states in which data "1" is stored in the first memory cell MC1, data "0" is stored in the second memory cell MC2, and data "1" is stored in the third memory cell MC3.

When data is read out next time, the same read operation as described above with reference to FIGS. 54A, 54B, 54C, 55A, 55B, 55C, 56A, 56B, and 56C is performed.

As described above, the nonvolatile memory of the third embodiment uses the buffer cell BC, and independently controls the electrically separated storage gate electrodes SG, to perform non-destructive reading.

In a case where data is to be erased, voltage application is performed so that the bit line voltage VBL is set to 0 V, and the plate voltage VPL is set to a positive voltage, for example. In this state, the storage gate voltages VSG1, VSG2, VSG3, and VSG4, and the cock gate voltage VCG are set to a negative voltage, so that all the charged particles are moved into the reservoir RS. As a result, the data in the first memory cell MC1, the data in the second memory cell MC2, and the data in the third memory cell MC3 are erased, and the first memory cell MC1, the second memory cell MC2, and the third memory cell MC3 all enter a data "0" state.

Also, data can be written into the first memory cell MC1, the second memory cell MC2, and the third memory cell MC3 by the same operation as a write operation of the nonvolatile memory 100 of the first embodiment.

As described above, like the first embodiment, the third embodiment can provide a storage device capable of storing multi-valued data into each one memory cell. Also, a storage device capable of non-destructive reading of stored data can be provided.

Fourth Embodiment

A storage device of a fourth embodiment differs from that of the first embodiment in that the memory cell array has a cross-point structure. In the description below, part of the same contents as the first embodiment will not be repeated.

The storage device of the fourth embodiment is a nonvolatile memory in which the memory cell array has a cross-point structure. In the nonvolatile memory of the fourth embodiment, the memory cells store data, using charged particles in a fluid layer.

Figure 57:
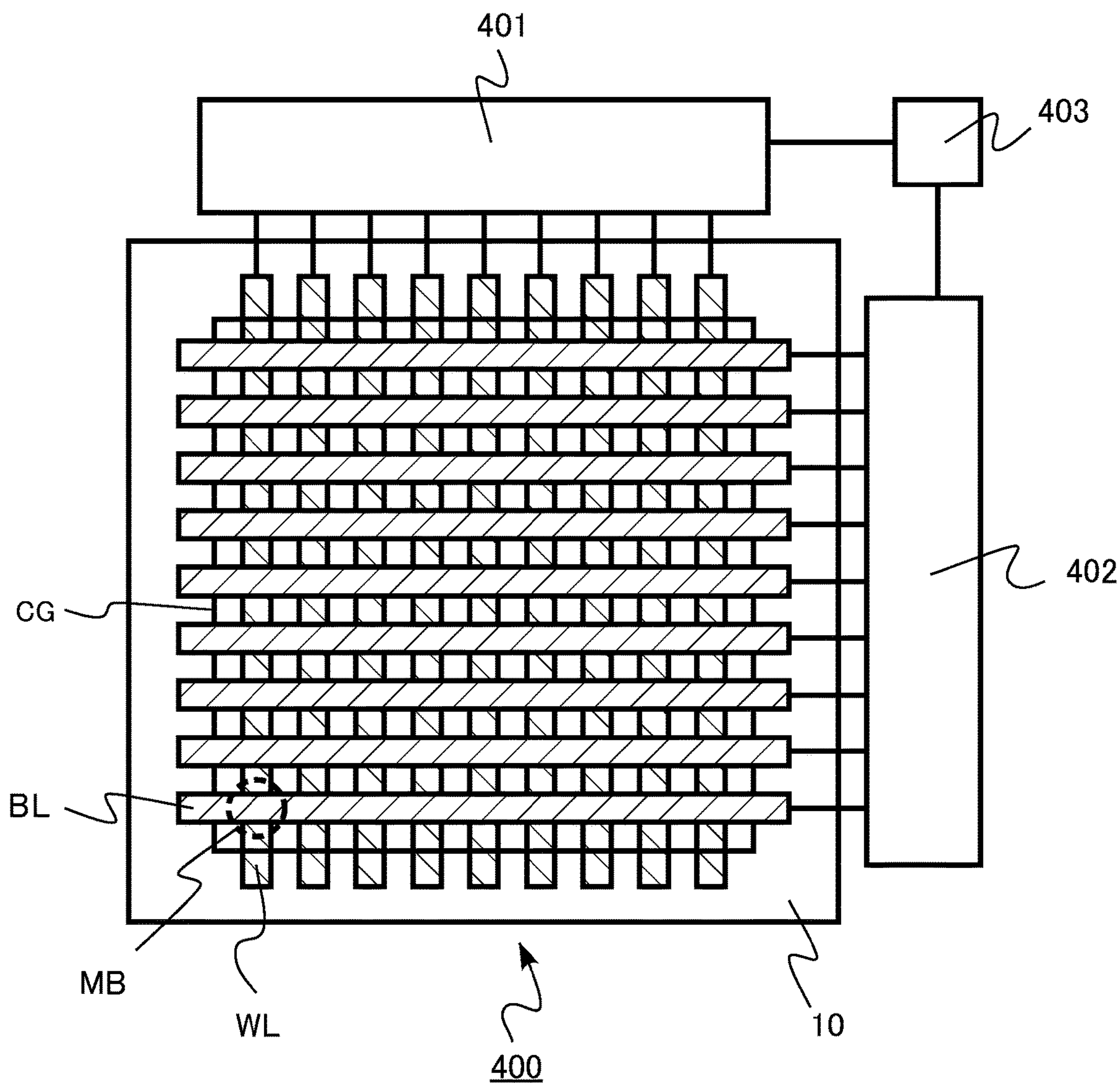
FIG. 57 is a block diagram of the memory cell array and peripheral circuits of a storage device of a fourth embodiment.

FIG. 57 is a block diagram of the memory cell array and peripheral circuits of the storage device of the fourth embodiment. One memory bottle MB is located in the region indicated by a dotted line in the memory cell array 400 shown in FIG. 57.

The memory cell array 400 of the storage device of the fourth embodiment has a plurality of word line WLs and a plurality of bit lines BL intersecting the word lines WL on a semiconductor substrate 10 via an insulating layer (not shown), for example. The bit lines BL are provided on the upper layers of the word lines WL, for example. A cock gate electrode CG is provided between the word lines WL and the bit lines BL.

A first control circuit 401, a second control circuit 402, and a sense circuit 403 are provided as peripheral circuits around the memory cell array 400.

A plurality of memory bottles MB is provided in the regions where the word lines WL and the bit lines BL intersect.

Each of the word lines WL is connected to the first control circuit 401. Each of the bit lines BL is connected to the second control circuit 402. The sense circuit 403 is connected to the first control circuit 401 and the second control circuit 402.

The first control circuit 401 and the second control circuit 402 each have the functions to select a desired a desired memory bottle MB, write data into the memory cells MC of the selected memory bottle MB, read data from the memory cells MC, and erase data from the memory cells MC, for example.

When data is to be read, the data in a memory cell MC is read as the current flowing between the word line WL and the bit line BL. The sense circuit 403 has the function to determine the current and determine the polarity of the data. The sense circuit 403 determines whether the data is "0" or whether the data is "1", for example. The sense circuit 403 monitors the current flowing in the memory bottle MB, to determine the polarity of the data.

The first control circuit 401, the second control circuit 402, and the sense circuit 403 are formed with electronic circuits using semiconductor devices formed on the semiconductor substrate 10, for example.

Figure 58:
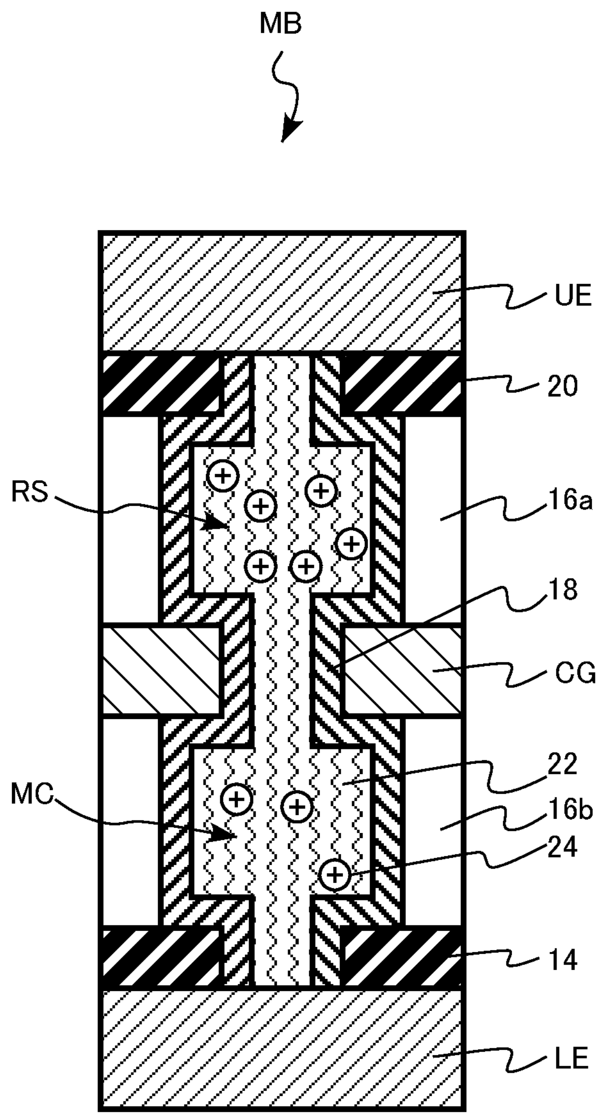
FIG. 58 is a schematic cross-sectional view of the storage device of the fourth embodiment.

FIG. 58 is a schematic cross-sectional view of the storage device of the fourth embodiment. FIG. 58 is a schematic cross-sectional view of one memory bottle MB in the memory cell array 400. FIG. 58 is a cross-section parallel to the direction from the word line WL toward the bit line BL.

The memory bottle MB includes a lower insulating layer 14, a first interlayer insulating layer 16*a*, a second interlayer insulating layer 16*b*, a gate insulating film 18, an upper insulating layer 20, a fluid layer 22, and a plurality of charged particles 24. The memory bottle MB includes an upper electrode UE, a lower electrode LE, and the cock gate electrode CG. The memory bottle MB also includes a reservoir RS and a memory cell MC.

The upper electrode UE is an example of the first conductive layer. The lower electrode LE is an example of the second conductive layer.

The cock gate electrode CG is an example of the first control electrode. The cock gate electrode CG is a plate-like conductor, for example. Each memory bottle MB is formed through the plate-like cock gate electrode CG, for example.

The first interlayer insulating layer 16*a* is an example of the first insulating layer. The second interlayer insulating layer 16*b* is an example of the second insulating layer. The gate insulating film 18 is an example of the insulating film. The charged particles 24 are an example of the particles.

The upper electrode UE is electrically connected to the bit line BL. The bit line BL may also serve as the upper electrode UE. The lower electrode LE is electrically connected to the word line WL. The word line WL may also serve as the lower electrode LE.

The storage device of the fourth embodiment controls the voltages to be applied to the upper electrode UE, the lower electrode LE, and the cock gate electrode CG, so that the data stored in a memory cell MC can be read out, and data can be read into a memory cell MC. Note that reading of the data stored in a memory cell MC is destructive reading.

The data in the nonvolatile memory of the fourth embodiment is based on the number of the charged particles 24 existing in the fluid layer 22 of a memory cell MC. Accordingly, the data to be stored in one memory cell MC can be easily made multi-valued data. Multi-valued data can also be stably read from a memory cell MC. Further, multi-valued data can be stably written into a memory cell MC.

For example, a selector element having non-linear current-voltage characteristics can be provided between the bit line BL and the upper electrode UE, or between the lower electrode LE and the word line WL. By the selector element is provided, erroneous reading of data from a memory cell MC can be prevented, for example.

(Modification)

Figure 59:
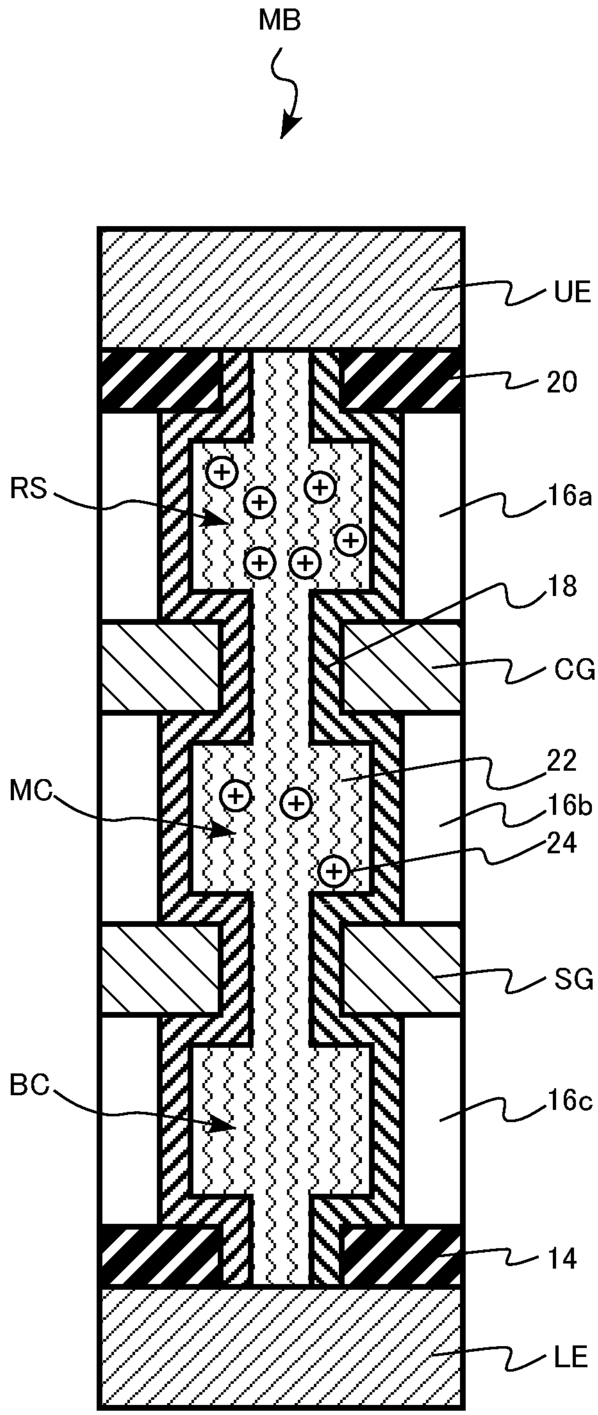
FIG. 59 is a schematic cross-sectional view of a storage device of a modification of the fourth embodiment.

FIG. 59 is a schematic cross-sectional view of a storage device of a modification of the fourth embodiment. A nonvolatile memory of the modification of the fourth embodiment includes a buffer cell BC.

A memory bottle MB of the storage device of the modification includes a lower insulating layer 14, a first interlayer insulating layer 16*a*, a second interlayer insulating layer 16*b*, a third interlayer insulating layer 16*c*, a gate insulating film 18, an upper insulating layer 20, a fluid layer 22, and a plurality of charged particles 24. The memory bottle MB includes an upper electrode UE, a lower electrode LE, a cock gate electrode CG, and a storage gate electrode SG. The memory bottle MB also includes a reservoir RS, a memory cell MC, and a buffer cell BC.

The upper electrode UE is an example of the first conductive layer. The lower electrode LE is an example of the second conductive layer.

The cock gate electrode CG is an example of the first control electrode. The cock gate electrode CG is a plate-like conductor, for example. Each memory bottle MB is formed through the plate-like cock gate electrode CG, for example.

The storage gate electrode SG is an example of the second control electrode. The storage gate electrode SG is a plate-like conductor, for example. Each memory bottle MB is formed through the plate-like storage gate electrode SG, for example.

The first interlayer insulating layer 16*a* is an example of the first insulating layer. The second interlayer insulating layer 16*b* is an example of the second insulating layer. The third interlayer insulating layer 16*c* is an example of the third insulating layer. The gate insulating film 18 is an example of the insulating film. The charged particles 24 are an example of the particles.

The nonvolatile memory of the modification of the fourth embodiment can save data in the buffer cell BC when the data stored in the memory cell MC is read out. Thus, non-destructive reading of the data stored in the memory cell MC can be performed.

As described above, like the first embodiment, the fourth embodiment and its modification can provide a storage device capable of storing multi-valued data into each one memory cell.

While certain embodiments have been described, these embodiments have been presented by way of example only, and are not intended to limit the scope of the inventions. Indeed, the storage devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A storage device comprising:
- a first conductive layer;
- a second conductive layer;
- a fluid layer provided between the first conductive layer and the second conductive layer;
- particles in the fluid layer;
- a first control electrode provided between the first conductive layer and the second conductive layer;
- a first insulating layer provided between the first conductive layer and the first control electrode, the first insulating layer surrounding the fluid layer; and
- a second insulating layer provided between the first control electrode and the second conductive layer, the second insulating layer surrounding the fluid layer,
- wherein a first cross-sectional area of the fluid layer in a first cross-section perpendicular to a first direction from the first conductive layer toward the second conductive layer is smaller than a second cross-sectional area of the fluid layer in a second cross-section perpendicular to the first direction, the first cross-section includes the first control electrode, and the second cross-section includes the second insulating layer.

2. The storage device according to claim 1, wherein the first control electrode surrounds the fluid layer.

3. The storage device according to claim 1, further comprising:
- a second control electrode provided between the second insulating layer and the second conductive layer; and
- a third insulating layer provided between the second control electrode and the second conductive layer, the third insulating layer surrounding the fluid layer,
- wherein the first cross-sectional area is smaller than a third cross-sectional area of the fluid layer in a third cross-section perpendicular to the first direction, and the third cross-section includes the third insulating layer.

4. The storage device according to claim 3, wherein a fourth cross-sectional area of the fluid layer in a fourth cross-section perpendicular to the first direction is smaller than the second cross-sectional area and the third cross-sectional area, and the fourth cross-section includes the second control electrode.

5. The storage device according to claim 4, wherein the first cross-sectional area is smaller than the fourth cross-sectional area.

6. The storage device according to claim 3, further comprising:
- a third control electrode provided between the third insulating layer and the second conductive layer; and
- a fourth insulating layer provided between the third control electrode and the second conductive layer, the fourth insulating layer surrounding the fluid layer.

7. The storage device according to claim 6, further comprising:
- a fourth control electrode provided between the fourth insulating layer and the second conductive layer; and
- a fifth insulating layer provided between the fourth control electrode and the second conductive layer, the fifth insulating layer surrounding the fluid layer.

8. The storage device according to claim 1, further comprising an insulating film provided between the first control electrode and the fluid layer.

9. The storage device according to claim 6, wherein the second control electrode and the third control electrode are electrically connected to each other.

10. The storage device according to claim 1, wherein the fluid layer is in contact with the first conductive layer and the second conductive layer.

11. The storage device according to claim 1, wherein the fluid layer contains an electric charge.

12. The storage device according to claim 1, wherein the fluid layer contains an ionic liquid or an electrolytic solution.

13. The storage device according to claim 1, wherein the particles are charged particles.

14. The storage device according to claim 1, wherein the particles are metal nanoparticles, dielectric nanoparticles, colloidal particles, or molecules.

15. The storage device according to claim 1, further comprising a control circuit controlling a voltage to be applied to the first conductive layer, a voltage to be applied to the second conductive layer, and a voltage to be applied to the first control electrode, and adjusting a number of the particles moving between a portion of the fluid layer surrounded by the first insulating layer and a portion of the fluid layer surrounded by the second insulating layer.

16. A storage device comprising:

a first conductive layer;

a second conductive layer;

a fluid layer provided between the first conductive layer and the second conductive layer;

particles in the fluid layer;

a first control electrode provided between the first conductive layer and the second conductive layer;

a first insulating layer provided between the first conductive layer and the first control electrode, the first insulating layer surrounding the fluid layer;

a second insulating layer provided between the first control electrode and the second conductive layer, the second insulating layer surrounding the fluid layer; and an insulator extending in a first direction from the first conductive layer toward the second conductive layer, the insulator surrounded by the fluid layer.

17. The storage device according to claim 16, wherein the insulator has a columnar shape.

18. The storage device according to claim 16, wherein, in a cross-section parallel to the first direction, a distance between two ends of the first control electrode in a second direction perpendicular to the first direction at a first position is larger than a distance between two ends of the first control electrode in the second direction at a second position, the first position is closer to the first conductive layer than the second position.

19. The storage device according to claim 16, wherein the first control electrode surrounds the fluid layer.

20. The storage device according to claim 16, wherein a first cross-sectional area of the fluid layer in a first cross-section perpendicular to the first direction is smaller than a second cross-sectional area of the fluid layer in a second cross-section perpendicular to the first direction, the first cross-section includes the first control electrode, and the second cross-section includes the second insulating layer.

21. The storage device according to claim 16, further comprising an insulating film provided between the first control electrode and the fluid layer.

* * * * *